US012761400B2

(12) United States Patent
Washio et al.

(10) Patent No.: US 12,761,400 B2
(45) Date of Patent: Oct. 13, 2026

(54) STACKED BODY AND DISPLAY DEVICE

(71) Applicant: DAI NIPPON PRINTING CO., LTD., Tokyo (JP)

(72) Inventors: Atsushi Washio, Tokyo (JP); Kazuki Yabumoto, Tokyo (JP); Yosuke Wada, Tokyo (JP); Keisuke Wakita, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 518 days.

(21) Appl. No.: 18/250,924

(22) PCT Filed: Oct. 29, 2021

(86) PCT No.: PCT/JP2021/039948
§ 371 (c)(1),
(2) Date: Apr. 27, 2023

(87) PCT Pub. No.: WO2022/092249
PCT Pub. Date: May 5, 2022

(65) Prior Publication Data

US 2024/0329280 A1 Oct. 3, 2024

(30) Foreign Application Priority Data

Oct. 30, 2020 (JP) ................................ 2020-183221

(51) Int. Cl.
*G02B 1/14* (2015.01)
*B32B 7/12* (2006.01)
(Continued)

(52) U.S. Cl.
CPC .................. *G02B 1/14* (2015.01); *B32B 7/12* (2013.01); *B32B 17/10* (2013.01); *B32B 27/281* (2013.01);
(Continued)

(58) Field of Classification Search
None
See application file for complete search history.

(56) References Cited

U.S. PATENT DOCUMENTS

2012/0196103 A1 8/2012 Murashige et al.
2016/0365536 A1* 12/2016 Bellman ............ H10K 59/8722
(Continued)

FOREIGN PATENT DOCUMENTS

CN 102574736 7/2012
JP 2008-165040 7/2008
(Continued)

OTHER PUBLICATIONS

Machine translation of KR-20190016170-A (Year: 2019).*

*Primary Examiner* — Ramsey Zacharia
(74) *Attorney, Agent, or Firm* — HSML P.C.

(57) ABSTRACT

The present disclosure provides a stacked body comprising: a glass substrate; a joining layer; and a hard coating film, in this order, wherein the hard coating film includes a substrate layer and a hard coating layer, from a joining layer side; the joining layer is a layer configured to join the glass substrate and the substrate layer; a thickness of the glass substrate is 10 μm or more and 100 μm or less; and when a thickness of the hard coating layer is regarded as A, a thickness of the substrate layer is regarded as B, and a thickness of the joining layer is regarded as C, a ratio of (A+B) with respect to C is 3.0 or more and 500 or less.

10 Claims, 7 Drawing Sheets

(51) Int. Cl.

| | |
|---|---|
| ***B32B 17/10*** | (2006.01) |
| ***B32B 27/08*** | (2006.01) |
| ***B32B 27/28*** | (2006.01) |
| ***H05K 5/03*** | (2006.01) |

(52) U.S. Cl.

CPC ............ *H05K 5/03* (2013.01); *B32B 2250/02* (2013.01); *B32B 2255/10* (2013.01); *B32B 2255/26* (2013.01); *B32B 2307/54* (2013.01); *B32B 2307/546* (2013.01); *B32B 2307/7376* (2023.05); *B32B 2457/20* (2013.01)

(56) References Cited

U.S. PATENT DOCUMENTS

| | | | | |
|---|---|---|---|---|
| 2018/0002486 | A1 | 1/2018 | Kim et al. | |
| 2018/0291238 | A1* | 10/2018 | Erdogan-Haug | ....... B32B 27/36 |
| 2020/0230925 | A1 | 7/2020 | Nishio et al. | |

FOREIGN PATENT DOCUMENTS

| | | | | | |
|---|---|---|---|---|---|
| JP | 2018-104682 | | 7/2008 | | |
| JP | 2011-088789 | | 5/2011 | | |
| JP | 2011-140187 | | 7/2011 | | |
| JP | 2013-142131 | | 7/2013 | | |
| JP | 2018-506611 | | 3/2018 | | |
| JP | 2019-025899 | | 2/2019 | | |
| JP | 2019-025900 | | 2/2019 | | |
| JP | 2019-504812 | | 2/2019 | | |
| JP | 6544134 | B2 | 7/2019 | | |
| JP | 2019-132930 | | 8/2019 | | |
| JP | 2020-521699 | | 7/2020 | | |
| JP | 2020-203479 | | 12/2020 | | |
| JP | 2021-144215 | | 9/2021 | | |
| KR | 10-2012-0073286 | | 7/2012 | | |
| KR | 10-2016-0129028 | | 11/2016 | | |
| KR | 10-2018-0015227 | | 2/2018 | | |
| KR | 20190016170 | A * | 2/2019 | ............. | C09J 11/06 |
| WO | 2014/046180 | | 3/2014 | | |
| WO | 2017/123899 | | 7/2017 | | |
| WO | 2018/070523 | | 4/2018 | | |
| WO | 2018/218691 | | 12/2018 | | |

* cited by examiner

STACKED BODY AND DISPLAY DEVICE

TECHNICAL FIELD

The present disclosure relates to a stacked body including a glass substrate, and a display device using the same.

BACKGROUND ART

Thin plate glass has excellent hardness and heat resistance, whereas it is difficult to be folded, and it is easily cracked when dropped. For this reason, the development of ultra-thin plate glass (Ultra-Thin Glass G; UTG), which can be folded by thinning glass, has been promoted in recent years. Among glass types, one having a particularly high bending resistance is referred to as chemically strengthened glass. By imposing an expanding stress on the glass surface, glass is not likely to be cracked by making microscopic scratches occurred on the glass surface not to increase when folded.

For example, in the display field, flexibility is required. Recently, the development of flexible displays such as foldable displays, rollable displays, and bendable displays has been actively promoted. In particular, the development of foldable displays, that is, display devices that may be folded, is being promoted. The use of ultra-thin plate glass for such flexible displays has been studied (such as Patent Documents 1 to 5).

For example, Patent Document 1 proposes a stacked body including a structure wherein a glass plate with a thickness of 150 μm or less and a resin film are stacked via an adhesive layer, and a bending durability of 10 or more according to the following test.

Bending durability test: regarding an operation starting from a condition where a stacked body is flat, the stacked body is folded into 180° in a direction resulting in a concave glass plate surface so that the bend radius is 3 mm, and then, brought into the flat condition again, as one set, the number of sets until a crack occurs in the stacked body when the operation is carried out at a speed of 43 sets per one minute, is used as an index of bending durability.

Also, for example, Patent Document 2 proposes, a stacked body including a structure wherein a glass plate with a thickness of 150 μm or less and a resin film are stacked via an adhesive layer; a storage elastic modulus of the adhesive layer at 20° C. measured using a dynamic mechanical analyzing device is 10 MPa or more; and a bending durability according to the following test is 10 or more.

Bending durability test: regarding an operation starting from a condition where a stacked body is flat, the stacked body is folded into 180° in a direction resulting in a concave glass plate surface so that the bend radius is 3 mm, and then, brought into the flat condition again, as one set, the number of sets until a crack occurs in the stacked body when the operation is carried out at a speed of 43 sets per one minute, is used as an index of bending durability.

Also, Patent Document 3, for example, proposes a chemically strengthened ultra-thin glass article with a thickness of 0.4 mm or less, the glass article has a breakage height (given in mm) more than the value obtained by multiplying the thickness (t) (t (mm)) of the glass article by 50; further, the glass article has a breakage bending radius (given in mm) of less than the value obtained by multiplying the thickness (t (mm)) of the article by 100000, wherein the result is divided by the value of the surface compressive stress (MPa) measured at the first surface; and further comprises a adhered polymer layer.

CITATION LIST

Patent Documents

Patent Document 1: Japanese Patent Application Laid-Open (JP-A) No. 2019-25899

Patent Document 2: JP-A No. 2019-25900

Patent Document 3: JP-A No. 2020-521699

Patent Document 4: JP-A No. 2019-504812

Patent Document 5: Japanese Patent No. 6544134

Summary of Disclosure

Technical Problem

Although glass may be folded by thinning, and the bending resistance may be improved, it is easily cracked when the thickness thereof is thin so that the impact resistance is drastically deteriorated. In a case where glass is used as a covering member of a display device, when the glass is cracked by an impact from outside, not only the function to protect the display device is deteriorated, but also there is a risk of injuring the user's fingertip or the like with an arisen shard or a sharp edge.

The present disclosure has been made in view of the above circumstances, and an object of the present disclosure is to provide a stacked body with good bending resistance and good impact resistance, and also with improved safeness.

Solution to Problem

One embodiment of the present disclosure provides a stacked body comprising: a glass substrate; a joining layer; and a hard coating film, in this order, wherein the hard coating film includes a substrate layer and a hard coating layer, from a joining layer side; the joining layer is a layer configured to join the glass substrate and the substrate layer; a thickness of the glass substrate is 10 μm or more and 100 μm or less; and when a thickness of the hard coating layer is regarded as A, a thickness of the substrate layer is regarded as B, and a thickness of the joining layer is regarded as C, a ratio of (A+B) with respect to C is 3.0 or more and 500 or less.

Also, in the present disclosure, a composite elastic modulus of the joining layer is preferably 1 MPa or more and 6000 MPa or less.

Also, in the present disclosure, a glass transition temperature of the joining layer is preferably −40° C. or more and 150° C. or less.

Also, in the present disclosure, a composite elastic modulus of the substrate layer is preferably 5.7 GPa or more.

Also, in the present disclosure, the glass substrate preferably includes a chemically strengthened glass.

Also, in the present disclosure, the joining layer is preferably a pressure-sensitive adhesive layer, or a heat-sensitive adhesive layer, or includes a cured product of a curable type adhesive composition.

Also, in the present disclosure, the joining layer preferably includes at least one kind selected from a group consisting of polyester resin, polyolefin resin, and urethane resin.

Also, the stacked body in the present disclosure may include an antireflection layer on the hard coating layer, on an opposite surface side to the substrate layer.

Also, in the stacked body in the present disclosure, it is preferable that a crack, a fracture, or a peeling does not occur when the stacked body is folded into 1800 repeatedly for 200,000 times so that a glass substrate side surface of the stacked body is on an outer side, a hard coating layer side surface of the stacked body is on an inner side, and a distance between opposing side portions of the stacked body is 10 mm.

Another embodiment of the present disclosure provides a stacked body comprising: a hard coating layer; a substrate layer; a joining layer; a glass substrate; and a second joining layer, in this order, wherein the joining layer is a layer configured to join the glass substrate and the substrate layer; the second joining layer is a layer configured to join the stacked body and another member; a thickness of the glass substrate is 10 μm or more and 100 μm or less; and the stacked body satisfies the following formula (1).

$$0.001 \leq \{(E_1 \times D_1^2 + E_2 \times D_2^2 + E_3 \times D_3^2) \times E_4 \times D_4^2 \times E_5 \times 1000\}/D_5 \leq 3.0 \quad (1)$$

(In the formula (1), $E_1$ is a composite elastic modulus (GPa) of the hard coating layer, $D_1$ is a thickness (mm) of the hard coating layer, $E_2$ is a composite elastic modulus (GPa) of the substrate layer, $D_2$ is a thickness (mm) of the substrate layer, $E_3$ is a composite elastic modulus (GPa) of the joining layer, $D_3$ is a thickness (mm) of the joining layer, $E_4$ is a composite elastic modulus (GPa) of the glass substrate, $D_4$ is a thickness (mm) of the glass substrate, $E_5$ is a storage elastic modulus (GPa) of the second joining layer, and $D_5$ is a thickness (mm) of the second joining layer.)

Also, another embodiment of the present disclosure is a stacked body comprising: a substrate layer; a joining layer; a glass substrate; and a second joining layer, in this order, wherein the joining layer is a layer configured to join the glass substrate and the substrate layer; the second joining layer is a layer configured to join the stacked body and another member; a thickness of the glass substrate is 10 μm or more and 100 μm or less; and the stacked body satisfies the following formula (2).

$$0.001 \leq \{(E_2 \times D_2^2 + E_3 \times D_3^2) \times E_4 \times D_4^2 \times E_5 \times 1000\}/D_5 \leq 3.0 \quad (2)$$

(In the formula (2), $E_2$ is a composite elastic modulus (GPa) of the substrate layer, $D_2$ is a thickness (mm) of the substrate layer, $E_3$ is a composite elastic modulus (GPa) of the joining layer, $D_3$ is a thickness (mm) of the joining layer, $E_4$ is a composite elastic modulus (GPa) of the glass substrate, $D_4$ is a thickness (mm) of the glass substrate, $E_5$ is a storage elastic modulus (GPa) of the second joining layer, and $D_5$ is a thickness (mm) of the second joining layer.)

Also, in the stacked body in the present disclosure, a glass transition temperature of the second joining layer is preferably −50° C. or more and 30° C. or less.

Also, the stacked body in the present disclosure may include a protection film on the hard coating layer, on an opposite surface side to the substrate layer.

Another embodiment of the present disclosure provides a display device comprising: a display panel, and the stacked body described above placed on an observer side of the display panel, wherein the stacked body is placed so that a glass substrate side surface is adjacent to the display panel.

The display device in the present disclosure is preferably a foldable display.

Advantageous Effects of Disclosure

The present disclosure has an effect that a stacked body with good bending resistance and good impact resistance, and also with improved safeness, may be provided.

DISCLOSURE

Figure 4:
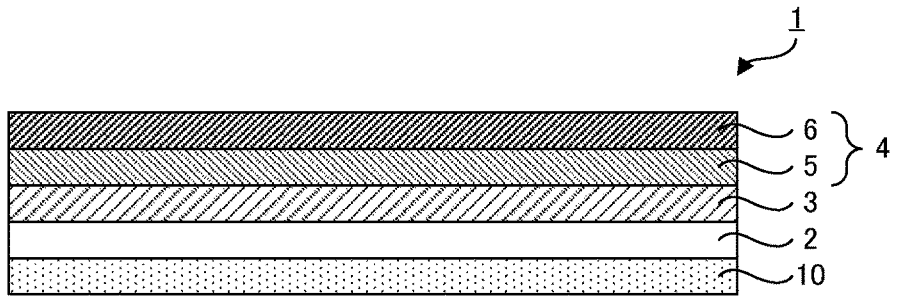

FIG. 4 is a schematic cross-sectional view illustrating an example of a stacked body in the present disclosure.

Figure 5A:
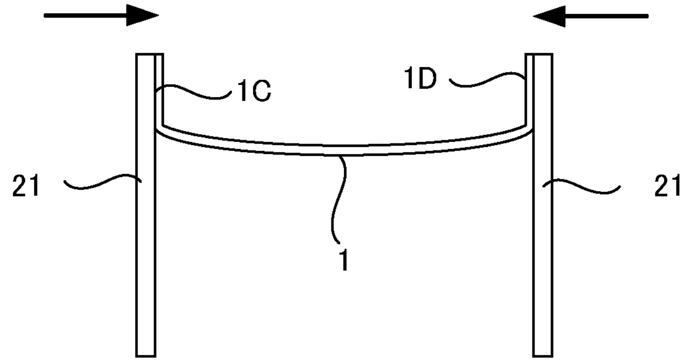
Figure 5B:
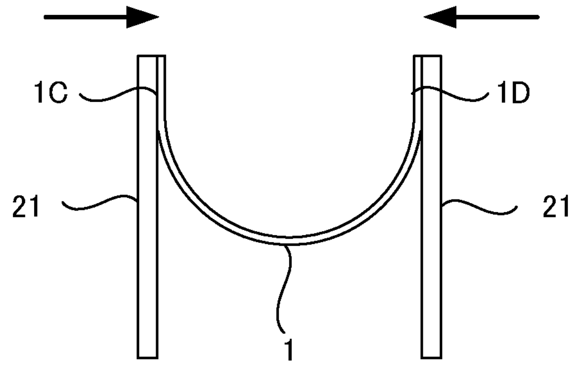
Figure 5C:
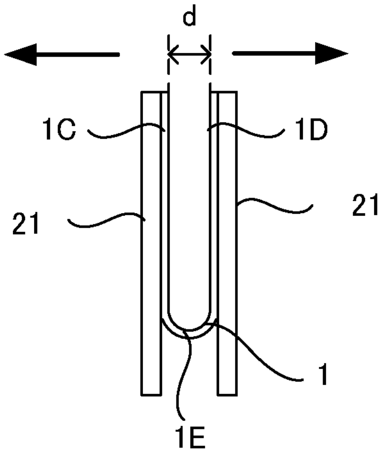

FIGS. 5A to 5C are schematic views explaining a dynamic bending test.

Figure 6A:
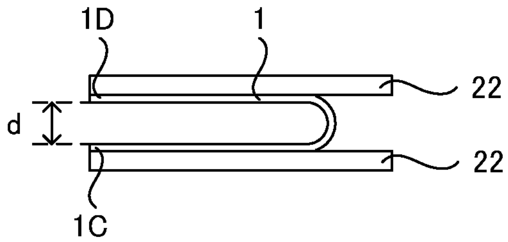
Figure 6B:
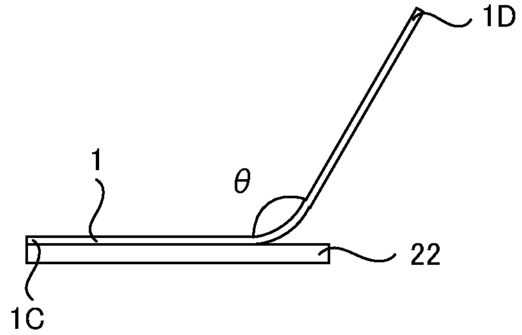

FIGS. 6A to 6B are schematic views explaining a static bending test.

Figure 7:
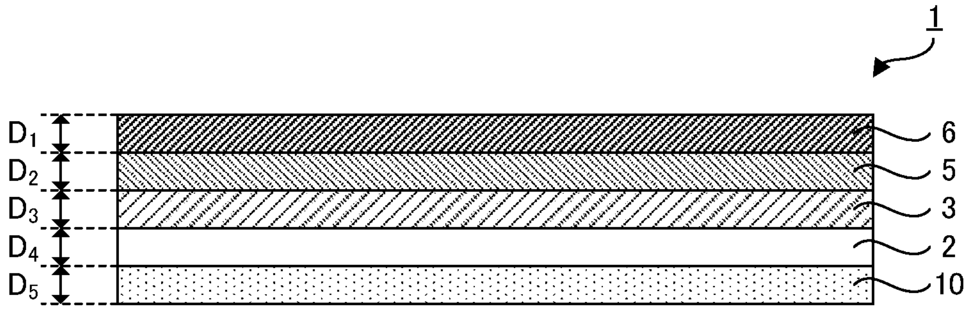

FIG. 7 is a schematic cross-sectional view illustrating an example of a stacked body in the present disclosure.

Figure 8:
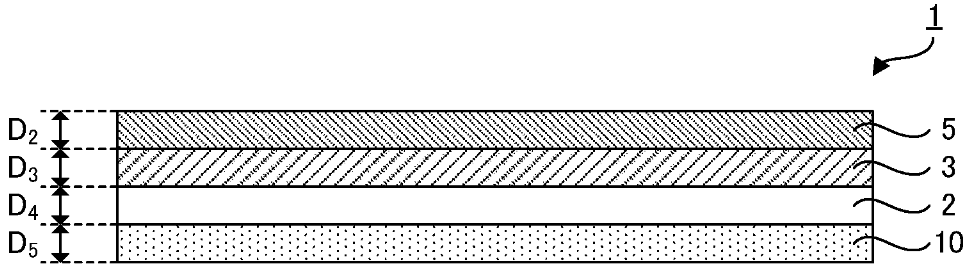

FIG. 8 is a schematic cross-sectional view illustrating an example of a stacked body in the present disclosure.

Figure 9:
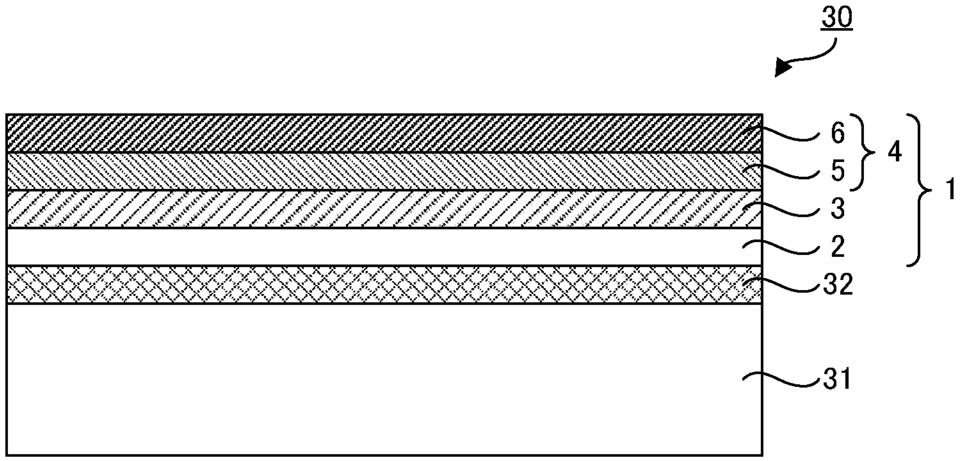

FIG. 9 is a schematic cross-sectional view illustrating an example of a display device in the present disclosure.

Figure 10:
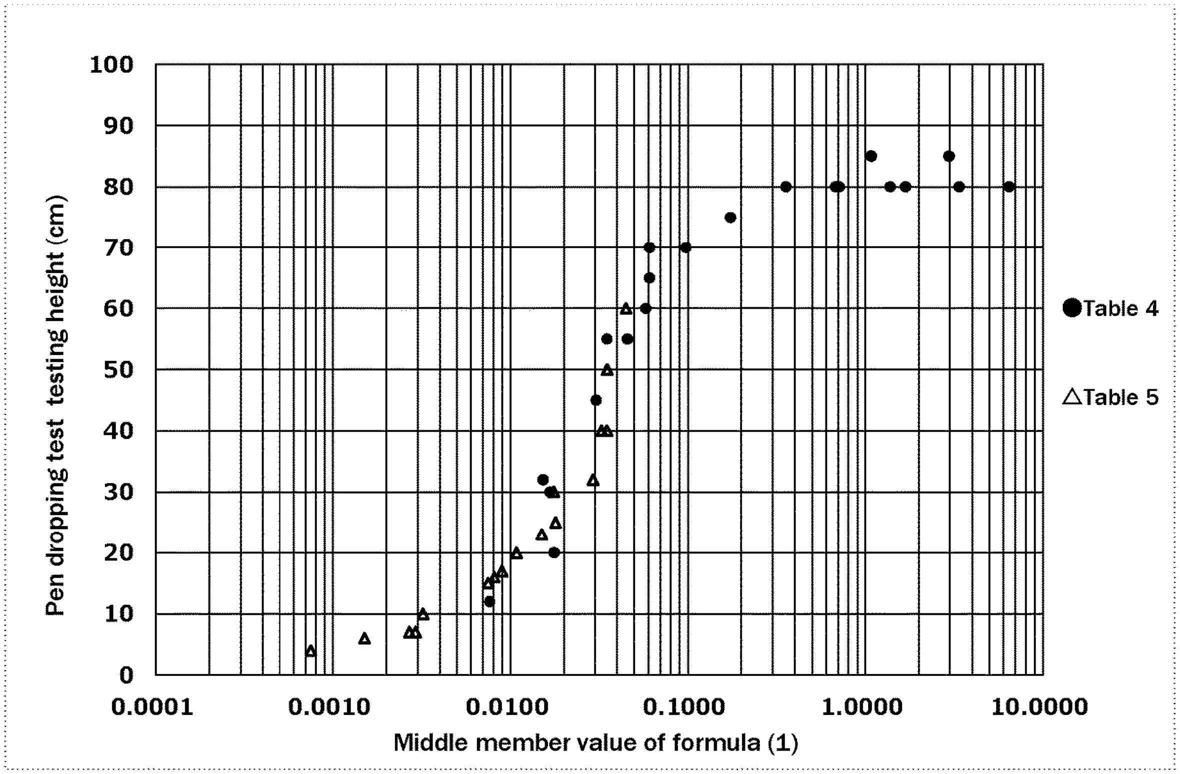

FIG. 10 is a graph showing the relationship between a middle member value of the formula (1) and a testing height in the pen dropping test.

Figure 11:
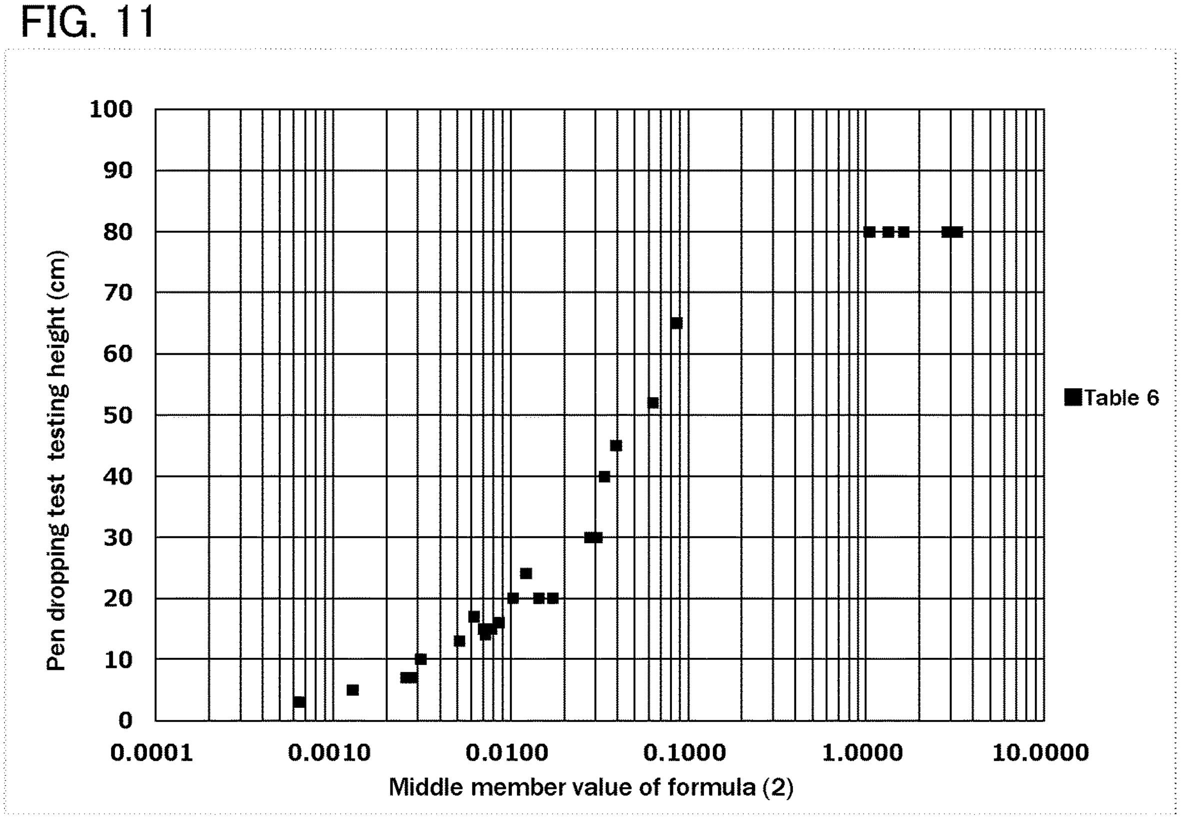

FIG. 11 is a graph showing the relationship between a middle member value of the formula (2) and a testing height in the pen dropping test.

DESCRIPTION OF EMBODIMENTS

Embodiments in the present disclosure are hereinafter explained with reference to, for example, drawings. However, the present disclosure is enforceable in a variety of different forms, and thus should not be taken as is limited to the contents described in the embodiments exemplified as below. Also, the drawings may show the features of the present disclosure such as width, thickness, and shape of each part schematically comparing to the actual form in order to explain the present disclosure more clearly in some cases; however, it is merely an example, and thus does not limit the interpretation of the present disclosure. Also, in the present description and each drawing, for the factor same as that described in the figure already explained, the same reference sign is indicated and the detailed explanation thereof may be omitted.

In the present descriptions, in expressing an aspect wherein some member is placed on the other member, when described as merely "on" or "below", unless otherwise stated, it includes both of the following cases: a case wherein some member is placed directly on or directly below the other member so as to be in contact with the other member, and a case wherein some member is placed on the upper side or the lower side of the other member via yet another member. Also, in the present descriptions, on the occasion of expressing an aspect wherein some member is placed on the surface of the other member, when described as merely "on the surface side" or "on the surface", unless otherwise stated, it includes both of the following cases: a case wherein some member is placed directly on or directly below the other member so as to be in contact with the other member, and a case wherein some member is placed on the upper side or the lower side of the other member via yet another member.

A stacked body and a display device in the present disclosure are hereinafter described in detail.

A. Stacked Body

The stacked body in the present disclosure includes three embodiments. Each embodiment is hereinafter described respectively.

I. First Embodiment

The inventors of the present disclosure have carried out intensive studies about a stacked body including a glass substrate, and found out that a crack of the glass substrate may be suppressed and the impact resistance may be increased by placing a resin layer on the surface of a thin glass substrate, and further making the thickness of the resin layer thick. However, the studies have determined that, when a resin composition is applied to the surface of a glass substrate to form a relatively thick resin layer, the influence of the shrinkage difference between the glass substrate and the resin layer increases during heating or curing after the resin composition is applied, and a curl may occur in some cases. Also, the inventors of the present disclosure have further studied and found out that a curl may be suppressed and further, the impact resistance may be increased by making the resin layer into a film previously, and adhering the resin film to the surface of the thin glass substrate via a joining layer. However, it was found that, in such a stacked body, the surface hardness of the resin film side surface of the stacked body becomes low, and the scratch resistance may be decreased in some cases.

The present embodiment has been made in view of the above circumstances, and an object of the present embodiment is to provide a stacked body with good bending resistance, impact resistance, and scratch resistance, and also with improved safeness.

The first embodiment of the stacked body in the present disclosure comprises: a glass substrate; a joining layer; and a hard coating film, in this order, wherein the hard coating film includes a substrate layer and a hard coating layer, from a joining layer side; a thickness of the glass substrate is 10 μm or more and 100 μm or less; and when a thickness of the hard coating layer is regarded as A, a thickness of the substrate layer is regarded as B, and a thickness of the joining layer is regarded as C, a thickness ratio of (A+B)/C is 3.0 or more and 500 or less. That is, the stacked body in the present embodiment comprises: a glass substrate; a joining layer; and a hard coating film, in this order, wherein the hard coating film includes a substrate layer and a hard coating layer, from a joining layer side; the joining layer is a layer configured to join the glass substrate and the substrate layer; a thickness of the glass substrate is 10 μm or more and 100 μm or less; and when a thickness of the hard coating layer is regarded as A, a thickness of the substrate layer is regarded as B, and a thickness of the joining layer is regarded as C, a ratio of (A+B) with respect to C is 3.0 or more and 500 or less.

Figure 1:
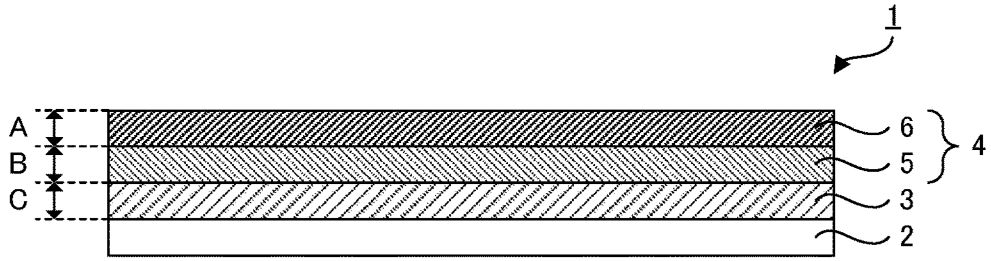
FIG. 1 is a schematic cross-sectional view illustrating an example of a stacked body in the present disclosure.

FIG. 1 is a schematic cross-sectional view illustrating an example of a stacked body in the present embodiment. As shown in FIG. 1, stacked body 1 includes a glass substrate 2 with a predetermined thickness, a joining layer 3, and a hard coating film 4 in this order, and the hard coating film 4 includes a substrate layer 5 and a hard coating layer 6, from the joining layer 3 side. Also, when the thickness of the hard coating layer 6 is regarded as A, the thickness of the substrate layer 5 is regarded as B, and the thickness of the joining layer 3 is regarded as C, the thickness ratio (A+B)/C is in a predetermined range.

In the stacked body in the present embodiment, since the thickness of the glass substrate is thin as to be a predetermined value or less, bending resistance may be improved. Meanwhile, since the thickness of the glass substrate is thin as to be a predetermined value or less, it is prone to crack and low impact resistance is concerned. On the other hand, in the present embodiment, since the hard coating film is placed on one surface of the glass substrate via the joining layer, and the impact resistance may be improved while maintaining good bending resistance.

Also, in the stacked body in the present embodiment, when the thickness of the hard coating layer is regarded as A, the thickness of the substrate layer is regarded as B, and the thickness of the joining layer is regarded as C, the thickness ratio (A+B)/C is in a predetermined range, so that the surface hardness of the hard coating film side surface of the stacked body may be increased, and the scratch resistance may be improved. The reason therefore is presumed as follows.

In the present embodiment, the thickness ratio (A+B)/C is 3.0 or more, and the thickness of the joining layer is relatively thin compared to the total thickness of the hard coating layer and the substrate layer. The hardness of the joining layer is usually lower than the glass substrate and the hard coating layer. However, since the thickness of the joining layer is relatively thin, the influence of the hardness of the joining layer may be reduced so that the surface hardness of the hard coating film side surface of the stacked body may be increased. As the result, the scratch resistance may be improved.

Incidentally, as the results of the intensive studies, the inventors of the present disclosure have found out that, as will be described in Examples and Comparative Examples later, the surface hardness of the hard coating film side surface of the stacked body may be low even when the thickness of the joining layer is relatively thin. Also, it was found out that, in order to increase the surface hardness of the hard coating film side surface of the stacked body, it was important to make the thickness of the joining layer relatively thin, that is, to set the thickness ratio (A+B)/C to be a predetermined value or more.

As described above, in the present embodiment, it is possible to achieve both impact resistance and scratch resistance while maintaining good bending resistance. Also, even when the glass substrate in the stacked body is damaged, the risk of injury to the human body may be reduced, making it a highly safe stacked body. Therefore, the stacked body in the present embodiment may be folded and used for a wide variety of applications. The stacked body in the present embodiment may be used for a wide variety of display devices, for example, and specifically, it may be used as a member for a foldable display.

Each constitution of the stacked body in the present embodiment is hereinafter described.

1. Thickness Ratio

In the present embodiment, when the thickness of the hard coating layer is regarded as A, the thickness of the substrate layer is regarded as B, and the thickness of the joining layer is regarded as C, the thickness ratio (A+B)/C is 3.0 or more, preferably 4.0 or more, and further preferably 5 or more.

Since the thickness ratio is in the above range, the surface hardness of the hard coating film side surface of the stacked body may be increased, and the scratch resistance may be improved. Meanwhile, the thickness ratio (A+B)/C is 500 or less, preferably 150 or less, more preferably 100 or less, and further preferably 70 or less, and particularly preferably 40 or less. When the thickness ratio is too high, the relative thickness of the joining layer will be extremely thin, so that the adhesiveness may be weakened, and the bending resistance, particularly dynamic bending property may be reduced, or the impact resistance may be reduced. The thickness ratio (A+B)/C is 3.0 or more and 500 or less, preferably 4.0 or more and 150 or less, more preferably 5 or more and 100 or less, further preferably 5 or more and 70 or less, and particularly preferably 5 or more and 40 or less.

The thickness of the hard coating layer is not particularly limited as long as it satisfies the thickness ratio described above, and may be appropriately selected according to the function of the hard coating layer and the use application of the stacked body. The thickness of the hard coating layer is, for example, 1 μm or more, preferably 3 μm or more, more preferably 5 μm or more, and further preferably 10 μm or more. Since the thickness of the hard coating layer is in the above range, the surface hardness of the hard coating film side surface of the stacked body may be increased, and the scratch resistance may be improved. Meanwhile, the thickness of the hard coating layer is, for example, 50 μm or less, preferably 30 μm or less, more preferably 25 μm or less, and further preferably 20 μm or less. When the thickness of the hard coating layer is in the above range, good bending resistance may be obtained. The thickness of the hard coating layer is, for example, 1 μm or more and 50 μm or less, preferably 3 μm or more and 30 μm or less, more preferably 5 μm or more and 25 μm or less, and further preferably 10 μm or more and 20 μm or less.

The thickness of the substrate layer is not particularly limited as long as it satisfies the thickness ratio described above, and is, for example, 10 μm or more, preferably 15 μm or more, more preferably 20 μm or more, and further preferably 30 μm or more. When the thickness of the substrate layer is in the above range, impact resistance may be increased. Meanwhile, the thickness of the substrate layer is, for example, 150 μm or less, preferably 125 μm or less, more preferably 100 μm or less, and further preferably 80 μm or less. When the thickness of the substrate layer is in the above range, good bending resistance may be obtained. The thickness of the substrate layer is, for example, 10 μm or more and 150 μm or less, preferably 15 μm or more and 125 μm or less, more preferably 20 μm or more and 100 μm or less, and further preferably 25 μm or more and 85 μm or less.

The thickness of the joining layer is not particularly limited as long as it satisfies the thickness ratio described above, and is, for example, 25 μm or less, preferably 20 μm or less, more preferably 15 μm or less, and further preferably 10 μm or less. Since the thickness of the joining layer is in the above range, the surface hardness of the hard coating film side surface of the stacked body may be increased, and the scratch resistance may be improved. Also, since the thickness of the joining layer is relatively thin as in the above range, the texture and tactile feel of glass due to the glass substrate may be maintained. Meanwhile, the thickness of the joining layer is, for example, 0.2 μm or more, preferably 0.5 μm or more, more preferably 1.0 μm or more, further preferably 1.5 μm or more, and particularly preferably 2.0 μm or more. When the thickness of the joining layer is too thin, the adhesiveness may be weakened, and the bending resistance, particularly dynamic bending property may be reduced, or the impact resistance may be reduced. The thickness of the joining layer is, for example, 0.2 μm or more and 25 μm or less, preferably 0.5 μm or more and 20 μm or less, more preferably 1.0 μm or more and 15 μm or less, further preferably 1.5 μm or more and 10 μm or less, particularly preferably 2.0 μm or more and 10 μm or less.

Here, the thickness of each layer may be an arithmetic average value of the thickness of arbitrary 10 points obtained by measuring from the thickness directional cross-section of the stacked body by observing with a scanning electron microscope (SEM). The specific method for taking a cross-sectional photograph is shown below. At first, a block wherein a stacked body cut out to a size of 2 cm×2 cm is embedded in an embedding resin is prepared, and a cross-section is prepared with a polishing machine. TegraPol-35 from Struers S.A.S. may be used as the polishing machine. Then, a cross-sectional photograph of the measurement sample is taken with a scanning electron microscope. The S-4800 from Hitachi High-Tech Corporation may be used as the scanning electron microscope. When taking a cross-sectional photograph with a scanning electron microscope (S-4800 from Hitachi High-Tech Corporation), the detector is set to "lower", the acceleration voltage is set to "3 kV", and the emission current is set to "10 ρA" to observe the cross-section. The magnification is appropriately adjusted by adjusting the focus while observing the contrast and brightness whether each layer may be distinguished, in a range of 100 times or more and 100,000 times or less, preferably in a range of 1000 times or more and 50,000 times or less, and further preferably in a range of 5000 times or more and 10,000 times or less. Incidentally, when taking a cross-sectional photograph with a scanning electron microscope (S-4800 from Hitachi High-Tech Corporation), the beam monitor aperture may further be set to "1" and the objective lens aperture may be set to "3", and W. D. may be set to "8 mm". Also, the contrast of the interface may be difficult to distinguish when the magnification is high. In such case, the observation is also carried out at low magnification at the same time. For example, it is observed at two magnifications of high and low such as 2,000 times and 10,000 times; or 5,000 times and 20,000 times. Then, the arithmetic average value is obtained for the cross-sectional photograph of both magnification factors, and further, the average value thereof is used as the thickness of each layer. Incidentally, the same may be applied to the measuring methods of the thickness of other layers included in the stacked body, unless otherwise stated.

2. Joining Layer

The joining layer in the present embodiment is placed between the glass substrate and the hard coating film, and is a layer configured to join the glass substrate and the hard coating film.

The material used for the joining layer is not particularly limited as long as it is a material capable of joining the glass substrates and the hard coating film, and examples thereof may include pressure-sensitive adhesives such as optical clear adhesive (OCA); heat-sensitive adhesives such as heat sealants; and curable type adhesives. One kind of these may be used alone, and two kinds or more may be used in a combination.

Examples of the pressure-sensitive adhesives such as optical clear adhesive (OCA) may include acrylic based adhesives, urethane based adhesives, silicone based adhesives, epoxy based adhesives, vinyl acetate based adhesives, and polyvinyl acetal based adhesives such as polyvinyl butyral (PVB).

For example, thermally weldable thermoplastic resins may be used as the heat-sensitive adhesives such as heat sealants. Such thermoplastic resins are not particularly limited, and examples thereof may include acrylic resins, vinyl chloride-vinyl acetate copolymers, polyamide resins, polyester resins, polyester urethane resins, chlorinated polypropylenes, chlorinated rubbers, urethane resins, epoxy resins, styrene resins, polyolefin resins, silicone resins, polyvinyl acetal resins such as polyvinyl butyral (PVB), and polyether urethane resins. One kind of these thermoplastic resins may be used alone, and two kinds or more may be used in a combination.

Also, the heat-sensitive adhesive composition may further include a curing agent. Thereby, heat resistance and close adhesiveness may be improved. Also, by adding the curing agent, the composite elastic modulus of the joining layer, which will be discussed later, may be adjusted. In order to obtain a joining layer with a desired composite elastic modulus, it is preferable to add the curing agent as appropriate, for example, according to the properties of the thermoplastic resin. Examples of the curing agent may include isocyanate based curing agents, epoxy based curing agents, and melamine based curing agents. One kind of the curing agents may be used alone, and two kinds or more may be used in a combination. When the heat-sensitive adhesive composition includes a curing agent, the joining layer will include the cured product of the heat-sensitive adhesive composition.

Also, the heat-sensitive adhesive composition may include additives if necessary. Examples of the additives may include, a light stabilizer, ultraviolet absorbers, infrared absorbers, antioxidants, plasticizers, coupling agents, antifoaming agents, fillers, inorganic or organic particles configured to adjust the refractive index, antistatic agents, coloring agents such as a blue pigment and a violet pigments, a leveling agent, a surfactant, an easy lubricant, various sensitizers, a flame retardant, an adhesive imparting agent, a polymerization inhibitor, and a surface modifier. These additives may be selected and used as appropriate from those of regular use. The content of the additive may be set appropriately. Among them, the heat-sensitive adhesive composition preferably includes a silane coupling agent to increase adhesiveness with the glass substrate.

Examples of the curable type adhesive may include thermally curable type adhesives and ultraviolet ray curable type adhesives.

The thermally curable type adhesive is an adhesive cured by heat. Examples of the thermally curable type adhesive may include epoxy based adhesives, acrylic based adhesives, urethane based adhesives, polyester based adhesives, and silicone based adhesives.

The ultraviolet ray curable type is an adhesive cured by irradiation of ultraviolet rays. Examples of the ultraviolet ray curable type adhesives may include epoxy based adhesives, acrylic based adhesives, and urethane acrylate based adhesives.

Also, the curable type adhesive composition may include additives if necessary. Examples of the additives may include, a light stabilizer, ultraviolet ray absorbers, infrared absorbers, antioxidants, plasticizers, coupling agents, antifoaming agents, fillers, inorganic or organic particles configured to adjust the refractive index, antistatic agents, coloring agents such as a blue pigment and a violet pigments, a leveling agent, a surfactant, an easy lubricant, various sensitizers, a flame retardant, an adhesive imparting agent, a polymerization inhibitor, and a surface modifier. These additives may be selected and used as appropriate from those of regular use. The content of the additive may be set appropriately.

Among the above, the material used for the joining layer is preferably a heat-sensitive adhesive or a curable type adhesive, and more preferably a heat sealant, ultraviolet ray curable type adhesive, or thermally curable type adhesive. That is, the joining layer is preferably a heat-sensitive adhesive layer, or preferably includes a cured product of a curable type adhesive composition, and more preferably a heat sealant layer, or more preferably includes the cured product of the ultraviolet ray curable type adhesive composition or the cured product of the thermally curable type adhesive composition. By using the heat sealant, ultraviolet ray curable type adhesive, or thermally curable type adhesive, a joining layer which satisfies the composite elastic modulus described later may be obtained, and also the glass transition temperature of the joining layer described later may be 0° C. or more. Also, in the case of optical clear adhesive (OCA), an OCA film is used. However, some OCA films have uneven surface, and when such OCA film is used, the display fluctuates due to unevenness, so that the texture and tactile feel of glass due to the glass substrate may be deteriorated. In contrast, by using the heat-sensitive adhesive or curable type adhesive, the occurrence of such fault may be suppressed.

Also, the joining layer preferably includes at least one kind selected from the group consisting of polyester resin, polyolefin resin, and urethane resin. Among them, the joining layer more preferably includes polyester resin. Incidentally, the urethane resin includes polyester urethane resin and polyether urethane resin. For the joining layer including such a material, it is easier to adjust the composite elastic modulus described below to the preferable range.

The composite elastic modulus of the joining layer is preferably, for example, 1 MPa or more, more preferably 10 MPa or more, and further preferably 20 MPa or more. Since the composite elastic modulus of the joining layer is in the above range and has a certain level of hardness, the surface hardness of the hard coating film side surface of the stacked body may be increased, and the scratch resistance may be improved, as well as the impact resistance may be improved. Meanwhile, the composite elastic modulus of the joining layer is preferably, for example, 6000 MPa or less, more preferably 5500 MPa or less, and further preferably 4500 MPa or less. When the composite elastic modulus of the joining layer is too high, the adhesiveness may be decreased, or the hardness may be too high to bend, resulting in reduced bending resistance, especially dynamic bending property. The composite elastic modulus of the joining layer is preferably, for example, 1 MPa or more and 6000 MPa or less, more preferably 10 MPa or more and 5500 MPa or less, further preferably 20 MPa or more and 4500 MPa or less, and particularly preferably 25 MPa or more and 4000 MPa or less.

Here, the composite elastic modulus of the joining layer is calculated using contact projection area $A_p$ determined when measuring the indentation hardness ($H_{IT}$) of the joining layer. The "indentation hardness" is a value determined from a load-displacement curve from indenter loading to unloading obtained by a hardness measurement by the nanoindentation method. The composite elastic modulus of the joining layer is an elastic modulus including the elastic deformation of the joining layer and the elastic deformation of the indenter.

The measurement of the indentation hardness ($H_{IT}$) is carried out, to a measurement sample, using "TI950 TriboIndenter" from Bruker Corporation. Specifically, at first, a block wherein a stacked body cut out to a size of 1 mm×10 mm is embedded in an embedding resin is prepared, and a uniform section with a thickness of 50 nm or more and 100 nm or less without a hole, for example, is cut out from this block by a common section preparing method. For the preparation of the section, for example, "Ultramicrotome EM UC7" (from Leica Microsystems, Inc.) may be used. Then, the remaining of the block from which this uniform section without a hole, for example, is cut out is used as a measurement sample. Then, onto the cross-section in such the measurement sample obtained by cutting out the section, a Berkovich indenter (a triangular pyramid, TI-0039 from Bruker Corporation) as the indenter is compressed perpendicularly onto the center of the cross-section of the joining layer, under the following conditions, taking 10 Seconds, until the maximum compressing load of 25 μN. Here, in order to avoid an influence of the glass substrate and hard coating film, and in order to avoid an influence of the side edge of the joining layer, the Berkovich indenter shall be compressed into a portion of the joining layer which is 500 nm away from the interface between the glass substrate and the joining layer toward the center side of the joining layer; 500 nm away from the interface between the substrate layer of the hard coating film and the joining layer toward the center side of the joining layer; and 500 nm away from both side edges of the joining layer respectively toward the center side of the joining layer. Then, after relieving the remaining stress by maintaining constant, the load was unloaded in 10 seconds, the maximum load after relieving was measured, and by using the maximum load $P_{max}$ (μN) and the contact projection area $A_p$ ($nm^2$), the indentation hardness ($H_{IT}$) is calculated by $P_{max}/A_p$. The contact projection area is a contact projection area wherein the indenter tip curvature is corrected by Oliver-Pharr method, using a reference sample fused quartz (5-0098 from Bruker Corporation). The indentation hardness ($H_{IT}$) is an arithmetic average value of the value obtained by measuring at ten places. Incidentally, when a value deviating ±20% or more from the arithmetic average value is included in the measured value, that measured value is excluded, and the measurement is carried out for one more time. Whether the value deviating ±20% or more from the arithmetic average value exists in the measured value, or not is determined by finding out whether the value (%) obtained by (A−B)/B×100, when the measured value is regarded as A and the arithmetic average value is regarded as B, is ±20% or more, or not.

(Measurement Conditions 1)

Loading speed: 2.5 μN/second
Retention time: 5 seconds
Unloading speed: 2.5 μN/second
Measuring temperature: 25° C.

Incidentally, if the compressing depth at the maximum load, when the indentation hardness measurement under the measurement conditions 1 is carried out, is 500 nm or more, the measurement is carried out under the following measurement conditions 2. As described above, in the indentation hardness measurement, since the compression to the joining layer is carried out for 10 seconds, the maximum load under the measurement conditions 1 is 25 μN, and the maximum load under the measurement conditions 2 is 5 βN.

(Measurement Conditions 2)

Loading speed: 0.5 μN/second
Retention time: 5 seconds
Unloading speed: 0.5 μN/second
Measuring temperature: 25° C.

The composite elastic modulus $E_r$ of the joining layer is determined from the following mathematical formula (3), using contact projection area $A_p$ obtained when measuring the indentation hardness. The indentation hardness is measured at 10 places, the composite elastic modulus is determined each time, and the obtained arithmetic average value of the composite elastic modulus of 10 places is regarded as the composite elastic modulus.

[Mathematic 1]

$$E_r = \frac{S\sqrt{\pi}}{2\sqrt{A_p}} \tag{3}$$

(In the mathematic formula (3), $A_p$ is a contact projection area, $E_r$ is the composite elastic modulus of the joining layer, and S is a contact stiffness.)

The composite elastic modulus of the joining layer may be adjusted by, for example, the type, composition and so on of the material included in the joining layer.

Also, the glass transition temperature of the joining layer is preferably, for example, −40° C. or more, more preferably −30° C. or more, further preferably −10° C. or more, further preferably 0° C. or more, and particularly preferably 20° C. or more. When the glass transition temperature of the junction layer is in the above range, it is easier to obtain the junction layer satisfying the composite elastic modulus described above. Also, when the glass transition temperature of the joining layer is 0° C. or more, the scratch resistance and impact resistance may be improved even better. Meanwhile, the glass transition temperature of the joining layer is preferably, for example, 150° C. or less, more preferably 140° C. or less, more preferably 130° C. or less, and further preferably 120° C. or less. When the glass transition temperature of the joining layer is too high, adhesiveness may not be secured. The glass transition temperature of the joining layer is preferably, for example, −40° C. or more and 150° C. or less, more preferably −30° C. or more and 150° C. or less, further preferably −10° C. or more and 140° C. or less, particularly preferably 0° C. or more and 130° C. or less, and most preferably 0° C. or more and 120° C. or less. Also, the glass transition temperature of the joining layer is preferably, for example, −40° C. or more and 25° C. or less, and also preferably 50° C. or more and 150° C. or less. A stacked body that is resistant to use under high-temperature and high-humidity environment and under low-temperature environment, may be obtained.

Here, the glass transition temperature of the joining layer means a value measured by a method based on the peak top value of loss tangent (tan δ) (DMA method). When the storage elastic modulus E', loss elastic modulus E", and loss tangent tan δ of the joining layer are measured with the dynamic mechanical analyzing device (DMA), firstly, the joining layer is punched into a size of 15 mm×200 mm. In this process, a test piece of the joining layer may be obtained by preparing a solution by dissolving the material of the joining layer or melting the material of the joining layer; coating a substrate with the solution; drying; and then, peeling the film off from the substrate. The solvent is appropriately selected according to the material of the joining layer, and examples thereof may include ethyl acetate. Also, when preparing the solution, the material of the joining layer may be heated and dissolved as appropriate. For example, a Naflon (registered trademark) sheet from Nichias Corporation (300 mm×300 mm×1 mm thickness)

may be used as the substrate. The joining layer is then sampled into a cylindrical shape of approximately φ5 mm×5 mm in height. At this time, the joining layer may be wound to make it cylindrical. The cylindrical measurement sample is installed between the compression jigs (parallel plates p 8 mm) of the dynamic mechanical analyzing device. Then, the dynamic mechanical analysis is carried out in the range of −50° C. or more and 200° C. or less, while applying a compressive load and a longitudinal vibration at frequency of 1 Hz, and a storage elastic modulus E', a loss elastic modulus E" and loss tangent tan δ of the joining layer at respective temperatures are measured. The glass transition temperature of the joining layer is the temperature at which the loss tangent tan δ peaks in the range of −50° C. or more and 200° C. or less. For example, RSA III from TA Instruments may be used as a dynamic mechanical analyzing device. Incidentally, the specific measurement conditions in the above method are shown below.

(Measurement Conditions of Glass Transition Temperature)

Measurement sample: cylindrical shape of φ5 mm×height 5 mm

Measuring jig: compression (parallel plate)

Measurement mode: temperature dependency (temperature range: −50° C. to 200° C., temperature rising rate: 5° C./min)

Frequency: 1 Hz

When the stacked body in the present embodiment is used for, for example, a display device, the joining layer preferably has transparency. Specifically, the total light transmittance of the joining layer is preferably 80% or more, more preferably 85% or more, and further preferably 88% or more.

Here, the total light transmittance of the joining layer may be measured according to JIS K7361-1, and may be measure with, for example, a haze meter HM150 from Murakami Color Research Laboratory Co., Ltd. Hereinafter, the same may be applied to the measuring method of the total light transmittance of other layers.

Also, the haze of the joining layer is preferably, for example 2% or less, more preferably 1.5% or less, and further preferably 1% or less.

Here, the haze of the joining layer may be measured according to JIS K-7136, and may be measure with, for example, a haze meter HM150 from Murakami Color Research Laboratory Co., Ltd. Hereinafter, the same may be applied to the measuring method of the haze of other layers.

The method for joining the glass substrate and hard coating film via the joining layer is selected as appropriate according to the material and so on used for the joining layer. For example, when a pressure-sensitive adhesive such as optical clear adhesive (OCA) is used, a film-like pressure-sensitive adhesive layer may be used to adhere the hard coating film and the glass substrate via a film-like pressure-sensitive adhesive layer. Also, when a heat-sensitive adhesive such as heat sealants is used, a heat-sensitive adhesive composition may be applied to the substrate layer side surface of the hard coating film, or to one surface of the glass substrate, drying thereof to form a heat-sensitive adhesive layer, then, the hard coating film and the glass substrate may be stacked via the heat-sensitive adhesive layer, and heated, to adhere by thermal welding of the heat-sensitive adhesive layer. In this case, the heating temperature is preferably the glass transition temperature of the heat-sensitive adhesive layer or more. Also, when a thermally curable type adhesives is used, a thermally curable type adhesives composition may be applied to the substrate layer side surface of the hard coating film, or to one surface of the glass substrate; dried to form a thermally curable type adhesives layer; then, the hard coating film and the glass substrate may be stacked via the thermally curable type adhesives layer; and the thermally curable type adhesive layer may be cured by heating to adhere the layers. Also, when an ultraviolet ray curable type adhesive is used, for example, an ultraviolet ray curable type adhesive composition may be applied to the substrate layer side surface of the hard coating film, or to one surface of the glass substrate; dried to form an ultraviolet ray curable type adhesive layer; then, the hard coating film and the glass substrate may be stacked via the ultraviolet ray curable type adhesive layer; and the ultraviolet ray curable type adhesive layer may be cured by irradiating ultraviolet rays to adhere the layers.

When preparing an adhesive composition, solid resins such as pellets or sheets may be used as resins. In this case, a solution of resin may be previously prepared by heating the resin and the solvent to dissolve the resin in the solvent, and then, the solution of the resin may be used for the preparation of adhesive compositions.

3. Hard Coating Film

The hard coating film in the present embodiment includes a substrate layer and a hard coating layer, from a joining layer side.

Each constitution of the hard coating film is hereinafter described.

(1) Hard Coating Layer

The hard coating layer in the present embodiment is a layer configured to increase the surface hardness. By placing the hard coating layer, scratch resistance may be improved.

(a) Properties of Hard Coating Layer

Here, “hard coating layer” is a member configured to increase the surface hardness. Specifically, in a configuration wherein the stacked body in the present embodiment includes a hard coating layer, “hard coating layer” is referred to one having a hardness of “H” or more in the pencil hardness test according to JIS K 5600-5-4 (1999).

The pencil hardness of the hard coating layer side surface of the stacked body in the present embodiment is preferably H or more, more preferably 2H or more, further preferably 3H or more, particularly preferably 4H or more, and most preferably 5H or more.

Here, the pencil hardness is measured by the pencil hardness test according to JIS K5600-5-4 (1999). Specifically, using a pencil for the test according to JIS-S-6006, the pencil hardness test according to JIS K5600-5-4 (1999) is carried out to the hard coating layer side surface of the stacked body, and the pencil hardness may be determined by evaluating the highest pencil hardness at which the sample is not bruised. The measurement conditions may be angle of 45°, load of 1 kg, rate of 0.5 mm/sec or more and 1 mm/sec or less, and temperature of 23±2° C. As the pencil hardness tester, for example, a pencil scratch hardness tester from Toyo Seiki Seisaku-sho, Ltd. may be used.

(b) Configuration of Hard Coating Layer

The hard coating layer may be a single layer, and may have a multi-layered structure of two layers or more. When the hard coating layer has the multi-layered structure, in order to improve the surface hardness, and also to improve the balance between bending resistance and elastic modulus, the hard coating layer may include a layer configured to satisfy the pencil hardness and a layer configured to satisfy the dynamic bending test (a layer configured to satisfy the scratch resistance).

(c) Material of Hard Coating Layer

Examples of the material of the hard coating layer may include a resin cured product. Specifically, the hard coating layer preferably include a cured product of a resin composition including a polymerizable compound. The cured product of a resin composition including a polymerizable compound may be obtained by carrying out a polymerization reaction of a polymerizable compound, by a known method, using a polymerization initiator if necessary.

(i) Polymerizable Compound

The polymerizable compound includes at least one polymerizable functional group in the molecule. As the polymerizable compound, for example, at least one kind of radical polymerizable compound and cation polymerizable compound may be used.

The radical polymerizable compound is a compound including a radical polymerizable group. The radical polymerizable group included in the radical polymerizable compound may be any functional group capable of generating a radical polymerization reaction, and is not particularly limited; and examples thereof may include a group including a carbon-carbon unsaturated double bond, and specific examples thereof may include a vinyl group and a (meth) acryloyl group. Incidentally, when the radical polymerizable compound includes two or more radical polymerizable groups, these radical polymerizable groups may be the same, and may be different from each other.

The number of radical polymerizable groups included in one molecule of the radical polymerizable compound is preferably two or more, and more preferably three or more, from the viewpoint of improving the hardness of the hard coating layer.

Among the above, from the viewpoint of high reactivity, the radical polymerizable compound is preferably a compound including a (meth) acryloyl group. For example, a polyfunctional (meth) acrylate monomer and oligomer having a molecular weight of several hundred to several thousand, and including several (meth) acryloyl groups in the molecule may be preferably used; such as those referred to as urethane (meth)acrylate, polyester (meth)acrylate, epoxy (meth)acrylate, melamine (meth)acrylate, polyfluoroalkyl (meth)acrylate, and silicone (meth)acrylate; and a polyfunctional (meth) acrylate polymer including two or more (meth) acryloyl groups on the side chain of an acrylate polymer may also be preferably used. Among the above, a polyfunctional (meth) acrylate monomer including two or more (meth) acryloyl groups in one molecule may be preferably used. By the hard coating layer including a cured product of the polyfunctional (meth) acrylate monomer, the hardness of the hard coating layer may be improved so that the adhesiveness may further be improved. Also, a polyfunctional (meth) acrylate oligomer or polymer including two or more (meth) acryloyl groups in one molecule may also be preferably used. By the hard coating layer including a cured product of the polyfunctional (meth) acrylate oligomer or polymer, the hardness and bending resistance of the hard coating layer may be improved, and further, the adhesiveness may be improved.

Incidentally, in the present specification, (meth) acryloyl represents each of acryloyl and methacryloyl, and (meth) acrylate represents each of acrylate and methacrylate.

Specific examples of the polyfunctional (meth)acrylate monomer may include those described in, for example, JP-A No. 2019-132930. Among them, those having 3 or more and 6 or less (meth)acryloyl groups in one molecule are preferable from the viewpoint of high reactivity and improving hardness of the hard coating layer, and from the point of close adhesiveness. As such a polyfunctional (meth)acrylate monomer, for example, pentaerythritol triacrylate (PETA), dipentaerythritol hexaacrylate (DPHA), pentaerythritol tetraacrylate (PETTA), dipentaerythritol pentaacrylate (DPPA), trimethylolpropane tri(meth)acrylate, tripentaerythritol octa(meth)acrylate, and tetrapentaerythritol deca (meth)acrylate may be preferably used. In particular, at least one kind selected from pentaerythritol tri(meth)acrylate, dipentaerythritol penta(meth)acrylate, and dipentaerythritol hexaacrylate; and PO, EO or caprolactone modified product thereof is preferable.

In order to adjust hardness or viscosity, or to improve close adhesiveness, the resin composition may include a monofunctional (meth) acrylate monomer as the radical polymerizable compound. Specific examples of the monofunctional (meth) acrylate monomer may include those described in, for example, JP-A No. 2019-132930.

The cation polymerizable compound is a compound including a cation polymerizable group. The cation polymerizable group included in the cation polymerizable compound may be a functional group capable of generating a cation polymerization reaction, and is not particularly limited; and examples thereof may include an epoxy group, an oxetanyl group, and a vinyl ether group. Incidentally, when the cation polymerizable compound includes two or more cation polymerizable groups, these cation polymerizable groups may be the same, and may be different from each other.

The number of the cation polymerizable groups included in one molecule of the cation polymerizable compound is preferably two or more, and more preferably three or more, from the viewpoint of improving hardness of the hard coating layer.

Also, among the above, as a cation polymerizable compound, a compound including at least one kind of an epoxy group and an oxetanyl group as a cation polymerizable group is preferable, and a compound including two or more of at least one kind of an epoxy groups and an oxetanyl groups in one molecule is more preferable. A cyclic ether group such as an epoxy group and an oxetanyl group is preferable from the viewpoint that shrinkage associated with the polymerization reaction is small. Also, a compound including the epoxy group among the cyclic ether groups has advantages in that compounds having various structure may be easily obtained; the durability of the obtained hard coating layer is not adversely affected; and the compatibility with the radical polymerizable compound may be easily controlled. Also, the oxetanyl group among the cyclic ether groups has advantages in that the degree of polymerization is high compared with the epoxy group; the toxicity is low; and when the obtained hard coating layer is combined with a compound including an epoxy group, the network forming rate obtained from the cationic polymerizable compound in the coating film is accelerated, and an independent network is formed without leaving unreacted monomers in the film even in a region mixed with the radical polymerizable compound.

Examples of the cationic polymerizable compound including an epoxy group may include an alicyclic epoxy resins such as polyglycidyl ether of a polyhydric alcohol including an alicyclic ring, or resins obtained by epoxidizing a compound including a cyclohexene ring or a cyclopentene ring, with a suitable oxidizing agent such as hydrogen peroxide and a peracid; an aliphatic epoxy resins such as polyglycidyl ether of aliphatic polyhydric alcohol or alkylene oxide adduct thereof, polyglycidyl ester of aliphatic long-chain polybasic acid, or homopolymer or copolymer of glycidyl (meth)acrylate; a glycidyl ether type epoxy resin such as glycidyl ether produced by the reaction of bisphenols such as bisphenol A, bisphenol F, and hydrogenated bisphenol A, or derivative thereof such as alkylene oxide adduct and caprolactone adduct with epichlorohydrin, and resins that is novolac epoxy resin and derived from bisphenols.

Specific examples of the cationic polymerizable compound including the alicyclic epoxy resin, the glycidyl ether type epoxy resin, and an oxetanyl group may include those described in, for example, JP-A No. 2018-104682.

Incidentally, the cured product of the resin composition including the polymerizable compound included in the hard coating layer may be analyzed by, for example, a Fourier transform infrared spectroscopy (FTIR) and a pyrolysis gas chromatography mass spectrometry (GC-MS), and the degradant of the polymer may be analyzed using a combination of, for example, a high-speed liquid chromatography, a gas chromatography mass spectrometry, a NMR, an element analyzer, an XPS/ESCA and a TOF-SIMS.

(ii) Polymerization Initiator

The resin composition may include a polymerization initiator if necessary. The polymerization initiator may be used by appropriately selecting from, for example, a radical polymerization initiator, a cation polymerization initiator, and a radical and cation polymerization initiator. These polymerization initiators are decomposed by at least one kind of light irradiation and heating to generate radicals or cations to cause radical polymerization and cation polymerization to proceed. Incidentally, all of the polymerization initiator may be decomposed and may not be left in the hard coating layer, in some cases.

Specific examples of the radical polymerization initiator, and the cation polymerization initiator may include those described in, for example, JP-A No. 2018-104682.

(iii) Particles

The hard coating layer preferably includes inorganic or organic particles, and more preferably includes inorganic fine particles. By the hard coating layer including the particles, hardness may be improved.

Examples of the inorganic particle may include metal oxide particles such as silica ($SiO_2$), aluminum oxide, zirconia, titania, zinc oxide, germanium oxide, indium oxide, tin oxide, indium tin oxide (ITO), antimony oxide, and cerium oxide; metal fluoride particles such as magnesium fluoride and sodium fluoride; metal particles; metal sulfide particles; and metal nitride particles. Among them, metal oxide particles are preferable, at least one kind selected from silica particles and aluminum oxide particles are more preferable, and silica particles are further preferable. The reason therefor is to obtain excellent hardness.

Also, the inorganic particles are preferably reactive inorganic particles including a reactive functional group which undergoes a cross-linking reaction between the inorganic particles or with at least one kind of the polymerizable compound, and has an optical reactivity capable of forming a covalent bond on at least a part of the inorganic particle surface. By undergoing the cross-linking reaction between the reactive inorganic particles or between the reactive inorganic particle and at least one kind of the radical polymerizable compound and the cation polymerizable compound, hardness of the hard coating layer may further be improved.

At least a part of the surface of the reactive inorganic particles are covered with an organic component, and include the reactive function group introduced by the organic component, on the surface thereof. As the reactive functional group, for example, a polymerizable unsaturated group is preferably used, and more preferably a photo curing unsaturated group. Examples of the reactive functional group may include ethylenically unsaturated bonds such as a (meth) acryloyl group, a vinyl group, and an allyl group; and an epoxy group.

The reactive silica particle is not particularly limited, and conventionally known ones may be used, and examples thereof may include reactive silica particles described in, for example, JP-A No. 2008-165040. Also, examples of commercially available products of the reactive silica particle may include MIBK-SD, MIBK-SDMS, MIBK-SDL, MIBK-SDZL, all from Nissan Chemical Industry Co., Ltd.; and V8802 and V8803, all from JGC Catalysts and Chemicals Ltd.

Also, although the silica particle may be a spherical silica particle, the silica particle is preferably a deformed silica particle. The spherical silica particle and the deformed silica particle may be mixed. Incidentally, in the present specification, the term deformed silica particle means a silica particle of a shape having random irregularities of potato-like shape on the surface. Since the deformed silica particle has a larger surface area compared with the spherical silica particle, by including such deformed silica particle, the contact area with the resin component, for example, becomes large, so that the hardness of the hard coating layer may further be improved.

Incidentally, whether the silica particle is the deformed silica particle, or not may be confirmed by observing the cross-section of the hard coating layer with an electron microscope.

From the viewpoint of improving hardness, the average particle size of the inorganic particle is preferably 5 nm or more, and more preferably 10 nm or more. When the average particle size of the inorganic particle is too small, the production of the particle is difficult, and the particles may be easily aggregated. Also, from the viewpoint of transparency, the average particle size of the inorganic particle is preferably 200 nm or less, more preferably 100 nm or less, and further preferably 50 nm or less. When the average particle size of the inorganic particle is too large, large irregularities may be formed on the hard coating layer, and the haze may be increased.

Here, the average particle size of the inorganic particles may be measured by observing the cross-section of the hard coating layer with an electron microscope, and the average particle size of arbitrary selected 10 particles is regarded as the average particle size. Incidentally, the average particle size of deformed silica particles is the average value of the maximum value (major axis) and the minimum value (minor axis) of the distances between two points of the outer periphery of the deformed silica particle came up in the cross-sectional microscope observation of the hard coating layer.

The hardness of the hard coating layer may be controlled by adjusting the size and content of the inorganic particles. For example, the content of the silica particles is preferably 25 parts by mass or more, more preferably 30 parts by mass or more, and further preferably 50 parts by mass or more, with respect to 100 parts by mass of the polymerizable compound. When the content of the silica particles is in the above range, the hardness of the hard coating layer may be increased. Also, the content of the silica particles is preferably 150 parts by mass or less, more preferably 120 parts by mass or less, and further preferably 100 parts by mass or less, with respect to 100 parts by mass of the polymerizable compound. When the content of the silica particles is in the above range, good bending resistance may be obtained. The content of the silica particles is, for example, preferably 25 parts by mass or more and 150 parts by mass or less, more preferably 30 parts by mass or more and 120 parts by mass or less, and further preferably 50 parts by mass or more and 100 parts by mass or less, with respect to 100 parts by mass of the polymerizable compound.

(iv) Ultraviolet Absorber

The hard coating layer may include an ultraviolet absorber. Deterioration of the substrate layer due to ultraviolet rays may be suppressed. In particular, when the substrate layer includes polyimide, color change over time of the substrate layer including polyimide may be suppressed. Also, in display device including a stacked body, the deterioration of a member placed on the display panel side than the stacked body, such as a polarizer, due to ultraviolet ray may be suppressed.

Among them, the peak of the absorption wavelength, in absorbance measurement, of the ultraviolet absorber included in the hard coating layer preferably exist in 300 nm or more and 390 nm or less, more preferably 320 nm or more and 370 nm or less, and further preferably 330 nm or more and 370 nm or less. Such an ultraviolet absorber is able to absorb ultraviolet ray in UVA range efficiently, meanwhile, by shifting the peak wavelength from the absorption wavelength of 250 nm of the initiator for curing the hard coating layer, a hard coating layer having an ultraviolet ray absorbing ability may be formed without inhibiting the curing of the hard coating layer.

Among them, from the viewpoint of preventing the coloring due to the ultraviolet absorber, the peak of the absorption wavelength of the ultraviolet absorber is preferably 380 nm or less.

Incidentally, the absorption of the ultraviolet absorber may be measured using, for example, an ultraviolet-visible-near infrared spectrophotometer (such as V-7100 from JASCO Corporation).

Examples of the ultraviolet absorber may include triazine based ultraviolet absorbers; benzophenone based ultraviolet absorbers such as hydroxybenzophenone based ultraviolet absorbers; and benzotriazole based ultraviolet absorbers.

Among them, from the viewpoint of suppressing the deterioration of the substrate layer due to ultraviolet ray, one kind or more of the ultraviolet absorber selected from the group consisting of a hydroxybenzophenone based ultraviolet absorber and a benzotriazole based ultraviolet absorber is preferable, and one kind or more of the ultraviolet absorber selected from the group consisting of a hydroxybenzophenone based ultraviolet absorber is more preferable.

Specific examples of the hydroxybenzophenone based ultraviolet absorber may include those described in, for example, JP-A No. 2019-132930.

Among the hydroxybenzophenone based ultraviolet absorber, 2-hydroxybenzophenone based ultraviolet absorber is preferable, one kind or more selected from the group consisting of a benzophenone based ultraviolet absorber having the following general formula (A) is more preferable. The deterioration of the substrate layer due to ultraviolet ray may be suppressed, and durability may be improved.

General formula (A)

[Chemical 1]

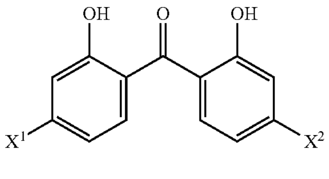

(In the general formula (A), $X^1$ and $X^2$ each independently represents a hydroxyl group, —$OR^a$, or a 1-15 C hydrocarbon group; Ra represents a 1-15 C hydrocarbon group.)

In the general formula (A), examples of the 1-15 C hydrocarbon group in $X^1$, $X^2$, and Ra may include a methyl group, an ethyl group, a propyl group, a butyl group, a pentyl group, a hexyl group, a heptyl group, an octyl group, a dodecyl group, an allyl group, and a benzyl group. The 3 C or more aliphatic hydrocarbon group may be a straight chain, or a branched respectively. The hydrocarbon group is preferably 1-12 C, and more preferably 1-8 C. From the viewpoint of easily improved transparency, the hydrocarbon group is preferably an aliphatic hydrocarbon group, among them, preferably a methyl group or an allyl group.

From the viewpoint of improving the durability, $X^1$ and $X^2$ each independently is preferably a hydroxyl group, or —$OR^a$.

Among them, one kind or more selected from the group consisting of the benzophenone based ultraviolet absorber having the general formula (A) is preferably one kind or more selected from the group consisting of 2,2',4,4'-tetrahydroxy benzophenone, 2,2'-dihydroxy4,4'-dimethoxybenzophenone, and 2,2'-dihydroxy-4,4'-diallyloxybenzophenone; more preferably one kind or more selected from the group consisting of 2,2',4,4'-tetrahydroxy benzophenone, and 2,2'-dihydroxy-4,4'-dimethoxybenzophenone.

Specific examples of the benzotriazole based ultraviolet absorber may include those described in, for example, JP-A No. 2019-132930.

Among them, the benzotriazole based ultraviolet absorber is preferably 2-(2-hydroxyphenyl) benzotriazoles, and more preferably one kind or more selected from the group consisting of the benzotriazole based ultraviolet absorber having the following general formula (B). The reason therefor is to suppress the deterioration of the substrate layer due to ultraviolet ray, and to improve the durability.

General formula (B)

[Chemical 2]

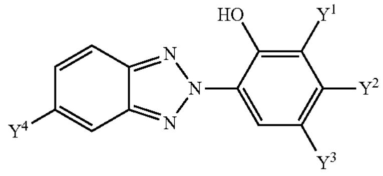

(In the general formula (B), $Y^1$, $Y^2$, and $Y^3$ each independently represents a hydrogen atom, a hydroxyl group, —$OR^b$, or a 1-15 C hydrocarbon group; $R^b$ represents a 1-15 C hydrocarbon group; at least one of $Y^1$, $Y^2$, and $Y^3$ represents a hydroxyl group, —$OR^b$, or a 1-15 C hydrocarbon group; and $Y^4$ represents a hydrogen atom, or a halogen atom.)

In the general formula (B), examples of the 1-15 C hydrocarbon group in $Y^1$, $Y^2$, $Y^3$ and $R^b$ may include a methyl group, an ethyl group, a propyl group, a butyl group, a pentyl group, a hexyl group, a heptyl group, an octyl group, and a dodecyl group. The 3c or more aliphatic hydrocarbon group may be a straight chain, or a branched respectively. The hydrocarbon group is preferably 1-12 C, and more preferably 1-8 C. From the viewpoint of easily improved transparency, the hydrocarbon group is preferably an aliphatic hydrocarbon group, preferably a straight chain, or a branched alkyl group; among them, preferably a methyl group, t-butyl group, t-pentyl group, n-octyl group, or t-octyl group.

In the general formula (B), examples of the halogen atom in $Y^4$ may include a chlorine atom, a fluorine atom, and a bromine atom, among them, a chlorine atom is preferable.

Among them, in the general formula (B), $Y^1$ and $Y^3$ preferably represent a hydrogen atom, and $Y^2$ preferably represents a hydroxy group, or —$OR^b$; and more preferably one kind or more selected from the group consisting of 2-(2-hydroxy-4-octyloxyphenyl)-2H-benzotriazole, and 2-(2,4-dihydroxyphenyl)-2H-benzotriazole. The reason therefor is to suppress the deterioration of the substrate layer due to ultraviolet ray, and to improve durability.

From the viewpoint of suppressing the haze due to the mixing of the ultraviolet absorber, the content of the ultraviolet absorber in the hard coating layer is preferably, for example, 10% by mass or less, and more preferably 7% by mass or less. Also, from the viewpoint of suppressing the deterioration of the substrate layer due to ultraviolet ray and improving the durability, the content of the ultraviolet absorber in the hard coating layer is preferably 1% by mass or more and 6% by mass or less, and more preferably 2% by mass or more and 5% by mass or less.

(v) Antifoulant

The hard coating layer may include an antifoulant. The stacked body may be imparted with an antifouling property.

The antifoulant is not particularly limited, and examples thereof may include a silicone based antifoulant, a fluorine based antifoulant, and a silicone based-fluorine based antifoulant. Also, the antifoulant may be an acrylic based antifoulant. One kind of the antifoulant may be used alone, and two kinds or more may be used as a mixture.

A fingerprint is not likely to be marked (inconspicuous) on the hard coating layer including a silicone based antifoulant or a fluorine based antifoulant, and is easily wiped off. Also, when the silicone based antifoulant or the fluorine based antifoulant is included, since the surface tension when applying a curable resin composition for a hard coating layer may be decreased, leveling property is excellent, so that the appearance of the obtained hard coating layer will be excellent.

Also, the hard coating layer including the silicone based antifoulant is excellent in sliding property, and excellent in scratch resistance. In a display device provided with a stacked body including a hard coating layer including such a silicone based antifoulant, since the sliding property when it is touched with a finger or a stylus pen is excellent, the texture is improved.

In order to improve durability of the antifouling performance, the antifoulant preferably includes a reactive functional group. When the antifoulant does not include the reactive functional group, regardless of whether the stacked body is a rolled shape or a sheet shape, when the stacked body is stacked, the antifoulant may be transferred to the surface opposite side to the hard coating layer side surface of the stacked body, and when another layer is adhered or applied onto the surface opposite side to the hard coating layer side surface of the stacked body, another layer may be peeled off, and further, another layer may be peeled off easily when it is bent repeatedly. In contrast to this, when the antifoulant includes the reactive functional group, the durability of the antifoulant property may be excellent.

The number of the reactive functional groups included in the antifoulant may be 1 or more, and preferably 2 or more. By using the antifoulant including 2 or more reactive functional groups, excellent scratch resistance may be imparted to the hard coating layer.

Also, the weight average molecular weight of the antifoulant is preferably 5,000 or less. The weight average molecular weight of the antifoulant may be measured by gel permeation chromatography (GPC).

The antifoulant may be evenly dispersed in the hard coating layer. From the viewpoint of obtaining sufficient antifoulant property with a low adding amount, and also suppressing the deterioration of the strength of the hard coating layer, the antifoulant preferably exist eccentrically on the surface side of the hard coating layer.

Examples of a method for placing the antifoulant eccentrically on the surface side of the hard coating layer may include a method wherein, during the formation of the hard coating layer, the coating film of a curable resin composition for a hard coating layer is dried, and before curing thereof, the coating film is heated to reduce the viscosity of the resin component included in the coating film so as to increase the flowability so that the antifoulant eccentrically exist on the surface side of the hard coating layer; and a method wherein, using an antifoulant with low surface tension, placing the antifoulant eccentrically on the surface of the hard coating layer by floating the antifoulant on the surface of the coating film during the drying of the coating film without applying heat, and then, curing the coating film.

The content of the antifoulant is preferably, for example, 0.01 parts by mass or more and 3.0 parts by mass or less, with respect to 100 parts by mass of the resin component. When the content of the antifoulant is too low, there may be cases where sufficient antifouling property may not be imparted to the hard coating layer. Also, when the content of the antifoulant is too high, the hardness of the hard coating layer may be decreased.

(vi) Another Additive

The hard coating layer may further include an additive, if necessary. The additive is not particularly limited, and is appropriately selected according to the function to be imparted to the hard coating layer. Examples thereof may include inorganic or organic particles configured to adjust the refractive index, an infrared absorber, an antiglare agent, an antifoulant, an antistatic agent, a coloring agent such as a blue pigment and a violet pigment, a leveling agent, a surfactant, an easy lubricant, various sensitizers, a flame retardant, an adhesive imparting agent, a polymerization inhibitor, an antioxidant, a light stabilizer, and a surface modifier.

(d) Method for Forming Hard Coating Layer

Examples of the method for forming a hard coating layer may include a method wherein the substrate layer is coated with a curable resin composition for a hard coating layer including the polymerizable compound, and cured.

The curable resin composition for a hard coating layer includes a polymerizable compound, and as necessary, may further include a polymerization initiator, particles, an ultraviolet absorber, a solvent, and an additive.

The method for applying the curable resin composition for a hard coating layer on the substrate layer is not particularly limited as long as it is capable of applying with a desired thickness, and examples thereof may include a general coating method such as a gravure coating method, a gravure reverse coating method, a gravure offset coating method, a spin coating method, a roll coating method, a reverse roll method, a blade coating method, a dip coating method, a spray coating method, a die coating method and a screen printing method. Also, a transfer method may also be used as a method for forming a coating film of a resin composition for a hard coating layer.

The solvent is removed from the coating film of the curable resin composition for a hard coating layer by drying as necessary. Examples of the drying method may include a reduced-pressure drying method, drying by heating, and a combination of these drying methods. For example, the drying may be carried out by heating at temperature of 30° C. or more and 120° C. or less for 10 seconds or more and 180 seconds or less.

The method for curing the coating film of the curable resin composition for a hard coating layer is appropriately selected according to the polymerizable group of the polymerizable compound, and for example, at least one of a light irradiation, and a heating may be used.

For the light irradiation, for example, an ultraviolet ray, a visible ray, an electron beam, or an ionizing radiation is mainly used. For an ultraviolet ray curing, for example, ultraviolet ray emitted from beams such as an ultra-high pressure mercury lamp, a high pressure mercury lamp, a low pressure mercury lamp, a carbon arc, an xenon arc, and a metal halide lamp may be used. The irradiation amount of the energy ray source may be, for example, approximately 50 $mJ/cm^2$ or more, and 5000 $mJ/cm^2$ or less as an integrated exposure at ultraviolet ray wave length of 365 nm.

When heating, for example, the treatment may be carried out at temperature of 40° C. or more and 120° C. or less. Also, the reaction may be carried out by leaving the coating film to stand for 24 hours or more at room temperature (25° C.).

(2) Substrate Layer

The substrate layer in the present embodiment is a member configured to support the hard coating layer.

(a) Properties of Substrate Layer

In the present embodiment, the composite elastic modulus of the substrate layer is preferably, for example, 5.7 GPa or more, preferably 6.5 GPa or more, and further preferably 7.5 GPa or more. Since the composite elastic modulus of the substrate layer is in the above range, the surface hardness of the hard coating film side surface of the stacked body may be increased, and the scratch resistance may be improved.

Also, according to the method for measuring a composite elastic modulus described below, since the composite elastic modulus of the glass substrate is approximately 40 GPa, the composite elastic modulus of the substrate layer is preferably, for example, 40 GPa or less, more preferably 30 GPa or less, and further 20 GPa or less. The composite elastic modulus of the substrate layer is preferably, for example, 5.7 GPa more and 40 GPa or less, more preferably 6.5 GPa or more and 30 GPa or less, and further preferably 7.5 GPa or more and 20 GPa or less.

The method for measuring the composite elastic modulus of the substrate layer may be similar to the method for measuring the composite elastic modulus of the joining layer described above.

The composite elastic modulus of the substrate layer may be adjusted by, for example, the type, composition and so on of the material included in the substrate layer.

When the stacked body in the present embodiment is used for, for example, a display device, the substrate layer preferably has transparency. Specifically, the total light transmittance of the substrate layer is preferably 80% or more, more preferably 85% or more, and further preferably 88% or more.

Also, the haze of the substrate layer is preferably, for example, 2% or less, more preferably 1.5% or less, and further preferably 1% or less.

(b) Material of Substrate Layer

As the substrate layer, for example, a resin substrate may be used. It is preferable that the resin constituting the resin substrate satisfies the composite elastic modulus described above and has transparency. Examples of such resin may include polyimide based resins, polyamide based resins, polyester based resins, cellulose based resins, acrylic based resins, polycarbonate based resins, and polyethylene naphthalate based resins. Examples of the polyimide based resin may include polyimide, polyamideimide, polyetherimide, and polyesterimide. Examples of the polyester based resin may include polyethylene terephthalate (PET), polypropylene terephthalate, polybutylene terephthalate, and polyethylene naphthalate (PEN). Examples of the cellulose based resin may include triacetyl cellulose (TAC). Examples of the acrylic based resin may include poly(meth)methyl acrylate, and poly(meth)ethyl acrylate. Incidentally, the resin substrate may be a single layer, and may be a multilayer such as co-extruded film. Among them, from the viewpoint of having bending resistance, excellent hardness and transparency, the polyimide based resin is preferable.

The polyimide based resin is not particularly limited as long as it satisfies the composite elastic modulus described above and has transparency; and among the above, polyimide and polyamideimide are preferably used.

(i) Polyimide

The polyimide is obtained by reacting a tetracarboxylic acid component and a diamine component. The polyimide is not particularly limited as long as it satisfies the composite elastic modulus described above and has transparency; and it is preferable to have at least one kind of the structure selected from the group consisting of the structure represented by the following general formula (1) and the following general formula (3), for example, from the viewpoint of having excellent transparency and excellent stiffness.

[Chemical 3]

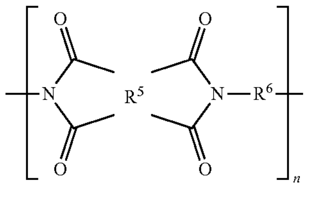

(1)

In the general formula (1), $R^5$ represents a tetravalent group which is a tetracarboxylic acid residue; and $R^6$ represents at least one kind of divalent group selected from the group consisting of a trans-cyclohexanediamine residue, a trans-1,4-bismethylenecyclohexanediamine residue, a 4,4'-diaminodiphenylsulfone residue, a 3,4'-diaminodiphenylsulfone residue, and a divalent group represented by the following general formula (2). The "n" represents the number of repeating units, and is 1 or more.

[Chemical 4]

(2)

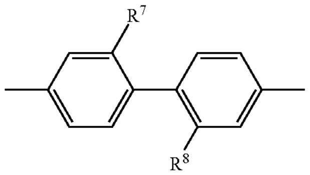

In the general formula (2), $R^7$ and $R^8$ each independently represents a hydrogen atom, an alkyl group, or a perfluoroalkyl group.

[Chemical 5]

(3)

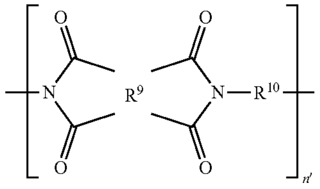

In the general formula (3), $R^9$ represents at least one kind of tetravalent group selected from the group consisting of a cyclohexane tetracarboxylic acid residue, a cyclopentanetetracarboxylic acid residue, a dicyclohexane-3,4,3',4'-tetracarboxylic acid residue, and a 4,4'-(hexafluoroisopropylidene)diphthalic acid residue; and $R^{10}$ represents a divalent group which is a diamine residue. The "n'" represents the number of repeating units, and is 1 or more.

Incidentally, "tetracarboxylic acid residue" refers to a residue obtained by excluding four carboxyl groups from a tetracarboxylic acid; and represents the same structure as a residue obtained by excluding an acid dianhydride structure from a tetracarboxylic acid dianhydride. Also, "diamine residue" refers to a residue obtained by excluding two amino groups from a diamine.

In the general formula (1), $R^5$ is a tetracarboxylic acid residue, and may be a residue obtained by excluding an acid dianhydride structure from a tetracarboxylic acid dianhydride. Examples of the tetracarboxylic acid dianhydride may include those described in WO 2018/070523. Among them, $R^5$ in the general formula (1) preferably includes at least one kind selected from the group consisting of a 4,4'-(hexafluoroisopropylidene)diphthalic acid residue, a 3,3',4,4'-biphenyltetracarboxylic acid residue, pyromellitic acid residue, a 2,3',3,4'-biphenyltetracarboxylic acid residue, a 3,3',4,4'-benzophenone tetracarboxylic acid residue, a 3,3',4,4'-diphenylsulfone tetracarboxylic acid residue, a 4,4'-oxydiphthalic acid residue, a cyclohexane tetracarboxylic acid residue, and a cyclopentane tetracarboxylic acid residue from the viewpoint of improved transparency and improved stiffness. It is further preferable to include at least one kind selected from the group consisting of a 4,4'-(hexafluoroisopropylidene)diphthalic acid residue, a 4,4'-oxydiphthalic acid residue and a 3,3',4,4'-diphenylsulfone tetracarboxylic acid residue.

In $R^5$, these preferable residues are preferably included in total of 50 mol % or more, more preferably 70 mol % or more, and further preferably 90 mol % or more.

Also, as $R^5$, it is also preferable to use a mixture of the followings: a tetracarboxylic acid residue group (Group A) suitable for improving rigidity such as at least one kind selected from the group consisting of a 3,3',4,4'-biphenyltetracarboxylic acid residue, a 3,3',4,4'-benzophenone tetracarboxylic acid residue, and a pyromellitic acid residue; and a tetracarboxylic acid residue group (Group B) suitable for improving transparency such as at least one kind selected from the group consisting of a 4,4'-(hexafluoroisopropylidene)diphthalic acid residue, a 2,3',3,4'-biphenyltetracarboxylic acid residue, a 3,3',4,4'-diphenylsulfone tetracarboxylic acid residue, a 4,4'-oxydiphthalic acid residue, a cyclohexane tetracarboxylic acid residue, and a cyclopentanetetracarboxylic acid residue.

In this case, in relation to the content ratio of the tetracarboxylic acid residue group suitable for improving the rigidity (Group A) and the tetracarboxylic acid residue group suitable for improving transparency (Group B), with respect to 1 mol of the tetracarboxylic acid residue group suitable for improving transparency (Group B), the tetracarboxylic acid residue group suitable for improving rigidity (Group A) is preferably 0.05 mol or more and 9 mol or less, more preferably 0.1 mol or more and 5 mol or less, and further preferably 0.3 mol or more and 4 mol or less.

Among them, $R^6$ in the general formula (1) is preferably at least one kind of divalent group selected from the group consisting of a 4,4'-diaminodiphenylsulfone residue, a 3,4'-diaminodiphenylsulfone residue, and a divalent group represented by the general formula (2); and is further preferably at least one kind of divalent group selected from the group consisting of a 4,4'-diaminodiphenylsulfone residue, a 3,4'-diaminodiphenylsulfone residue, and a divalent group represented by the general formula (2) wherein $R^7$ and $R^8$ are a perfluoroalkyl group, from the viewpoint of improved transparency and improved stiffness.

Among them, from the viewpoint of improved transparency and improved stiffness, $R^9$ in the general formula (3) preferably includes a 4,4'-(hexafluoroisopropylidene) diphthalic acid residue, a 3,3',4,4'-diphenylsulfontetracarboxylic acid residue, and oxydiphthalic acid residue.

The $R^9$ preferably includes 50 mol % or more, more preferably 70 mol % or more, and further preferably 90 mol % or more of these preferable residues.

The $R^{10}$ in the general formula (3) is a diamine residue, and may be a residue obtained by excluding two amino groups from a diamine. Examples of the diamine may include those described in, for example, WO 2018/070523. Among them, from the viewpoint of improved transparency and improved stiffness, $R^{10}$ in the general formula (3) preferably includes at least one kind of divalent group selected from the group consisting of a 2,2'-bis(trifluoromethyl)benzidine residue, a bis[4-(4-aminophenoxy)phenyl] sulfone residue, a 4,4'-diaminodiphenylsulfone residue, a 2,2-bis[4-(4-aminophenoxy)phenyl]hexafluoropropane residue, a bis[4-(3-aminophenoxy)phenyl]sulfone residue, a 4,4'-diamino-2,2'-bis(trifluoromethyl)diphenylether residue, a 1,4-bis[4-amino-2-(trifluoromethyl)phenoxy]benzene residue, a 2,2-bis[4-(4-amino-2-trifluoromethylphenoxy)phenyl]hexafluoropropane residue, a 4,4'-diamino-2-(trifluoromethyl)diphenyl ether residue, a 4,4'-diaminobenzanilide residue, a N,N'-bis(4-aminophenyl)terephthalamide residue and a 9,9-bis(4-aminophenyl)fluorene residue; and further preferably includes at least one kind of divalent group selected from the group consisting of a 2,2'-bis(trifluoromethyl) benzidine residue, a bis[4-(4-aminophenoxy)phenyl] sulfone residue, and a 4,4'-diaminodiphenylsulfone residue.

In $R^{10}$, these preferable residues are preferably included in total of 50 mol % or more, more preferably 70 mol % or more, and further preferably 90 mol % or more.

Also, as $R^{10}$, it is also preferable to use a mixture of the followings: a diamine residue group (Group C) suitable for improving rigidity such as at least one kind selected from the group consisting of a bis[4-(4-aminophenoxy)phenyl] sulfone residue, a 4,4'-diaminobenzanilide residue, a N,N'-bis(4-aminophenyl)terephthalamide residue, a paraphenylenediamine residue, a metaphenylenediamine residue, and a 4,4'-diaminodiphenylmethane residue; and a diamine residue group (Group D) suitable for improving transparency such as at least one kind selected from the group consisting of a 2,2'-bis(trifluoromethyl)benzidine residue, a 4,4'-diaminodiphenyl sulfone residue, a 2,2-bis[4-(4-aminophenoxy)phenyl] hexafluoropropane residue, a bis[4-(3-aminophenoxy)phenyl] sulfone residue, a 4,4'-diamino-2,2'-bis(trifluoromethyl)diphenylether residue, a 1,4-bis[4-amino-2-(tirfluoromethyle)phenoxy] benzene residue, a 2,2-bis[4-(4-amino-2-trifluoromethylphenoxy)phenyl] hexafluoropropane residue, a 4,4'-diamino-2 (trifluoromethyl)dipenylether residue, and a 9,9-bis(4-aminophenyl)fluorene residue.

In this case, in relation to the content ratio of the diamine residue group suitable for improving rigidity (Group C) and the diamine residue group suitable for improving transparency (Group D), with respect to 1 mol of the diamine residue group suitable for improving transparency (Group D), the diamine residue group suitable for improving rigidity (Group C) is preferably 0.05 mol or more and 9 mol or less, more preferably 0.1 mol or more and 5 mol or less, and further preferably 0.3 mol or more and 4 mol or less.

In the structure represented by the general formula (1) and the general formula (3), "n" and "n'" each independently represents the number of repeating units, and is 1 or more. The number of repeating units "n" in the polyimide may be appropriately selected according to the structure, and is not particularly limited. The average number of repeating units may be, for example, 10 or more and 2000 or less, and is preferably 15 or more and 1000 or less.

Also, the polyimide may include a polyamide structure in a part thereof. Examples of the polyamide structure that may be included may include a polyamideimide structure including a tricarboxylic acid residue such as trimellitic acid anhydride; and a polyamide structure including a dicarboxylic acid residue such as terephthalic acid.

From the viewpoint of improved transparency and improved surface hardness, at least one of the tetravalent group which is a tetracarboxylic acid residue of $R^5$ and $R^9$, and the divalent group which is a diamine residue of $R^6$ and $R^{10}$ preferably includes an aromatic ring; and preferably includes at least one selected from the group consisting of (i) a fluorine atom, (ii) an aliphatic ring, and (iii) a structure wherein aromatic rings are connected to each other by an alkylene group which may be substituted with a sulfonyl group or a fluorine. When the polyimide includes at least one kind selected from a tetracarboxylic acid residue including an aromatic ring, and a diamine residue including an aromatic ring, the molecular skeleton becomes rigid, the orientation property is increased, and the surface hardness is improved; however, the absorption wavelength of the rigid aromatic ring skeleton tends to be shifted to the longer wavelength side, and the transmittance of the visible light region tends to be decreased. Meanwhile, when the polyimide includes (i) a fluorine atom, the transparency is improved since it may make the electronic state in the polyimide skeleton to a state wherein a charge transfer is difficult. Also, when the polyimide includes (ii) an aliphatic ring, transparency is improved since the transfer of charge in the skeleton may be inhibited by breaking the conjugation of n electrons in the polyimide skeleton. Also, when the polyimide includes (iii) a structure wherein aromatic rings are connected to each other by an alkylene group which may be substituted with a sulfonyl group or a fluorine, transparency is improved since the transfer of charge in the skeleton may be inhibited by breaking the conjugation of n electrons in the polyimide skeleton.

Among them, from the viewpoint of improved transparency and improved surface hardness, at least one of the tetravalent group which is a tetracarboxylic acid residue of $R^5$ and $R^9$, and the divalent group which is a diamine residue of $R^6$ and $R^{10}$ preferably includes an aromatic ring and a fluorine atom; and the divalent group which is a diamine residue of $R^6$ and $R^{10}$ preferably includes an aromatic ring and a fluorine atom.

Specific examples of such polyimide may include those having a specific structure described in WO 2018/070523.

The polyimide may be synthesized by a known method. Also, a commercially available polyimide may be used. Examples of the commercially available products of polyimide may include Neopulim (registered trademark) from Mitsubishi Gas Chemical Company, Inc.

The weight average molecular weight of the polyimide is preferably, for example, 3000 or more and 500,000 or less, more preferably 5000 or more and 300,000 or less, and further preferably 10,000 or more and 200,000 or less. When the weight average molecular weight is too low, sufficient strength may not be obtained, and when the weight average molecular weight is too high, the viscosity is increased and the solubility is decreased, so that a substrate layer having a smooth surface and uniform thickness may not be obtained in some cases.

Incidentally, the weight average molecular weight of the polyimide may be measured by gel permeation chromatography (GPC). Specifically, the polyimide is used as a N-methylpyrrolidone (M4P) solution having a concentration of 0.1% by mass; a 30 mmol % LiBr-NMP solution with a water content of 500 ppm or less is used as a developing solvent; and measurement is carried out using a GPC device (HLC-8120, used column: GPC LF-804 from SHODEX) from Tosoh Corporation, under conditions of a sample injecting amount of 50 μL, a solvent flow rate of 0.4 mL/min, and at 37° C. The weight average molecular weight is determined on the basis of a polystyrene standard sample having the same concentration as that of the sample.

(ii) Polyamideimide

The polyamideimide is not particularly limited as long as it satisfies the composite elastic modulus described above and has transparency; and examples thereof may include those having a first block including a constituent unit derived from dianhydride, and a constituent unit derived from diamine; and a second block including a constituent unit derived from aromatic dicarbonyl compound, and a constituent unit derived from aromatic diamine. In the polyamideimide, the dianhydride may include, for example, biphenyltetracarboxylic acid dianhydride (BPDA) and 2-bis (3,4-dicarboxyphenyl) hexafluoropropanedianhydride (6FDA). Also, the diamine may include bistrifluoromethylbenzidine (TFDB). That is, the polyamideimide has a structure wherein a polyamideimide precursor including a first block wherein monomers including dianhydride and diamine are copolymerized; and a second block wherein monomers including an aromatic dicarbonyl compound and an aromatic diamine are copolymerized, is imidized. By including the first block including an imide bond and the second block including an amide bond, the polyamideimide is excellent in not only optical properties but also thermal and mechanical properties. In particular, by using bistrifluoromethylbenzidine (TFDB) as the diamine forming the first block, thermal stability and optical properties may be improved. Also, by using 2-bis(3,4-dicarboxyphenyl) hexafluoropropane dianhydride (6FDA) and biphenyltetracarboxylic acid dianhydride (BPDA) as the dianhydride forming the first block, birefringence may be improved, and heat resistance may be secured.

The dianhydride forming the first block comprises two kinds of dianhydrides, that is, 6FDA and BPDA. In the first block, a polymer to which TFDB and 6FDA are bonded, and a polymer to which TFDB and BPDA are bonded may be included, based on separate repeating units, respectively segmented; may be regularly arranged within the same repeating unit; and may be included in a completely random arrangement.

Among the monomers forming the first block, BPDA and 6FDA are preferably included as dianhydrides in a molar ratio of 1:3 to 3:1. This is because it is possible not only to secure the optical properties, but also to suppress deterioration of mechanical properties and heat resistance, and it is possible to have excellent birefringence.

The molar ratio of the first block and the second block is preferably 5:1 to 1:1. When the content of the second block is remarkably low, the effect of improving the thermal stability and mechanical properties due to the second block may not be sufficiently obtained in some cases. Also, when the content of the second block is higher than the content of the first block, although the thermal stability and mechanical properties may be improved, optical properties such as yellowness and transmittance, may be deteriorated, and the birefringence property may also be increased in some cases. Incidentally, the first block and the second block may be random copolymers, and may be block copolymers. The repeating unit of the block is not particularly limited.

Examples of the aromatic dicarbonyl compound forming the second block may include one kind or more selected from the group consisting of terephthaloyl chloride (p-terephthaloyl chloride, TPC), terephthalic acid, iso-phthaloyl dichloride, and 4,4'-benzoyl dichloride (4,4'-benzoyl chloride). One kind or more selected from terephthaloyl chloride (p-terephthaloyl chloride, TPC) and iso-phthaloyl dichloride may be preferably used.

Examples of the diamine forming the second block may include diamines including one kind or more flexible group selected from the group consisting of 2,2-bis(4-(4-aminophenoxy)phenyl)hexafluoropropane (HFBAPP), bis(4-(4-aminophenoxy)phenyl)sulfone (BAPS), bis(4-(3-aminophenoxy)phenyl)sulfone (BAPSM), 4,4'-diaminodiphenyl sulfone (4DDS), 3,3'-diaminodiphenyl sulfone (3DDS), 2,2-bis(4-(4-aminophenoxy)phenylpropane (BAPP), 4,4'-diaminodiphenylpropane (6HDA), 1,3-bis(4-aminophenoxy) benzene (134APB), 1,3-bis(3-aminophenoxy)benzene (133APB), 1,4-bis(4-aminophenoxy)biphenyl (BAPB), 4,4'-bis(4-amino-2-trifluoromethylphenoxy)biphenyl (6FAPBP), 3,3-diamino-4,4-dihydroxydiphenylsulfone (DABS), 2,2-bis(3-amino-4-hydroxyloxyphenyl)propane (BAP), 4,4'-diaminodiphenylmethane (DDM), 4,4'-oxydianiline (4-ODA) and 3,3'-oxydianiline (3-ODA).

When the aromatic dicarbonyl compound is used, it is easy to realize high thermal stability and mechanical properties, but may exhibit high birefringence due to the benzene ring in the molecular structure. Therefore, in order to suppress the deterioration in birefringence due to the second block, it is preferable to use a diamine wherein a flexible group is introduced into the molecular structure. Specifically, the diamine is more preferably one kind or more diamine selected from bis(4-(3-aminophenoxy)phenyl) sulfone (BAPSM), 4,4'-diaminodiphenylsulfone (4DDS) and 2,2-bis(4-(4-aminophenoxy)phenyl)hexafluoropropane (HFBAPP). In particular, the longer the length of the flexible group such as BAPSM, and a diamine including a substituent at meta position, the better the birefringence may be exhibited.

For the polyamideimide precursor including a first block wherein a dianhydride including a biphenyltetracarboxylic acid dianhydride (BPDA) and a 2-bis(3,4-dicarboxyphenyl) hexafluoropropanedianhydride (6FDA), and a diamine including bistrifluoromethylbenzidine (TFDB) are copolymerized; and a second block wherein an aromatic dicarbonyl compound and an aromatic diamine are copolymerized, in the molecular structure, the weight average molecular weight measured by GPC is preferably, for example, 200,000 or more and 215,000 or less, and the viscosity is preferably, for example, 2400 poise or more and 2600 poise or less.

The polyamideimide may be obtained by imidizing a polyamideimide precursor. Also, a polyamideimide film may be obtained using the polyamideimide. For a method for imidizing the polyamideimide precursor and a method for producing a polyamideimide film, JP-A No. 2018-506611, for example, may be referred.

4. Glass Substrate

The thickness of the glass substrate in the present embodiment is 100 μm or less, preferably 90 μm or less, more preferably 80 μm or less, and further preferably 70 μm or less. When the thickness of the glass substrate is thin as the above range, excellent bending resistance may be obtained, and at the same time, sufficient hardness may be obtained. It is also possible to suppress curling of the stacked body. Furthermore, it is preferable in terms of reducing the weight of the stacked body. Meanwhile, the thickness of the glass substrate is preferably, for example, 10 μm or more, more preferably 15 μm or more, further preferably 20 μm or more, and particularly preferably 30 μm or more. When the thickness of the glass substrate is in the above range, good impact resistance may be obtained. The thickness of the glass substrate is, for example, 10 μm or more and 100 μm or less, preferably 15 μm or more and 90 μm or less, more preferably 20 μm or more and 80 μm or less, and further preferably 25 μm or more and 75 μm or less.

Also, the ratio of the glass substrate thickness with respect to the total thickness of the stacked body is preferably, for example, 30% or more, more preferably 40% or more, and further preferably 50% or more. When the ratio is in the above range, the thickness of the glass substrate may be made relatively thick so that the texture and tactile feel of glass due to the glass substrate may be maintained. Meanwhile, the ratio of the glass substrate thickness with respect to the total thickness of the stacked body is preferably, for example, 90% or less, more preferably 80% or less, and further preferably 70% or less. When the ratio is in the above range, the thickness of the hard coating film may be made relatively thick so that the impact resistance may be improved. The ratio of the glass substrate thickness with respect to the total thickness of the stacked body is preferably, for example, 30% or more and 90% or less, more preferably 40% or more and 80% or less, and further preferably 50% or more and 70% or less.

The glass constituting the glass substrate is not particularly limited, and among them, it is preferably a chemically strengthened glass. The chemically strengthened glass is preferable since it has excellent mechanical strength and may be made thin accordingly. The chemically strengthened glass is typically a glass wherein mechanical properties are strengthened by a chemical method by partially exchanging ionic species, such as by replacing sodium with potassium, in the vicinity of the surface of the glass, and includes a compressive stress layer on the surface.

Examples of the glass constituting the chemically strengthened glass substrate may include aluminosilicate glass, soda-lime glass, borosilicate glass, lead glass, alkali barium glass, and aluminoborosilicate glass. Also, the chemically strengthened glass substrate may be constituted with crystallized glass.

Examples of the commercial products of the chemically strengthened glass substrate may include Gorilla Glass from Corning Incorporated; Dragontrail from AGC Inc; and chemically strengthened glass from Schott AG.

5. Functional Layer

The stacked body in the present embodiment may further include a functional layer on the hard coating layer, on an opposite surface side to the substrate layer; between the hard coating layer and the substrate layer; between the substrate layer and the joining layer; between the glass substrate and the joining layer; or on the glass substrate, on an opposite surface side to the joining layer.

Also, the functional layer may be a single layer, and may include a plurality of layers. Also, the functional layer may be a layer having a single function, and may include a plurality of layers having functions different from each other.

Examples of the functional layer placed on the hard coating layer, on an opposite side to the substrate layer, may include an antireflection layer, an antiglare layer and a protection layer. Also, examples of the functional layer placed between the hard coating layer and the substrate layer may include a primer layer, scattering prevention layer and an impact absorbing layer. Also, examples of the functional layer placed between the substrate layer and the joining layer may include a decorative layer, a primer layer, a color conditioning layer, a scattering prevention layer, and an impact absorbing layer. Also, examples of the functional layer placed between the glass substrate and the joining layer may include an electrode such as ITO, and an antenna wiring. Also, examples of the functional layer placed on the glass substrate, on an opposite surface side to the joining layer may include an adhesive layer, a decorative layer and an impact absorbing layer.

(Antireflection Layer)

Figure 2:
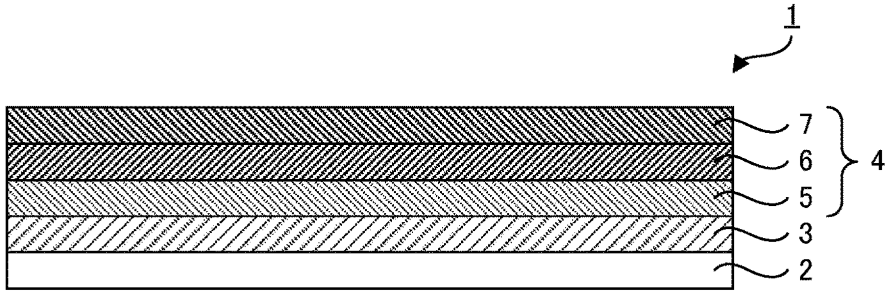
FIG. 2 is a schematic cross-sectional view illustrating an example of a stacked body in the present disclosure.

For example, as shown in FIG. 2, the stacked body in the present embodiment may include an antireflection layer 7 on the hard coating layer 6, on an opposite side surface to the substrate layer 5. Also, as shown in FIG. 2 for example, the antireflection layer 7 may be a layer that constituting the hard coating film 4.

The antireflection layer may be constituted with a single layer, and may be constituted with a multilayer.

As an antireflection layer, a general antireflection layer may be applied, examples thereof may include a single layer film including a material with a lower refractive index than the hard coating layer; a multilayer film including a high refractive index layer and a low refractive index layer from the hard coating layer side; a multilayer film wherein a high refractive index layer and a low refractive index layer are stacked alternately from the hard coating layer side; and a multilayer film including a medium refractive index layer, a high refractive index layer, and a low refractive index layer in order from the hard coating layer side.

When the antireflection layer is a single layer film, the material included in the single layer film may be a material with a lower refractive index than the hard coating layer, and examples thereof may include magnesium fluoride.

Also, when the antireflection layer is a multilayer film, the refractive index of the low refractive index layer is preferably, for example, 1.45 or less, and more preferably 1.40 or less or less. By setting the refractive index of the low refractive index layer in the above range, good antireflection property may be obtained. Also, the lower limit of the refractive index of the low refractive index layer is practically 1.10 or more.

Examples of the low refractive index layer may include those including a hydrolytic polycondensate of a metallic alkoxide; those including resin with low refractive index; those including low refractive index particles; those including a binder resin and low refractive index particles.

The hydrolytic polycondensate of a metal alkoxide may be obtained, for example, by the sol gel method.

Examples of the resin with low refractive index may include fluorine resins.

The low refractive index particles are not particularly limited, and for example, either of inorganic based particles such as silica and magnesium fluoride; and organic based particles may be used. Among them, in terms of reducing the reflectance of the antireflection layer, particles including voids are preferable. The particles including voids have a low refractive index since they include fine voids inside thereof, and include air in the voids. Examples of the particles including voids may include porous particles and hollow particles. Among the above, the hollow particles are preferable.

The hollow particle is a particle including an outer shell layer; the inside of the particle surrounded by the outer shell layer is hollow; and including air inside the particle.

The outer shell layer of the hollow particle may be inorganic material, and may be organic material, and examples thereof may include metals, metal oxides, resins, and silicas. Among the above, a hollow silica particle whose outer shell layer is silica, is preferable. When the outer shell layer is silica, the silica may be any condition of crystalline, sol, and gel.

The shape of the hollow particles may be any one of approximate orbicular such as spherical, spheroidal, and a polyhedral shape that may be approximated to an orbicular; a chain; a needle; a plate; a piece, a rod, and a fibrous form. Among them, spherical and approximate orbicular are preferable, and spheroidal or spherical is more preferable.

When the low refractive index layer includes a binder resin and low refractive particles, the low refractive index particles are preferably surface treated. The surface treatment of the low refractive index particles is preferably a surface treatment using a silane coupling agent. Among the above, a surface treatment using a silane coupling agent including a (meta)acryloyl group is preferable. By subjecting the low refractive index particles to a surface treatment, affinity with binder resin is improved, ensures uniform dispersion of the particles, and prevents aggregation between the particles so that the decrease in transparency of the low refractive index layer caused by enlargement of particles due to aggregation, and decrease in the applicability of the composition for a low refractive index layer and the film strength of the composition for a low refractive index layer may be suppressed.

Examples of the silane coupling agent preferably used in the surface treatment of the low refractive index particles may include 3-methacryloxypropyl methyldimethoxysilane, 3-methacryloxypropyl trimethoxysilane, 3-methacryloxypropylmethyl diethoxysilane, 3-methacryloxypropyl triethoxysilane, 3-acryloxypropyl trimethoxysilane, 2-(3,4-epoxycyclohexyl) ethyltrimethoxysilane, 3-glycidoxypropyl methyldimethoxysilane, 3-glycidoxypropyl trimethoxysilane, 3-glycidoxypropyl methyldiethoxysilane, 3-glycidoxypropyl triethoxysilane, N-2-(aminoethyl)-3-aminopropylmethyl dimethoxysilane, N-2-(aminoethyl)-3-aminopropyl trimethoxysilane, 3-aminopropyltrimethoxysilane, 3-aminopropyltriethoxysilane, 3-triethoxysilyl-N-(1,3-dimethylbutilidene)propylamine, N-phenyl-3-aminopropyl trimethoxysilane, tris-(trimethoxysilylpropyl) isocyanurate, 3-mercaptopropyl methyldimethoxysilane, 3-mercaptopropyl trimethoxysilane, 3-isocyanate propyl triethoxysilane, methyltrimethoxysilane, dimethyldimethoxysilane, phenyltrimethoxysilane, methyltriethoxysilane, dimethyldiethoxysilane, phenyltriethoxysilane, n-propyltrimethoxysilane, n-propyltriethoxysilane, hexyltrimethoxysilane, hexyltriethoxysilane, octyl triethoxysilane, decyltrimethoxysilane, 1,6-bis(trimethoxysilyl)hexane, trifluoropropyltrimethoxysilane, vinyltrimethoxysilane and vinyltriethoxysilane.

The average particle size of the low refractive index particles is preferably, for example 5 nm or more and 200 nm or less, and more preferably 10 nm or more and 150 nm or less. Also, when the low refractive index particles are hollow particles, the average particle size is preferably, for example, 5 nm or more and 200 nm or less, more preferably 30 nm or more and 150 nm or less, and further preferably 50 nm or more and 110 nm or less. When the average particle size is in the above range, a low refractive index layer with uniform thickness may be obtained easily. Also, by setting the average particle size to 5 nm or more, it is easy to suppress the aggregation of the particles, and in the case of the hollow particles, the refractive index of the low refractive index layer may be lowered sufficiently. Also, by setting the average particle size to 200 nm or less, it is easy to suppress the deterioration of visibility caused by whitening due to particle diffusion.

The average particle size of the low refractive index particles and high refractive index particles described below may be calculated by the following procedures (1) to (3).

(1) A photograph of the cross-section of the antireflection layer is taken with TEM or STEM. The acceleration voltage of TEM or STEM is preferably, for example, 10 kV or more and 30 kV or less, and the magnification is preferably, for example, 50,000 times or more and 300,000 times or less.

(2) Arbitrary 10 particles are extracted from the observation image, and the particle size of each particle is calculated. The particle size is measured as the distance between straight lines in a combination of two straight lines wherein the distance between the two straight lines is the maximum when the cross-section of the particle is sandwiched between arbitrary two parallel straight lines.

(3) By carrying out the same procedures for five times in the observation image of the same sample on different screen, and the value obtained from the number average of a total of 50 particles is regarded as the average particle size of the particles.

When the low refractive index layer includes the binder resin and low refractive index particles, the content of the low refractive index particles is preferably, for example, 20 parts by mass or more and 250 parts by mass or less, more preferably 30 parts by mass or more and 230 parts by mass or less, and further preferably 40 parts by mass or more and 200 parts by mass or less, with respect to 100 parts by mass of the binder resin of the low refractive index layer. When the content of the low refractive index particles is in the above range, the balance between antireflection property and chafing resistance may be improved.

Also, the ratio of hollow particles with respect to the total amount of the low refractive index particles included in the low refractive index layer is preferably 40% by mass or more, and more preferably 50% by mass or more. By setting the ratio of the hollow particles in the above range, the refractive index of the low refractive index layer may be reduced sufficiently so that good antireflection property may be obtained.

Examples of the binder resin included in the low refractive index layer may include a cured product of a curable resin composition. As the curable resin composition, those similar to the examples used for the hard coating layer may be used, and a photocurable resin composition is preferable.

Also, the curable resin composition that forms the binder resin preferably includes a fluorine-including compound such as fluorine-including oligomers and/or monomers including a photocurable functional group. By including the fluorine compound, the refractive index of the low refractive index layer may be easily reduced, and also antifouling property and sliding property may be imparted to the low refractive index layer.

Also, the thickness of the low refractive index layer is preferably approximately ¼ of the wavelength range of the visible light (around 100 nm) so that it is preferably, for example, 80 nm or more and 120 nm or less, more preferably 85 nm or more and 110 nm or less, and further preferably 90 nm or more and 105 nm or less.

Examples of the method for forming a low refractive index layer may include a wet method and a dry method. Examples of the wet method may include a forming method using metallic alkoxide and so on by a sol-gel method; a forming method by applying a resin with a low refractive index; and a forming method by applying a composition for a low refractive index layer including a binder resin and a low refractive index particle. Examples of the dry method may include a forming method by a physical vapor deposition method or a chemical vapor deposition method using a low refractive index particle. The wet method is superior in terms of production efficiency, and among them, the forming method by applying a composition for a low refractive index layer including a binder resin and a low refractive index particle, is preferable.

Also, the refractive index of the high refractive index layer is preferably, for example, 1.55 or more 1.85 or less, and more preferably 1.56 or more 1.70 or less. By setting the refractive index of the high refractive index layer at a predetermined value or more, good antireflection property may be obtained. Also, the upper limit of the refractive index of the high refractive index layer is practically 1.85 or less.

Examples of the high refractive index layer may include one including a binder resin and a high refractive index particle.

Examples of the high refractive index particle may include antimony pentoxide, zinc oxide, titanium oxide, cerium oxide, tin-doped indium oxide, antimony-doped tin oxide, yttrium oxide and zirconium oxide.

The average particle size of the high refractive index particles is preferably, for example, 5 nm or more and 200 nm or less, more preferably 5 nm or more and 100 nm or less, and further preferably 10 nm or more and 80 nm or less. By setting the average particle size to 5 nm or more, it is easy to suppress the aggregation of the particles, and by setting the average particle size to 200 nm or less, the deterioration of visibility, caused by whitening due to particle diffusion, may be easily suppressed.

In terms of the balance between the higher refractive index of the coating film and strength of the coating film, the content of the high refractive index particles is preferably 50 parts by mass or more and 500 parts by mass or less, more preferably 100 parts by mass or more and 450 parts by mass or less, and further preferably 200 parts by mass or more and 430 parts by mass or less, with respect to 100 parts by mass of the binder resin.

Examples of the binder resin included in the high refractive index layer may include a cured product of a curable resin composition. As the curable resin composition, those similar to the examples used for the hard coating layer may be used, and a photocurable resin composition is preferable.

Also, the thickness of the high refractive index layer is preferably, for example, 200 nm or less, more preferably 50 nm or more and 180 nm or less, and further preferably 90 nm or more and 160 nm or less. By setting the thickness of the high refractive index layer to the above range, low reflectivity may be exhibited in a wide wavelength range in the visible light range (380 nm to 780 nm).

Examples of the method for forming a high refractive index layer may include a forming method by applying a composition for a high refractive index layer including a binder resin and a high refractive index particle.

The thickness of the antireflection layer may be similar to the thickness of a general antireflection layer, and it is appropriately selected according to the layer structure of the antireflection layer.

Examples of the method for forming an antireflection layer may include a coating method, and a vapor deposition method, and is appropriately selected according to the material and so on of the antireflection layer.

6. Second Joining Layer

For example, as shown in FIG. 4, in the stacked body in the present embodiment, a second joining layer 10 may be placed on the glass substrate 2, on an opposite side surface to the joining layer 3. The second joining layer is a layer configured to join the stacked body and another member. Examples of the other member may include a display panel in the display device described below. Also, the second joining layer is usually placed on the outermost surface of the stacked body.

Incidentally, in the present specification, for the convenience of explanation, a joining layer placed between the glass substrate and the substrate layer is simply referred to as a "joining layer", and a joining layer placed on the glass substrate, on the opposite side surface to the joining layer is referred to as a "second joining layer".

Here, a bending fracture is one of the impact fractures of a glass substrate. The bending fracture is a phenomenon in which the glass substrate is deflected by an impact imparted to the glass substrate, and the glass substrate is cracked when the deflection reaches its limit. When an instant impact is applied locally to the surface of the glass substrate, the glass substrate is deformed instantaneously and locally, an instat and local tensile stress occurs on the rear surface of the glass substrate so that a crack or a fracture occurs on the rear surface of the glass substrate, not being able to withstand to the tensile stress.

The inventors of the present disclosure have carried out intensive studies about the impact resistance and bending resistance of a stacked body comprising a glass substrate, a joining layer, and a hard coating film, in this order, when the stacked body further includes a second joining layer on the glass substrate, on the opposite surface side to the joining layer. Since the second joining layer is usually softer than the glass substrate, the substrate layer and the hard coating layer, it is more easily deformed by an impact. Therefore, instantaneous and local deformation of the glass substrate is believed to be more easily induced when an impact is applied to the stacked body, if the degree of deformation of the second joining layer high. In this case, there is a threat of easy occurrence of bending fracture in the glass substrate so that the impact resistance may be deteriorated. And it was found out that, when the stacked body further includes a second joining layer on the glass substrate, on the opposite surface side to the joining layer, the impact resistance varies greatly depending on the hardness, thickness and so on of the second joining layer. Further, it was found out that, even when the stacked body further includes a second joining layer on the glass substrate, on the opposite surface side to the joining layer, bending fracture of the glass substrate may be suppressed, and good bending resistance may be obtained without deteriorating the impact resistance, when the ratio of the storage elastic modulus (MPa) of the second joining layer at 20° C. with respect to the thickness of the second joining layer (μm) is in a predetermined range.

That is, the ratio of the storage elastic modulus (MPa) of the second joining layer at 20° C. with respect to the thickness of the second joining layer (μm) is preferably, for example, 0.001 or more and 0.4 or less, more preferably 0.002 or more and 0.35 or less, further preferably 0.003 or more and 0.3 or less, particularly preferably 0.004 or more and 0.2 or less. As described above, since the second joining layer is usually softer than the glass substrate as well as the substrate layer and the hard coating layer of the hard coating film, it is more easily deformed by an impact, and the thicker the thickness of the second joining layer, the greater the degree of deformation due to an impact tends to be. Therefore, when the ratio of the storage elastic modulus with respect to the thickness of the second joining layer is too low, the thickness of the second joining layer will be relatively thicker and the impact resistance may be deteriorated. Also, when the ratio of the storage elastic modulus with respect to the thickness of the second joining layer increases, the effect of improving the impact resistance is saturated. Further, when the ratio of the storage elastic modulus with respect to the thickness of the second joining layer is too high, the thickness of the second joining layer will be relatively low, or the storage elastic modulus of the second joining layer will be relatively high, so that the bending resistance may be deteriorated.

As described above, when a heat-sensitive adhesive or a curable type adhesive is used for the joining layer, and further, when a heat sealant, an ultraviolet ray curable type adhesive or a thermally curable type adhesive is used, in particular, when a heat sealant is used, the glass transition temperature and composite elastic modulus of the joining layer may be easily adjusted to the preferable range to improve the impact resistance. Therefore, in such cases, when further placing the second joining layer, the ratio of the storage elastic modulus with respect to the thickness of the second joining layer is preferably in the above range so that the impact resistance is not deteriorated.

The thickness of the second joining layer is not particularly limited as long as it satisfies the ratio of the storage elastic modulus with respect to the thickness of the second joining layer described above, and is preferably, for example, 5 μm or more and 100 μm or less, more preferably 10 μm or more and 50 μm or less, and further preferably 15 μm or more and 50 μm or less. When the thickness of the second joining layer is the predetermined value or more, the adhesiveness is good. Among them, when the thickness of the second joining layer is 15 μm or more, since the adhesiveness is good, the bending resistance, particularly dynamic bending property may be improved. Also, as described above, since the second joining layer is usually softer than the glass substrate as well as the substrate layer and the hard coating layer of the hard coating film, it is more easily deformed by an impact, and the thicker the thickness of the second joining layer, the greater the degree of deformation due to an impact tends to be. Therefore, when the thickness of the second joining layer is the predetermined value or less, the deterioration of the impact resistance due to the second joining layer may be suppressed. Among them, when the thickness of the second joining layer is 50 μm or less, good impact resistance may be obtained.

The storage elastic modulus of the second joining layer at 20° C. is not particularly limited as long as it satisfies the ratio of the ratio of the storage elastic modulus with respect to the thickness of the second joining layer described above, and is preferably, for example, 0.10 MPa or more and 10 MPa or less, more preferably 0.10 MPa or more and 5 MPa or less, and further preferably 0.10 MPa or more and 3 MPa or less. When the storage elastic modulus of the second joining layer is the predetermined value or more, and has a certain level of hardness, good impact resistance may be maintained. Also, by setting the storage elastic modulus of the second joining layer the predetermined value or less, the bending resistance, particularly dynamic bending property may be improved.

Here, the storage elastic modulus E' of the second joining layer at 20° C. is the value measured by the dynamic mechanical analyzing device (DMA). When measuring the storage elastic modulus E' of the second joining layer by the dynamic mechanical analyzing device (DMA), a test piece of the second joining layer is obtained by firstly preparing a solution by dissolving the material of the second joining layer or melting the material of the second joining layer; coating a substrate with the solution; drying; and then, peeling the film from the substrate. The solvent is appropriately selected according to the material of the second joining layer, and examples thereof may include ethyl acetate. For example, a Naflon (registered trademark) sheet from Nichias Corporation (300 mm×300 mm×1 mm thickness) may be used as the substrate. The second joining layer is then made into a cylindrical shape of approximately φ5 mm×5 mm in height by winding thereof. The cylindrical measurement sample is installed between the compression jigs (parallel plate p 8 mm) of the dynamic mechanical analyzing device. Then, the dynamic mechanical analysis is carried out in the range of −50° C. or more and 200° C. or less, applying a compressive load and a longitudinal vibration at frequency of 1 Hz, and a storage elastic modulus E' of the second joining layer at respective temperatures is measured. For example, RSA III from TA Instruments may be used as a dynamic mechanical analyzing device. Incidentally, the specific measurement conditions in the above method are shown below.

(Measurement Conditions of Storage Elastic Modulus E')

Measurement sample: cylindrical shape of ϕ5 mm×height 5 mm

Measuring jig: compression (parallel plate)

Measurement mode: temperature dependence (temperature range: −50° C. to 200° C., temperature rising rate: 5° C./min)

Frequency: 1 Hz

The storage elastic modulus of the second joining layer may be adjusted by, for example, the type, composition and so on of the material included in the second joining layer.

Also, as described later, when an optical clear adhesive is used for the second joining layer, a known method for adjusting an elastic modulus may be used to adjust the storage elastic modulus of the adhesive; and for example, the elastic modulus may be adjusted by a cross-linking density, a type of a functional group-including monomer and so on. For example, the storage elastic modulus tends to increase as the cross-linking density increases.

Also, the glass transition temperature of the second joining layer is preferably, for example, −50° C. or more and 30° C. or less, more preferably −50° C. or more and 25° C. or less, further preferably −50° C. or more and 0° C. or less, particularly preferably −45° C. or more and −5° C. or less, and most preferably −40° C. or more and −5° C. or less. When the glass transition temperature of the second junction layer is in the above range, it is easier to obtain the second junction layer satisfying the storage elastic modulus described above. Also, when the glass transition temperature of the second joining layer is −40° C. or more, the bending property at low temperature may be improved. Also, when the glass transition temperature of the second joining layer is 25° C. or less, the bending property at ordinary temperature may be improved.

Incidentally, the method for measuring the glass transition temperature of the second joining layer may be similar to the method for measuring the glass transition temperature of the joining layer described above.

Also, when the thickness (μm) of the second joining layer is $T_1$, the storage elastic modulus (MPa) of the second joining layer at 20° C. is $E'_1$, and the thickness (μm) of the glass substrate is $T_2$, the following formula (4) is preferably satisfied.

$$T_2 \times E'_1 / T_1 \geq 0.1 \tag{4}$$

When the above formula (4) is satisfied, for example, even when the thickness of the glass substrate is relatively thin, the storage elastic modulus of the second joining layer is high; and when the second joining layer has hardness to an extent, good impact resistance may be obtained. The left member of the formula (4) is preferably 0.1 or more and 30 or less.

When the stacked body in the present embodiment is used for, for example, a display device, the second joining layer preferably has transparency. Specifically, the total light transmittance of the second joining layer is preferably 80% or more, more preferably 85% or more, and further preferably 88% or more.

Also, the haze of the second joining layer is preferably, for example, 2% or less, more preferably 1.5% or less, and further preferably 1% or less.

The material used for the second joining layer is preferably material satisfying the ratio of the storage elastic modulus with respect to the thickness of the second joining layer described above, and examples thereof may include optical clear adhesives (OCA).

Examples of the optical clear adhesive may include acrylic based adhesives, urethane based adhesives, silicone based adhesives, epoxy based adhesives, and vinyl acetate based adhesives. Among them, acrylic based adhesives are preferable in terms of bending resistance, adhesiveness and transparency. Commercial products may also be used as the optical clear adhesive.

Examples of a method for placing a second joining layer may include a method wherein a glass substrate is coated with an adhesive; and a method wherein, using a second joining layer in a film form, the second joining layer is adhered on the glass substrate.

7. Second Substrate Layer and Third Joining Layer

Figure 3:
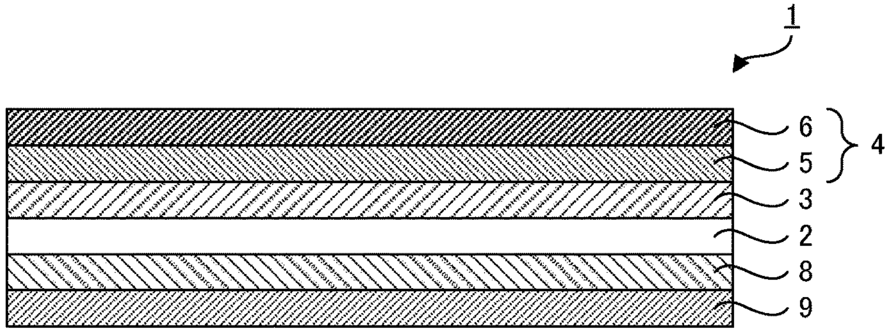
FIG. 3 is a schematic cross-sectional view illustrating an example of a stacked body in the present

For example, as shown in FIG. 3, in the stacked body in the present embodiment, a third joining layer 8 and a second substrate layer 9 may be placed on the glass substrate 2, on an opposite surface side to the joining layer 3, from the glass substrate 2 side.

Incidentally, in the present specification, for the convenience of explanation, a joining layer placed between the glass substrate and the substrate layer is simply referred to as a "joining layer", and a joining layer placed between the glass substrate and the second substrate layer is referred to as a "third joining layer". Also, the third joining layer is not included in the second joining layer described above.

By placing the third joining layer and the second substrate layer on the glass substrate, on an opposite surface side to the joining layer, from the glass substrate side, the impact resistance may be improved while maintaining good bending resistance. The reason therefore is presumed as follows.

The inventors of the present disclosure have carried out intensive studies about a crack and a fracture of a glass substrate due to an impact, and have newly found out that, when an instant impact is applied locally to the surface of the glass substrate, the glass substrate is deformed instantaneously and locally, an instant and local tensile stress occurs on the rear surface of the glass substrate so that a crack or a fracture occurs on the rear surface of the glass substrate, not being able to withstand to the tensile stress.

When the second substrate layer is placed on the glass substrate, on an opposite side surface to the joining layer (rear surface), via the third joining layer, an instantaneous and local deformation of the glass substrate due to an impact from the hard coating film side surface of the stacked body may be suppressed, and instantaneous and local tensile stress on the rear surface of the glass substrate may be suppressed. Therefore, the impact resistance may be improved.

(1) Second Substrate Layer

The second substrate layer in the present embodiment is placed on the glass substrate, on an opposite surface side to the joining layer, via the third joining layer, and is a layer configured to suppress an instantaneous and local deformation of the glass substrate due to an impact. When the stacked body in the present embodiment is placed, for example, on the observer side of the display panel of a display device, the stacked body is placed so that the second substrate layer side surface faces the display panel. Also, when the stacked body in the present embodiment is placed on the surface of a resin molded product, for example, the stacked body is placed so that the second substrate layer side surface faces the resin molded product.

In the present embodiment, the composite elastic modulus of the second substrate layer is preferably, for example, 7.0 GPa or more, more preferably 7.3 GPa or more, and further preferably 7.5 GPa or more. By setting the composite elastic modulus of the second substrate layer in the above range, the instantaneous and local deformation of the glass substrate due to an impact may be suppressed, a crack of the glass substrate due to an impact may be suppressed, and the impact resistance may be improved. Meanwhile, the composite elastic modulus of the second substrate layer is, for example, 100 GPa or less, may be 90 GPa or less, and may be 80 GPa or less. The composite elastic modulus of the second substrate layer is preferably, for example, 7.0 GPa or more and 100 GPa or less, more preferably 7.3 GPa or more and 90 GPa or less, and further preferably 7.5 GPa or more and 80 GPa or less.

Incidentally, the method for measuring the composite elastic modulus of the second substrate layer may be similar to the method for measuring the composite elastic modulus of the joining layer described above.

The composite elastic modulus of the second substrate layer may be adjusted by, for example, the type, composition and so on of the material included in the second substrate layer.

When the stacked body in the present embodiment is used for, for example, a display device, the second substrate layer preferably has transparency. Specifically, the total light transmittance of the second substrate layer is preferably 80% or more, more preferably 85% or more, and further preferably 88% or more.

Also, the haze of the second substrate layer is preferably, for example, 2% or less, more preferably 1.5% or less, and further preferably 1% or less.

The thickness of the second substrate layer is not particularly limited as long as it is a thickness capable of suppressing the instantaneous and local deformation of the glass substrate due to an impact, and is preferably, for example, 25 μm or more, more preferably 27 μm or more, and further preferably 29 μm or more. The thicker the thickness of the second substrate layer, the better the impact resistance may be improved. Meanwhile, the thickness of the second substrate layer is preferably the thickness of the glass substrate or less, and for example, preferably 100 μm or less, more preferably 90 μm or less, and further preferably 80 μm or less. When the thickness of the second substrate layer is too thick, the bending resistance may be deteriorated. When the thickness of the second substrate layer is in the above range, impact resistance may be increased while maintaining bending resistance. The thickness of the second substrate layer is preferably, for example, 25 μm or more and 100 μm or less, more preferably 27 μm or more and 90 μm or less, and further preferably 29 μm or more and 80 μm or less.

The second substrate layer is not particularly limited as long as it satisfies the composite elastic modulus described above; and examples thereof may include a glass layer, and a resin layer including a polyimide based resins or aramid based resins. Among the above, the second substrate layer is preferably a glass layer. Since the glass layer usually has a higher composite elastic modulus than the resin layer, the impact resistance may be improved.

When the second substrate layer is a glass layer, the glass that constitutes the glass layer may be similar to the glass that constitutes the glass substrate described above.

Also, when the second substrate layer is a resin layer, examples of the resin included in the resin layer may include polyimide based resins and aramid based resins.

The polyimide based resin is not particularly limited as long as it satisfies the composite elastic modulus described above, and examples thereof may include polyimide and polyamideimide. When the substrate layer is a resin substrate, the polyimide and polyamideimide may be similar to the polyimide and polyamideimide included in the resin substrate.

The aramid resin is not particularly limited as long as it satisfies the composite elastic modulus described above.

The resin layer may further include an additive if necessary. Examples of the additives may include, ultraviolet absorbers, a light stabilizer, antioxidants, inorganic particles, silica fillers for facilitating winding, a surfactant for improving film forming property and antifoaming property, and an adhesive improving agent.

Examples of a method for placing a second substrate layer may include a method wherein the second substrate layer is adhered on the glass substrate, on an opposite surface side to the joining layer, via a third joining layer.

(2) Third Joining Layer

The third joining layer in the present embodiment is placed between the glass substrate and the second substrate layer, and is a layer configured to join the glass substrate and the second substrate layer.

the thickness of the third joining layer is preferably less than the thickness of the glass substrate, and for example, preferably less than 100 μm, more preferably 50 μm or less, and further preferably 25 μm or less. When the thickness of the third joining layer is too thick, the bending resistance may be deteriorated. Also, since the third joining layer is usually softer than the glass substrate and the second substrate layer, it is more easily deformed by an impact, and the thicker the thickness of the third joining layer, the greater the degree of deformation due to an impact tends to be. Therefore, when the thickness of the third joining layer is too thick, instantaneous and local deformation of the glass substrate is believed to be more easily induced when an impact is applied to the stacked body, since the degree of deformation of the third joining layer increases. In this case, a crack or a fracture may be easily induced to the glass substrate so that the impact resistance may be reduced. Meanwhile, the thickness of the third joining layer is preferably, for example 0.5 μm or more, more preferably 1 μm or more, and further preferably 5 μm or more. When the thickness of the third joining layer is too thin, the adhesiveness may be reduced so as to be peeled off. The thickness of the third joining layer is for example, 0.5 μm or more and less than 1000 μm, more preferably 1 μm or more and 50 μm or less, and further preferably 5 μm or more and 25 μm or less.

The composite elastic modulus of the third joining layer is preferably, for example 1.0 MPa or more, more preferably 2.0 MPa or more, and further preferably 3.0 MPa or more. When the composite elastic modulus of the third joining layer is in the above range and has a certain level of hardness, the impact resistance may be improved. Also, since the third joining layer is usually softer than the glass substrate and the second substrate layer as described above, it is more easily deformed by an impact, and the lower the composite elastic modulus of the third joining layer, the greater the degree of deformation due to an impact tends to be. Therefore, when the composite elastic modulus of the third joining layer is too low, instantaneous and local deformation of the glass substrate is believed to be more easily induced when an impact is applied to the stacked body, since the degree of deformation of the third joining layer increases. In this case, a crack or a fracture may be easily induced to the glass substrate so that the impact resistance may be reduced. Meanwhile, the composite elastic modulus of the third joining layer is preferably, for example, 1.9 GPa or less, more preferably 1.8 GPa or less, and further preferably 1.5 GPa or less. When the composite elastic modulus of the third joining layer is in the above range, since it is softer than the glass substrate and the second substrate layer, an impact may be absorbed so that the impact resistance may be improved. Also, when the composite elastic modulus of the third joining layer is too high, the bending resistance may be deteriorated. The composite elastic modulus of the third joining layer is preferably, for example 1.0 MPa or more and 1.9 GPa or less, more preferably 2.0 MPa or more and 1.8 GPa or less, and further preferably 3.0 MPa or more and 1.5 GPa or less.

The method for measuring the composite elastic modulus of the third joining layer may be similar to the method for measuring the composite elastic modulus of the joining layer described above.

The composite elastic modulus of the third joining layer may be adjusted by, for example, the type and so on of the material included in the joining layer.

Also, as described later, when an optical clear adhesive is used for the third joining layer, a known method for adjusting an elastic modulus may be used to adjust the composite elastic modulus of the adhesive; and for example, the elastic modulus may be adjusted by a cross-linking density, a type of a functional group-including monomer and so on. For example, the composite elastic modulus tends to increase as the cross-linking density increases.

When the stacked body in the present embodiment is used for, for example, a display device, the third joining layer preferably has transparency. Specifically, the total light transmittance of the third joining layer is preferably 80% or more, more preferably 85% or more, and further preferably 88% or more.

Also, the haze of the third joining layer is preferably, for example, 2% or less, more preferably 1.5% or less, and further preferably 1% or less.

The material used for the third joining layer is not particularly limited as long as it is a material capable of joining the glass substrates and the second substrate layer, and it is preferably a material satisfying the composite elastic modulus and transparency described above, and examples thereof may include optical clear adhesives (OCA) and curable type adhesives.

Examples of the optical clear adhesive may include acrylic based adhesives, urethane based adhesives, silicone based adhesives, epoxy based adhesives, and vinyl acetate based adhesives. Among them, acrylic based adhesives are preferable in terms of bending resistance, adhesiveness and transparency.

Particularly, the optical clear adhesive is preferably one satisfying the composite elastic modulus described above. Commercial products may be used as such optical clear adhesive. Specifically, examples thereof may include "8146-2" from 3M Japan Limited, and "MO-3018 C", "F619", and "N632" from LINTEC Corporation.

The curable type adhesive may be similar to the curable type adhesive used for the joining layer described above.

8. Protection Film

In the stacked body in the present embodiment, a protection film may be placed on the hard coating film, on an opposite surface side to the joining layer. The protection film may protect the stacked body, as well as increase the impact resistance.

In the present embodiment, as described above, since the ratio (A+B)/C of the thickness A of the hard coating layer, thickness B of the substrate layer, and thickness C of the joining layer is a predetermined value or more, the surface hardness of the hard coating film side surface of the stacked body may be increased, and the scratch resistance may be improved. When the protection film is placed, although a scratch or a dent may occur on the protection film itself, since the surface hardness of the hard coating film is high, good scratch resistance may be obtained.

Meanwhile, when the ratio (A+B)/C of the thickness is less than the predetermined value, a scratch or a dent may occur in the hard coating film, even when the protection film is placed.

9. Properties of Stacked Body

When the stacked body in the present embodiment is used for a display device, it preferably has transparency. Specifically, the total light transmittance of the stacked body in the present embodiment is preferably, for example, 80% or more, more preferably 85% or more, and further preferably 88% or more. When the total light transmittance is high as described above, the stacked body may have good transparency.

Here, the total light transmittance of the stacked body may be measured according to JIS K7361-1, and may be measure with, for example, a haze meter HM150 from Murakami Color Research Laboratory Co., Ltd.

The haze of the stacked body in the present embodiment is preferably, for example, 2% or less, more preferably 1.5% or less, and further preferably 1% or less. When the haze is low as described above, the stacked body may have good transparency.

Here, the haze of the stacked body may be measured according to JIS K-7136, and may be measure with, for example, a haze meter HM150 from Murakami Color Research Laboratory Co., Ltd.

The stacked body in the present embodiment preferably has a bending resistance. Specifically, in the stacked body in the present embodiment, when the dynamic bending test described below is carried out to the stacked body, it is preferable that a crack, a fracture or a peel does not occur in the stacked body.

In the dynamic bending test, the stacked body may be folded so that the glass substrate is on the outer side, or the stacked body may be folded so that the glass substrate is on the inner side; and in either of these cases, it is preferable that a crack, a fracture or a peel does not occur in the stacked body.

The dynamic bending test is carried out as follows. Firstly, in the dynamic bending test, as shown in FIG. 5A, short side portion 1C and short side portion 1D opposing to the short side portion 1C, of the stacked body 1 of a size of 20 mm×100 mm, are respectively fixed by parallelly arranged fixing portions 21. Also, as shown in FIG. 5A, the fixing portions 21 are movable by sliding in horizontal direction. Then, as shown in FIG. 5B, by moving the fixing portions 21 so as to be closer to each other, the stacked body 1 was deformed so as to be folded. Further, as shown in FIG. 5C, after moving the fixing portions 21 to the position wherein distance "d" between the two opposing short side portions 1C and 1D of the stacked body 1 fixed by the fixing portions 21 was a predetermined value, the deformation of the stacked body 1 was dissolved by moving the fixing portions 21 in opposite directions. As shown in FIGS. 5A to 5C, by moving the fixing portions 21, the stacked body 1 may be folded into 180°. Also, by carrying out the dynamic bending test so that bent portion 1E of the stacked body 1 does not protrude from the lower end edge of the fixing portions 21, and by controlling the distance "d" when the fixing portions 21 are the closest, distance "d" between the two opposing short side portions 1C and 1D of the stacked body 1 may be a predetermined value. For example, when the distance "d" between the two opposing short side portions 1C and 1D is 10 mm, the outer diameter of the bent portion 1E is regarded as 10 mm.

It is preferable that a crack, a fracture or a peel does not occur when a test wherein the stacked body is folded into 1800 so that the distance "d" between the opposing short side portions 1C and 1D of the stacked body 1 is 10 mm, is carried out repeatedly for 200,000 times; among the above, it is preferable that a crack, a fracture or a peel does not occur when a test wherein the stacked body is folded into 1800 so that the distance "d" between the opposing short side portions 1C and 1D of the stacked body 1 is 8 mm, is carried out repeatedly for 200,000 times.

Here, in the dynamic bending test, "crack" refers to a phenomenon wherein a cleavage occurs in the stacked body. Also, "fracture" refers to a phenomenon wherein the stacked body is completely split into two pieces. Also, "peel" refers to a phenomenon wherein one of the layers constituting the stacked body is peeled off or floats.

Also, in the stacked body in the present embodiment, when the static bending test described below is carried out to the stacked body, the opening angle θ after the static bending test in the stacked body is preferably 1000 or more, and more preferably 1300 or more.

The static bending test is carried out as follows. Firstly, as shown in FIG. 6A, short side portion 1C and short side portion 1D opposing to the short side portion 1C of the stacked body 1, of the stacked body 1 of a size of 20 mm×100 mm, are respectively fixed by parallelly arranged fixing portions 22 so that distance "d" between the short side portion 1C and short side portion 1D is 10 mm. Then, a static bending test wherein the stacked body 1 is left to stand at 23° C. for 240 hours under a folded condition, is carried out. Then, as shown in FIG. 6B, by taking the fixing portion 22 off from the short side portion 1D after the static bending test, the folded condition is dissolved, and after 30 minutes at room temperature, the opening angle θ, an angle that the stacked body 1 opens naturally, is measured. Incidentally, the larger the opening angle θ is, the higher the restorability is, and is 1800 at a maximum.

In the static bending test, the stacked body may be folded so that the glass substrate is on the inner side, or the stacked body may be folded so that the glass substrate is on the outer side; and in either of these cases, the opening angle θ is preferably 1000 or more, and more preferably 1300 or more.

In the stacked body in the present embodiment, when the impaling test described below is carried out to the stacked body, the impaling fracture force is, for example, preferably 16 N or more, more preferably 19 N or more, and further preferably 25 N or more. When the impaling fracture force is in the above range, the impact resistance is good.

The impaling test is carried out as follows. Firstly, a stacked body for a test is produced by adhering a PET film ("A4160 (current part number)" ("A4100 (old part number) ", composite elastic modulus of 6.9 GPa) from Toyobo Co., Ltd.) with a thickness of 100 μm to the glass substrate side surface of the stacked body, via an optical clear adhesive film (OCA) with a thickness of 50 μm ("8146-2" from 3M Japan Limited, composite elastic modulus of 9.6 MPa). Then, using a Tensilon Universal Material Testing Instrument (RTC-1310A) from A & D Company Limited, an impaling test is carried on the stacked body for a test, from the hard coating film side surface of the stacked body for a test toward the PET film side surface, under the following conditions: curvature radius of the needle tip of 0.5 mm and impaling speed of 50 mm/min. At this time, the measurement is carried out assuming the stroke and load on the surface of the stacked body for a test to be zero. Then, the maximum stress at the time when the glass substrate cracked is regarded as the impaling fracture force.

10. Use Application of Stacked Body

The use application of the stacked body in the present embodiment is not particularly limited, and for example, it may be used as a member placed on the observer side than the display panel in a display device. The stacked body in the present embodiment may be used for a display device such as smart phones, tablet terminals, wearable terminals, personal computers, televisions, digital signages, public information displays (PIDs), and car mounted displays.

Among them, since the stacked body in the present embodiment has good bending and impact resistance, it may be preferably used as a member adaptable to a curved surface. The stacked body in the present disclosure may be preferably used for a flexible display such as a foldable display, a rollable display, a bendable display and a slidable display, and more preferably used for a foldable display. Also, the stacked body in the present embodiment may also be used as a surface material for a resin molded product with a curved surface, for example, to impart a design and a sense of beauty.

When placed on the surface of a display device or a resin molded product, the stacked body in the present embodiment is placed so that the glass substrate side surface is on the inner side and the hard coating film side surface is on the outer side.

The method for placing the stacked body in the present embodiment on the surface of a display device or a resin molded product is not particularly limited, and examples thereof may include a method via an adhesive layer. As an adhesive layer, a known adhesive layer used for adhering a stacked body may be used.

II. Second Embodiment

The inventors of the present disclosure have carried out intensive studies about a stacked body including a glass substrate, and found out that a crack of the glass substrate may be suppressed and the impact resistance may be increased by placing a resin layer on the surface of a thin glass substrate, and further making the thickness of the resin layer thick. However, it was found out that, when a resin composition is applied to the surface of a glass substrate to form a relatively thick resin layer, the influence of the shrinkage difference between the glass substrate and the resin layer increases during heating or curing after the resin composition is applied, and a curl may occur. Also, the inventors of the present disclosure have further studied and found out that a curl may be suppressed and further, the impact resistance may be increased by making the resin layer into a film previously, and adhering the resin film to the surface of the thin glass substrate via a joining layer.

By the way, in order to join the stacked body to another member, in the stacked body, a second joining layer may be placed on the glass substrate, on the opposite surface side to the joining layer. The inventors of the present disclosure have carried out further studies about a stacked body including a second joining layer, a glass substrate, a joining layer, and a resin film, in this order. And they have found that, in such a stacked body, the impact resistance may be decreased, depending on the type of the second junction layer.

The present embodiment has been made in view of the above circumstances, and an object of the present embodiment is to provide a stacked body capable of exhibiting both of bending resistance and impact resistance.

The second embodiment of the stacked body in the present disclosure is a stacked body comprising: a hard coating layer; a substrate layer; a joining layer; a glass substrate; and a second joining layer, in this order, wherein the joining layer is a layer configured to join the glass substrate and the substrate layer; the second joining layer is a layer configured to join the stacked body and another member; a thickness of the glass substrate is 10 μm or more and 100 μm or less; and the stacked body satisfies the following formula (1).

$$0.001 \leq \{(E_1 \times D_1^2 + E_2 \times D_2^2 + E_3 \times D_3^2) \times E_4 \times D_4^2 \times E_5 \times 1000\}/D_5 \leq 3.0 \quad (1)$$

(In the formula (1), $E_1$ is a composite elastic modulus (GPa) of the hard coating layer, $D_1$ is a thickness (mm) of the hard coating layer, $E_2$ is a composite elastic modulus (GPa) of the substrate layer, $D_2$ is a thickness (mm) of the substrate layer, $E_3$ is a composite elastic modulus (GPa) of the joining layer, $D_3$ is a thickness (mm) of the joining layer, $E_4$ is a composite elastic modulus (GPa) of the glass substrate, $D_4$ is a thickness (mm) of the glass substrate, $E_5$ is a storage elastic modulus (GPa) of the second joining layer, and $D_5$ is a thickness (mm) of the second joining layer.)

FIG. 7 is a schematic cross-sectional view illustrating an example of a stacked body in the present embodiment. As shown in FIG. 7, a stacked body 1 comprises a hard coating layer 6, a substrate layer 5, a joining layer 3, a glass substrate 2, and a second joining layer 10, in this order. The glass substrate 2 has a predetermined thickness. Also, the composite elastic modulus $E_1$ and the thickness $D_1$ of the hard coating layer 6; the composite elastic modulus $E_2$ and the thickness $D_2$ of the substrate layer 5; the composite elastic modulus $E_3$ and the thickness $D_3$ the joining layer 3; the composite elastic modulus $E_4$ and the thickness $D_4$ the glass substrate 2; the storage elastic modulus $E_5$ and the thickness $D_5$ of the second joining layer 10 satisfy the above formula (1).

In the stacked body in the present embodiment, since the thickness of the glass substrate is thin as to be a predetermined value or less, bending resistance may be improved. Meanwhile, since the glass substrate is thin as to be a predetermined value or less, it is prone to crack and low impact resistance is concerned. On the other hand, in the present embodiment, since the hard coating layer, substrate layer, joining layer, glass substrate, and second joining layer are placed in this order, and since the elastic modulus and the thickness of each layer satisfy the formula (1), the impact resistance may be improved while maintaining good bending resistance. The reason therefore is presumed as follows.

Here, the impact fracture of glass may be roughly classified into two types. The first is bending fracture. The second is Hertz fracture. The Hertz fracture is also referred to as a concentrated stress fracture. The bending fracture occurs on the opposite side surface to the impact surface of the glass. Meanwhile, the Hertz fracture occurs on the impact surface of the glass.

The inventors of the present disclosure have carried out intensive studies about the impact resistance and bending resistance of a stacked body comprising a hard coating layer, a substrate layer, a joining layer, a glass substrate, and a second joining layer, in this order. Since the second joining layer is usually softer than the glass substrate, the substrate layer and the hard coating layer, it is more easily deformed by an impact. Therefore, instantaneous and local deformation of the glass substrate is believed to be more easily induced when an impact is applied to the stacked body, if the degree of deformation of the second joining layer high. In this case, there is a threat of easy occurrence of bending fracture in the glass substrate. On the other hand, when the thickness of the second joining layer is relatively thin, the bending fracture of the glass substrate may be suppressed. Also, the bending fracture of the glass substrate may be suppressed even when the hardness of the second joining layer is relatively high. However, even when the bending fracture of the glass substrate may be suppressed by reducing the relative thickness of the second joining layer and by increasing the relative hardness of the second joining layer, the Hertz fracture of the glass substrate cannot be suppressed. In order to suppress the Hertz fracture of the glass substrate, it is preferable to increase the relative thickness of the hard coating layer, the substrate layer, and the joining layer; and to increase the relative hardness of the hard coating layer, the substrate layer, and the joining layer. Also, with respect to impact fracture of the glass substrate, the thickness of the glass substrate has the greatest influence, among the thickness of each layer. However, even when the Hertz fracture of the glass substrate may be suppressed by increasing the relative thickness of the hard coating layer, the substrate layer, and the joining layer, and by increasing the relative hardness of the hard coating layer, the substrate layer, and the joining layer, the bending resistance may be deteriorated. Also, even when the impact fracture of the glass substrate may be suppressed by increasing the thickness of the glass substrate, the bending resistance may be deteriorated. Based on the influences of the thickness and hardness of each layer on impact resistance and bending resistance; and on the experimental results described in the Examples and Comparative Examples described below, the above formula (1), showing the correlation between the thickness and elastic modulus of each layer and the impact resistance and bending resistance, was derived.

When the middle member value of the formula (1) is too low, the thickness of the second joining layer will be relatively high, or the storage elastic modulus of the second joining layer will be relatively low. Therefore, the bending fracture may be easily induced to the glass substrate so that the impact resistance may be deteriorated. Also, when the middle member value of the formula (1) is too high, the thickness of the glass substrate, the hard coating layer, the substrate layer, and the joining layer will be relatively high, and the composite elastic modulus of the hard coating layer, the substrate layer, and the joining layer will be relatively high. Therefore, the bending resistance may be deteriorated. Therefore, in the present embodiment, since the elastic modulus and the thickness of each layer satisfy the formula (1), the impact resistance may be improved while maintaining good bending resistance.

As described above, in the present embodiment, the impact resistance may be improved while maintaining good bending resistance. Also, even when the glass substrate in the stacked body is damaged, the risk of injury to the human body may be reduced, making it a highly safe stacked body. Therefore, the stacked body in the present embodiment may be folded and used for a wide variety of applications. The stacked body in the present embodiment may be used for a wide variety of display devices, for example, and specifically, it may be used as a member for a foldable display.

The stacked body in the present embodiment satisfies the following formula (1).

$$0.001 \leq \{(E_1 \times D_1^2 + E_2 \times D_2^2 + E_3 \times D_3^2) \times E_4 \times D_4^2 \times E_5 \times 1000\}/D_5 \leq 3.0 \quad (1)$$

(In the formula (1), $E_1$ is a composite elastic modulus (GPa) of the hard coating layer, $D_1$ is a thickness (mm) of the hard coating layer, $E_2$ is a composite elastic modulus (GPa) of the substrate layer, $D_2$ is a thickness (mm) of the substrate layer, $E_3$ is a composite elastic modulus (GPa) of the joining layer, $D_3$ is a thickness (mm) of the joining layer, $E_4$ is a composite elastic modulus (GPa) of the glass substrate, $D_4$ is a thickness (mm) of the glass substrate, $E_5$ is a storage elastic modulus (GPa) of the second joining layer, and $D_5$ is a thickness (mm) of the second joining layer.)

The middle member value of the formula (1) is 0.001 or more and 3 or less, preferably 0.0015 or more and 1.5 or less, more preferably 0.003 or more and 1 or less, further preferably 0.005 or more and 0.7 or less, and particularly preferably 0.01 or more and 0.4 or less. As described above, when the middle member value of the formula (1) is too low, the thickness of the second joining layer will be relatively high, or the storage elastic modulus of the second joining layer will be relatively low. Therefore, the bending fracture may be easily induced to the glass substrate so that the impact resistance may be deteriorated. Also, when the middle member value of the formula (1) is too high, the thickness of the glass substrate, the hard coating layer, the substrate layer, and the joining layer will be relatively high, and the composite elastic modulus of the hard coating layer, the substrate layer, and the joining layer will be relatively high. Therefore, the bending resistance may be deteriorated.

Also, as described above, even when the bending fracture of the glass substrate may be suppressed by reducing the relative thickness of the second joining layer and by increasing the relative hardness of the second joining layer, the Hertz fracture of the glass substrate cannot be suppressed. Therefore, when the middle member value of the formula (1) is a predetermined value or more, the effect of suppressing bending fracture of the glass substrate is saturated. Therefore, the middle member value of the formula (1) is preferably 0.4 or less.

The thickness of the hard coating layer, the thickness of the substrate layer, the thickness of the joining layer, the thickness of the glass substrate, and the thickness of the second joining layer are similar to the thickness of each layer in the stacked body of the first embodiment.

The composite elastic modulus of the hard coating layer is preferably, for example, 4 GPa or more and 10 GPa or less, more preferably 5 GPa or more and 9 GPa or less, and further preferably 6 GPa or more and 8 GPa or less. When the composite elastic modulus of the hard coating layer is too low, sufficient scratch resistance may not be obtained. Also, when the composite elastic modulus of the hard coating layer is too high, the hardness may be too high to bend, resulting in reduced bending resistance, especially dynamic bending property.

The method for measuring the composite elastic modulus of the hard coating layer may be similar to the method for measuring the composite elastic modulus of the joining layer in the first embodiment.

The composite elastic modulus of the hard coating layer may be adjusted by, for example, the type, composition and so on of the material included in the hard coating layer.

The composite elastic modulus of the substrate layer is similar to the composite elastic modulus of the substrate layer in the first embodiment.

The composite elastic modulus of the joining layer is similar to the composite elastic modulus of the joining layer in the first embodiment.

The composite elastic modulus of the substrate layer is preferably, for example, 40 GPa or more and 100 GPa or less, more preferably 50 GPa or more and 90 GPa or less, and further preferably 60 GPa or more and 80 GPa or less.

The storage elastic modulus of the second joining layer is the storage elastic modulus at 20° C. The storage elastic modulus of the second joining layer is similar to the storage elastic modulus of the second joining layer in the first embodiment.

The hard coating layer, the substrate layer, the joining layer, the glass substrate, and the second joining layer in the present embodiment are similar to each layer in the first embodiment.

The stacked body in the present embodiment may further include a functional layer on the hard coating layer, on the opposite surface side to the substrate layer; between the hard coating layer and the substrate layer; between the substrate layer and the joining layer; between the glass substrate and the joining layer; or between the glass substrate and the second joining layer. The functional layer is similar to the functional layer in the first embodiment.

In the stacked body in the present embodiment, a protection film may be placed on the hard coating layer, on an opposite surface side to the substrate layer. The protection film is similar to the protection film in the first embodiment.

The properties and use applications of the stacked body in the present embodiment are similar to the properties and use application of the stacked body in the first embodiment.

III. Third Embodiment

Similar to the second embodiment, an object of the present embodiment is to provide a stacked body capable of exhibiting both of bending resistance and impact resistance.

The third embodiment of the stacked body in the present disclosure is a stacked body comprising: a substrate layer; a joining layer; a glass substrate; and a second joining layer, in this order, wherein the joining layer is a layer configured to join the glass substrate and the substrate layer; the second joining layer is a layer configured to join the stacked body and another member; a thickness of the glass substrate is 10 μm or more and 100 μm or less; and the stacked body satisfies the following formula (2).

$$0.001 \leq \{(E_2 \times D_2^2 + E_3 \times D_3^2) \times E_4 \times D_4^2 \times E_5 \times 1000\}/D_5 \leq 3.0 \qquad (2)$$

(In the formula (2), $E_2$ is a composite elastic modulus (GPa) of the substrate layer, $D_2$ is a thickness (mm) of the substrate layer, $E_3$ is a composite elastic modulus (GPa) of the joining layer, $D_3$ is a thickness (mm) of the joining layer, $E_4$ is a composite elastic modulus (GPa) of the glass substrate, $D_4$ is a thickness (mm) of the glass substrate, $E_5$ is a storage elastic modulus (GPa) of the second joining layer, and $D_5$ is a thickness (mm) of the second joining layer.)

FIG. 8 is a schematic cross-sectional view illustrating an example of a stacked body in the present embodiment. As shown in FIG. 7, a stacked body 1 comprises a substrate layer 5, a joining layer 3, a glass substrate 2, and a second joining layer 10, in this order. The glass substrate 2 has a predetermined thickness. Also, the composite elastic modulus $E_2$ and the thickness $D_2$ of the substrate layer 5; the composite elastic modulus $E_3$ and the thickness $D_3$ the joining layer 3; the composite elastic modulus $E_4$ and the thickness $D_4$ the glass substrate 2; the storage elastic modulus $E_5$ and the thickness $D_5$ of the second joining layer 10 satisfy the above formula (2).

In the stacked body in the present embodiment, since the thickness of the glass substrate is thin as to be a predetermined value or less, bending resistance may be improved. Meanwhile, since the glass substrate is thin as to be a predetermined value or less, it is prone to crack and low impact resistance is concerned. On the other hand, in the present embodiment, since substrate layer, joining layer, glass substrate, and second joining layer are placed in this order, and since the elastic modulus and the thickness of each layer satisfy the formula (2), the impact resistance may be improved while maintaining good bending resistance. The reason therefore is presumed as follows.

The inventors of the present disclosure have carried out intensive studies about the impact resistance and bending resistance of a stacked body comprising a substrate layer, a joining layer, a glass substrate, and a second joining layer, in this order. Since the second joining layer is usually softer than the glass substrate and the substrate layer, it is more easily deformed by an impact. Therefore, instantaneous and local deformation of the glass substrate is believed to be more easily induced when an impact is applied to the stacked body, if the degree of deformation of the second joining layer high. In this case, there is a threat of easy occurrence of bending fracture in the glass substrate. On the other hand, when the thickness of the second joining layer is relatively thin, the bending fracture of the glass substrate may be suppressed. Also, the bending fracture of the glass substrate may be suppressed even when the hardness of the second joining layer is relatively high. However, even when the bending fracture of the glass substrate may be suppressed by reducing the relative thickness of the second joining layer and by increasing the relative hardness of the second joining layer, the Hertz fracture of the glass substrate cannot be suppressed. In order to suppress the hertz fracture of the glass substrate, it is preferable to increase the relative thickness of the substrate layer, and the joining layer; and to increase the relative hardness of the substrate layer and the joining layer. Also, with respect to impact fracture of the glass substrate, the thickness of the glass substrate has the greatest influence, among the thickness of each layer. However, even when the Hertz fracture of the glass substrate may be suppressed by increasing the relative thickness of the substrate layer, and the joining layer, and by increasing the relative hardness of the substrate layer, and the joining layer, the bending resistance may be deteriorated. Also, even when the impact fracture of the glass substrate may be suppressed by increasing the thickness of the glass substrate, the bending resistance may be deteriorated. Based on the influences of the thickness and hardness of each layer on impact resistance and bending resistance; and based on the experimental results described in the Examples and Comparative Examples described below, the above formula (2), showing the correlation between the thickness and elastic modulus of each layer and the impact resistance and bending resistance, was derived.

When the middle member value of the formula (2) is too low, the thickness of the second joining layer will be relatively high, or the storage elastic modulus of the second joining layer will be relatively low. Therefore, the bending fracture may be easily induced to the glass substrate so that the impact resistance may be deteriorated. Also, when the middle member value of the formula (2) is too high, the thickness of the glass substrate, the substrate layer, and the joining layer will be relatively high, or the composite elastic modulus of the substrate layer, and the joining layer will be relatively high. Therefore, the bending resistance may be deteriorated. Therefore, in the present embodiment, since the elastic modulus and the thickness of each layer satisfy the formula (2), the impact resistance may be improved while maintaining good bending resistance.

As described above, in the present embodiment, the impact resistance may be improved while maintaining good bending resistance. Also, even when the glass substrate in the stacked body is damaged, the risk of injury to the human body may be reduced, making it a highly safe stacked body. Therefore, the stacked body in the present embodiment may be folded and used for a wide variety of applications. The stacked body in the present embodiment may be used for a wide variety of display devices, for example, and specifically, it may be used as a member for a foldable display.

The stacked body in the present embodiment satisfies the following formula (2).

$$0.001 \leq \{(E_2 \times D_2^2 + E_3 \times D_3^2) \times E_4 \times D_4^2 \times E_5 \times 1000\}/D_5 \leq 3.0 \quad (2)$$

(In the formula (2), $E_2$ is a composite elastic modulus (GPa) of the substrate layer, $D_2$ is a thickness (mm) of the substrate layer, $E_3$ is a composite elastic modulus (GPa) of the joining layer, $D_3$ is a thickness (mm) of the joining layer, $E_4$ is a composite elastic modulus (GPa) of the glass substrate, $D_4$ is a thickness (mm) of the glass substrate, $E_5$ is a storage elastic modulus (GPa) of the second joining layer, and $D_5$ is a thickness (mm) of the second joining layer.)

The middle member value of the formula (2) is 0.001 or more and 3 or less, preferably 0.0015 or more and 1.5 or less, more preferably 0.003 or more and 1 or less, further preferably 0.005 or more and 0.7 or less, and particularly preferably 0.01 or more and 0.4 or less. As described above, when the middle member value of the formula (2) is too low, the thickness of the second joining layer will be relatively high, or the storage elastic modulus of the second joining layer will be relatively low. Therefore, the bending fracture may be easily induced to the glass substrate so that the impact resistance may be deteriorated. Also, when the middle member value of the formula (2) is too high, the thickness of the glass substrate, the substrate layer, and the joining layer will be relatively high, or the composite elastic modulus of the substrate layer, and the joining layer will be relatively high. Therefore, the bending resistance may be deteriorated.

Also, as described above, even when the bending fracture of the glass substrate may be suppressed by reducing the relative thickness of the second joining layer or by increasing the relative hardness of the second joining layer, the Hertz fracture of the glass substrate cannot be suppressed. Therefore, when the middle member value of the formula (2) is a predetermined value or more, the effect of suppressing bending fracture of the glass substrate is saturated. Therefore, the middle member value of the formula (2) is preferably 0.4 or less.

The thickness of the substrate layer, the thickness of the joining layer, the thickness of the glass substrate, and the thickness of the second joining layer are similar to the thickness of each layer in the stacked body of the first embodiment.

The composite elastic modulus of the substrate layer is similar to the composite elastic modulus of the substrate layer in the first embodiment.

The composite elastic modulus of the joining layer is similar to the composite elastic modulus of the joining layer in the first embodiment.

The composite elastic modulus of the glass substrate is similar to the composite elastic modulus of the glass substrate in the second embodiment.

The storage elastic modulus of the second joining layer is the storage elastic modulus at 20° C. The storage elastic modulus of the second joining layer is similar to the storage elastic modulus of the second joining layer in the first embodiment.

The substrate layer, the joining layer, the glass substrate, and the second joining layer in the present embodiment are similar to each layer in the first embodiment.

The stacked body in the present embodiment may further include a functional layer on the substrate layer, on the opposite surface side to the joining layer; between the substrate layer and the joining layer; between the glass substrate and the joining layer; or between the glass substrate and the second joining layer. The functional layer is similar to the functional layer in the first embodiment.

In the stacked body in the present embodiment, a protection film may be placed on the substrate layer, on an opposite surface side to the joining layer. The protection film is similar to the protection film in the first embodiment.

The properties and use applications of the stacked body in the present embodiment are similar to the properties and use application of the stacked body in the first embodiment.

B. Display Device

The display device in the present disclosure comprises: a display panel, and the stacked body described above placed on an observer side of the display panel, and the stacked body is placed so that the glass substrate side surface faces the display panel. That is, the display device in the present disclosure comprises: a display panel, and the stacked body described above placed on an observer side of the display panel, and the stacked body is placed so that the glass substrate side surface is adjacent to the display panel.

FIG. 9 is a schematic cross-sectional view illustrating an example of a display device in the present disclosure. As shown in FIG. 9, display device 30 comprises display panel 31, and the stacked body 1 placed on an observer side of the display panel 31. The stacked body is placed so that a glass substrate 2 side surface is adjacent to the display panel 31. In the display device 30, the stacked body 1 is used as a member to be placed on the surface of the display device 30, and an adhesive layer 32 is placed between the stacked body 1 and the display panel 31.

The stacked body in the present disclosure may be similar to the stacked body described above.

Examples of the display panel in the present disclosure may include a display panel used for a display device such as a liquid crystal display device, an organic EL display device, and a LED display device.

The display device in the present disclosure may include a touch-sensitive panel member between the display panel and the stacked body.

The display device in the present disclosure is preferably a flexible display. Among them, the display device in the present disclosure is preferably foldable. That is, the display device in the present disclosure is more preferably a foldable display. Since the display device in the present disclosure includes the stacked body described above, it has excellent impact resistance and bending resistance, and is suitable as a flexible display, and further a foldable display.

Incidentally, the present disclosure is not limited to the embodiments. The embodiments are exemplification, and any other variations are intended to be included in the technical scope of the present disclosure if they have substantially the same constitution as the technical idea described in the claim of the present disclosure and offer similar operation and effect thereto.

EXAMPLES

The present disclosure is hereinafter explained in further details with reference to Examples and Comparative Examples.

Comparative Example 1

A chemically strengthened glass substrate with a thickness of 70 μm was used.

Example 1

(1) Production of Hard Coating Film (1-1) Production of Substrate Layer

Referring to the Synthesis Example 1 in WO2014/046180, a tetracarboxylic acid dianhydride represented by the following chemical formula was synthesized.

[Chemical 6]

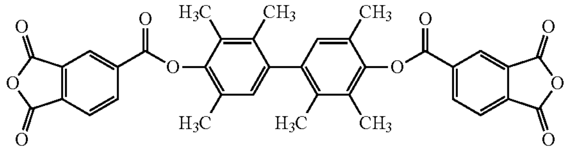

To a nitrogen substituted separable flask of 500 mL, a solution wherein 293.29 g of dehydrated dimethylacetamide (DMAc) and 14.3 g (44.7 mmol) of 2,2'-bis(trifluoromethyl) benzidine (TFMB) were dissolved, was added and the liquid temperature was controlled to 30° C.; 24.8 g (40.1 mmol) of the tetracarboxylic acid dianhydride (TMPBPTME) represented by the chemical formula was gradually charged so that the temperature rise was 2° C. or less, and stirred with a mechanical stirrer for 3 hours. Then, a polyamide acid solution was obtained by adding 0.91 g (4.5 mmol) of dichloride terephthalate (TPC) to the solution and stirring for another 3 hours. Then, 6.66 g (84.2 mmol) of pyridine as a catalyst and 8.60 g (84.2 mmol) of acetic anhydride were added, and the solution was stirred at 25° C. for 30 minutes to confirm that the solution was homogeneous, heated to 70° C., and stirred for 1 hour. Then, 174.26 g of 2-propyl alcohol (IPA) was gradually added to the solution cooled to room temperature, resulting in a slightly turbid solution. White slurry was obtained by adding 435.64 g of IPA to the turbid solution at once. The slurry was filtered, and was washed with IPA for 5 times, and then, dried for 6 hours under reduced pressure in an oven heated to 100° C. to obtain polyamideimide powder (37.1 g). The weight average molecular weight of the polyamideimide measured by GPC was 62,000.

To the polyamideimide, DMAc was added so that the solid content concentration of the polyamideimide was 19% by mass, and a polyamideimide varnish including 19% by mass of the polyamideimide in varnish was prepared. The viscosity of the polyamideimide varnish (solid content: 19% by mass) at 25° C. was 4000 mPa·s.

A glass substrate was coated with the polyamideimide varnish (solid content: 19% by mass) so as the film thickness after drying in the circulating oven described later was the thickness shown in Table 1. Then, the coated film was dried at 120° C. for 10 minutes in a circulating oven, cooled to 25° C. and a polyimide based resin coating film was peeled off.

The peeled polyimide based resin coating film was cut into a size of 150 mm×200 mm. Using two metal frames (outer dimensions of 150 mm×200 mm, inner dimensions of 130 mm×180 mm), a cut polyimide based resin coating film was sandwiched, and the metal frames and the polyimide based resin coating film were fixed with a fixing jig. A fixed polyimide based resin coating film was heated to 300° C. under a nitrogen stream (oxygen concentration of 100 ppm or less) in a circulating oven at a temperature rising speed of 10° C./min, maintained at 300° C. for 1 hour, and cooled to 25° C. to produce a single-layer polyimide based resin film.

(1-2) Formation of Hard Coating Layer

A curable resin composition for a hard coating layer was produced by compounding each component so as to be the composition shown below.

<Composition of Curable Resin Composition for Hard Coating Layer>

Mixture of dipentaerythritol pentaacrylate and dipentaerythritol hexaacrylate (M403 from Toagosei Co., Ltd.): 25 parts by mass Dipentaerythritol EO modified hexaacrylate (A-DPH-6E from Shin-Nakamura Chemical Co., Ltd.): 25 parts by mass Deformed silica fine particle (average particle size: 25 nm, from JGC Catalysts and Chemicals Ltd.): 50 parts by mass (in terms of solid)

Photopolymerization initiator (1-hydroxycyclohexylphenyl ketone, product name "Omnirad184" from IGM Resins B. V.): 4 parts by mass Fluorine based leveling agent (F568 from DIC Corporation): 0.2 parts by mass (in terms of solid)

Ultraviolet absorber 1 (DAINSORB P6, from Daiwa Kasei Co., Ltd.) 3 parts by mass Solvent (MIBK): 150 parts by mass Then, the substrate layer was coated with the composition for a hard coating layer so that the thickness after cured was 10 μm, dried at 70° C. for 1 minute, and then, cured by ultraviolet irradiation at irradiation amount of 200 mJ/cm$^2$ to form a hard coating layer. Thereby, a hard coating film was obtained.

(2) Production of Stacked Body

A hard coating film with a joining layer was obtained by adhering a joining layer with a thickness of 25 μm (acrylic based adhesive sheet, OCA) ("8146-1" from 3M Japan Limited) to the substrate layer side surface of the hard coating film using a hand roller. Then, a stacked body was obtained by adhering the joining layer side surface of the hard coating film with a joining layer to a chemically strengthened glass substrate with a thickness of 70 μm using a hand roller.

Examples 2 to 9 and Comparative Examples 2 to 4

A stacked body was obtained in the same manner as in Example 1 except that the thickness of the substrate layer of the hard coating film was changed as shown in the following Table 1, and when the thickness of the joining layer was 15 μm, 10 μm or 5 μm, "Panaclean PD-S1" from Panac Co., Ltd. was used as the joining layer (acrylic based adhesive sheet, OCA).

Example 10

(1) Production of Hard Coating Film

A hard coating film was produced in the same manner as in Example 7.

(2) Formation of Heat-Sensitive Adhesive Layer

A heat-sealable resin composition was produced by compounding each component so as to be the composition shown below.

<Composition of Heat-Sealable Resin Composition>

Amorphous polyester based resin (Byron 560, from Toyobo Co., Ltd.): 100 parts by mass Hexane methylene diisocyanate (Coronate 2203 from Tosoh Corporation (Nippon Polyurethane Industry Co., Ltd.)): 5 parts by mass Silane coupling agent (KBM-403 from Shin-Etsu Chemical Co., Ltd.): 5 parts by mass Fluorine based leveling agent (F568 from DIC Corporation): 0.2 parts by mass (in terms of solid)

Solvent (MEK): 310 parts by mass

Solvent (toluene): 310 parts by mass

Then, the substrate layer side surface of the hard coating film was coated with the heat-sealable resin composition so that the thickness after drying was 5 μm, dried at 70° C. for 1 minute to form a heat-sensitive adhesive layer, and a hard coating film with a heat-sensitive adhesive layer was obtained.

(3) Production of Stacked Body

A stacked body was obtained by placing the hard coating film with a heat-sensitive adhesive layer so that the heat-sensitive adhesive layer side surface was in contact with the a chemically strengthened glass substrate with a thickness of 70 μm; placing a glass supporting substrate with a thickness of 2 mm on the glass substrate, on the opposite side surface to the hard coating film with a heat-sensitive adhesive layer; and adhering the hard coating film with a heat-sensitive adhesive layer and glass substrate using a roll laminator (product name: Deaktop Roll Laminator B35A3 from ACCO Brands Japan K.K.), while heating. In doing so, the roll temperature was 140° C. to 149° C. and the feeding speed was 0.3 m/min. The stacked body was then aged for two days at 70° C.

Examples 11 to 14 and Comparative Example 5

A stacked body was obtained in the same manner as in Example 10 except that, the thickness of the joining layer was changed as shown in the following Table 1.

Example 15

A stacked body was obtained in the same manner as in Example 10 except that, a pressure-sensitive adhesive layer was formed instead of the heat-sensitive adhesive layer, and the rolling temperature was set to 20° C. to 30° C. in the production of the stacked body.

(Formation of Pressure-Sensitive Adhesive Layer)

A pressure-sensitive adhesive composition was prepared by compounding each component so as to be the composition shown below.

<Composition of Pressure-Sensitive Adhesive Composition>

Polyether urethane based resin: 100 parts by mass

Hexane methylene diisocyanate (Coronate 2203 from Tosoh Corporation (Nippon Polyurethane Industry Co., Ltd.)): 5 parts by mass Silane coupling agent (KBM-403 from Shin-Etsu Chemical Co., Ltd.): 5 parts by mass Fluorine based leveling agent (F568 from DIC Corporation): 0.2 parts by mass (in terms of solid)

Solvent (MEK): 310 parts by mass

Solvent (toluene): 310 parts by mass

The substrate layer side surface of the hard coating film was coated with the pressure-sensitive adhesive composition so that the thickness after drying was 5 μm, dried at 70° C. for 1 minute to form a pressure-sensitive adhesive layer.

Example 16

A stacked body was obtained in the same manner as in Example 7 except that, as the joining layer, an optical clear adhesive film (OCA) ("D692" from LINTEC Corporation) with a thickness of 5 μm was used.

Example 17

A stacked body was obtained in the same manner as in Example 10 except that the following heat-sealable resin composition was used.

<Composition of Heat-Sealable Resin Composition>

Modified polyolefin based resin: 100 parts by mass

Hexane methylene diisocyanate (Coronate 2203 from Tosoh Corporation (Nippon Polyurethane Industry Co., Ltd.)): 5 parts by mass Silane coupling agent (KBM-403 from Shin-Etsu Chemical Co., Ltd.): 5 parts by mass Fluorine based leveling agent (F568 from DIC Corporation): 0.2 parts by mass (in terms of solid)

Solvent (MEK): 310 parts by mass

Solvent (toluene): 310 parts by mass

Example 18

A stacked body was obtained in the same manner as in Example 10 except that the following heat-sealable resin composition was used.

<Composition of Heat-Sealable Resin Composition>

Polyester urethane based resin (UR-8300, solid content of 30%, from Toyobo Co., Ltd.): 100 parts by mass Hexane methylene diisocyanate (Coronate 2203 from Tosoh Corporation (Nippon Polyurethane Industry Co., Ltd.)): 1.5 parts by mass Silane coupling agent (KBM-403 from Shin-Etsu Chemical Co., Ltd.): 1.5 parts by mass Fluorine based leveling agent (F568 from DIC Corporation): 0.2 parts by mass (in terms of solid)

Solvent (MEK): 58 parts by mass

Solvent (toluene): 58 parts by mass

Example 19

A stacked body was obtained in the same manner as in Example 10 except that the following heat-sealable resin composition was used.

<Composition of Heat-Sealable Resin Composition>

Polyester urethane based resin (UR-5537, solid content of 30%, from Toyobo Co., Ltd.): 100 parts by mass Hexane methylene diisocyanate (Coronate 2203 from Tosoh Corporation (Nippon Polyurethane Industry Co., Ltd.)): 1.5 parts by mass Silane coupling agent (KBM-403 from Shin-Etsu Chemical Co., Ltd.): 1.5 parts by mass Fluorine based leveling agent (F568 from DIC Corporation): 0.2 parts by mass (in terms of solid)
Solvent (MEK): 58 parts by mass
Solvent (toluene): 58 parts by mass Example 20

A stacked body was obtained in the same manner as in Example 10 except that the following heat-sealable resin composition was used.

<Composition of Heat-Sealable Resin Composition>

Amorphous polyester based resin (Byron 240, from Toyobo Co., Ltd.): 100 parts by mass
Hexane methylene diisocyanate (Coronate 2203 from Tosoh Corporation (Nippon Polyurethane Industry Co., Ltd.)): 5 parts by mass
Silane coupling agent (KBM-403 from Shin-Etsu Chemical Co., Ltd.): 5 parts by mass
Fluorine based leveling agent (F568 from DIC Corporation): 0.2 parts by mass (in terms of solid)
Solvent (MEK): 310 parts by mass
Solvent (toluene): 310 parts by mass Example 21

A stacked body was obtained in the same manner as in Example 10 except that the following heat-sealable resin composition was used.

<Composition of Heat-Sealable Resin Composition>

Amorphous polyester based resin (Byron 600, from Toyobo Co., Ltd.): 100 parts by mass
Hexane methylene diisocyanate (Coronate 2203 from Tosoh Corporation (Nippon Polyurethane Industry Co., Ltd.)): 5 parts by mass
Silane coupling agent (KBM-403 from Shin-Etsu Chemical Co., Ltd.): 5 parts by mass
Fluorine based leveling agent (F568 from DIC Corporation): 0.2 parts by mass (in terms of solid)
Solvent (MEK): 310 parts by mass
Solvent (toluene): 310 parts by mass Example 22

(1) Production of Hard Coating Film

A hard coating film was produced in the same manner as in Example 7.

(2) Formation of Adhesive Layer

An ultraviolet ray curable type resin composition was prepared by compounding each component so as to be the composition shown below.

(Composition of Ultraviolet Curable Type Resin Composition)

Urethane acrylate (product name “UV-3310B” from Mitsubishi Chemical Corporation): 35 parts by mass
Ethoxylated pentaerythritol tetraacrylate (product name “ATM-35E” from Shin-Nakamura Chemical Co., Ltd.): 10 parts by mass
Phenoxyethyl acrylate (product name “Viscoat #192” from Osaka Organic Chemical Industry Ltd.): 5 parts by mass
Mixture of pentaerythritol triacrylate and pentaerythritol tetraacrylate (product name “KAYARAD PET-30” from Nippon Kayaku Co., Ltd.): 50 parts by mass
Photopolymerization initiator (1-hydroxycyclohexylphenyl ketone, product name “Omnirad184” from IGM Resins B. V.): 5 parts by mass
Methyl isobutyl ketone: 10 parts by mass Then, the substrate layer side surface of the hard coating film was coated with the ultraviolet curable type resin composition so that the thickness after curing was 5 μm, dried at 70° C. for 1 minute to form an adhesive layer, and a hard coating film with an adhesive layer was obtained.

(3) Production of Stacked Body

A stacked body was obtained by adhering the adhesive layer side surface of the hard coating film with an adhesive layer to a chemically strengthened glass substrate with a thickness of 70 μm using a hand roller. Then, the adhesive layer was cured by irradiating ultraviolet rays from the hard coating film side at an irradiation amount of 400 $mJ/cm^2$.

Example 23

(1) Production of Hard Coating Film

A hard coating film was produced in the same manner as in Example 7.

(2) Formation of Adhesive Layer

A thermosetting type resin composition was prepared by compounding each component so as to be the composition shown below.

(Composition of Thermosetting Type Resin Composition)

Specialty novolac type epoxy resin (jER157S65 from Mitsubishi Chemical Corporation): 25 mass parts
Bis A/bis F mixed type epoxy resin (jER4250 from Mitsubishi Chemical Corporation): 75 parts by mass
2-ethyl-4-methylimidazole (from Tokyo Chemical Industry Co., Ltd.): 6.5 part by mass
Silane coupling agent (KBM-403 from Shin-Etsu Chemical Co., Ltd.): 5 parts by mass
Fluorine based leveling agent (F568 from DIC Corporation): 0.2 parts by mass (in terms of solid)
Solvent (MEK): 600 parts by mass Then, the substrate layer side surface of the hard coating film was coated with the thermosetting type resin composition so that the thickness after curing was 5 μm, dried at 70° C. for 1 minute to form an adhesive layer, and a hard coating film with an adhesive layer was obtained.

(3) Production of Stacked Body

A stacked body was obtained by adhering the adhesive layer side surface of the hard coating film with an adhesive layer to a chemically strengthened glass substrate with a thickness of 70 μm using a hand roller. Then, the resultant was heated at 130° C. for 60 minutes to cure the adhesive layer and obtained a stacked body.

Example 24

A stacked body was obtained in the same manner as in Example 23 except that the following thermosetting type resin composition was used.

<Composition of Thermosetting Type Resin Composition>

Specialty novolac type epoxy resin (jER157S65 from Mitsubishi Chemical Corporation): 50 mass parts
Bis A type epoxy resin (jER1256 from Mitsubishi Chemical Corporation): 50 parts by mass
2-ethyl-4-methylimidazole (from Tokyo Chemical Industry Co., Ltd.): 6.5 part by mass
Silane coupling agent (KBM-403 from Shin-Etsu Chemical Co., Ltd.): 5 parts by mass
Fluorine based leveling agent (F568 from DIC Corporation): 0.2 parts by mass (in terms of solid)
Solvent (MEK): 600 parts by mass Example 25

(1) Production of Hard Coating Film

A hard coating film was produced in the same manner as in Example 10 except that, as the substrate layer, a TAC film ("TG60UL" from FUJIFILM Corporation) with a thickness of 60 μm was used, and the thickness of the hard coating layer was changed as shown in the following Table 1.

(2) Formation of Heat-Sensitive Adhesive Layer

A hard coating film with a heat-sensitive adhesive layer was obtained in the same manner as in Example 10.

(3) Production of Stacked Body

A stacked body was obtained in the same manner as in Example 10.

Example 26

(1) Production of Hard Coating Film

A hard coating film was produced in the same manner as in Example 10 except that, as the substrate layer, a PET film ("A4360 (current part number)" ("A4300 (old part number)") from Toyobo Co., Ltd.) with a thickness of 50 μm was used, and the thickness of the hard coating layer was changed as shown in the following Table 1.

(2) Formation of Heat-Sensitive Adhesive Layer

A hard coating film with a heat-sensitive adhesive layer was obtained in the same manner as in Example 10.

(3) Production of Stacked Body

A stacked body was obtained in the same manner as in Example 10.

Example 27

A stacked body was produced in the same manner as in Example 26 except that, as the substrate layer, a PEN film (from Teijin Limited) having a thickness of 50 μm was used.

Examples 28 to 30 and Comparative Example 6

A stacked body was obtained in the same manner as in Example 10 except that, the thickness of the glass substrate was changed as shown in the following Table 3.

[Evaluation 1]

(1) Pencil Hardness

Firstly, a stacked body for a test was produced by adhering a PET film ("A4160 (current part number)" ("A4100 (old part number)", composite elastic modulus of 6.9 GPa) from Toyobo Co., Ltd.) with a thickness of 100 μm to the glass substrate side surface of the stacked body in Examples 1 to 30 and Comparative Examples 2 to 6; and for Comparative Example 1, to the glass substrate, via an optical clear adhesive film (OCA) with a thickness of 50 μm ("8146-2" from 3M Japan Limited, composite elastic modulus of 9.6 MPa). For the stacked body in Examples 1 to 30 and Comparative Examples 2 to 6, the pencil hardness on the hard coating film side surface of the stacked body for a test, was measured. Also, for the glass substrate in Comparative Example 1, the pencil hardness on the glass substrate side surface of the stacked body for a test, was measured. In doing so, the pencil hardness was measured according to JIS K5600-5-4 (1999). Also, a pencil hardness tester (trade name "Scratch Hardness Tester by Pencil Tester" (electrically operated) from Toyoseiki Co.) was used, and the measurement conditions were angle of 45°, load of 1 kg, speed of 0.5 mm/sec or more and 1 mm/sec or less, and temperature of 23±2° C.

For Examples 1 to 9 and Comparative Examples 1 to 4, the pencil hardness was evaluated based on the following criteria.

2A: Pencil hardness was 5H or more.

A: Pencil hardness was 4H.

B: Pencil hardness was 3H.

C: Pencil hardness was H.

D: Pencil hardness was less than H.

For Examples 10 to 30 and Comparative Examples 5 to 6, the pencil hardness was evaluated based on the following criteria.

2A: Pencil hardness was 5H or more.

A: Pencil hardness was 4H.

B: Pencil hardness was 3H.

D: Pencil hardness was less than 3H.

(2) Impact Test (Pen Dropping Test)

As an impact test, a pen dropping test was carried out on the stacked body in Examples 1 to 30 and Comparative Examples 2 to 6, as well as the glass substrate in Comparative Example 1. Firstly, a stacked body for a test was produced by adhering a PET film ("A4160 (current part number)" ("A4100 (old part number)", composite elastic modulus of 6.9 GPa) from Toyobo Co., Ltd.) with a thickness of 100 μm to the glass substrate side surface of the stacked body in Examples 1 to 30 and Comparative Examples 2 to 6; and for Comparative Example 1, to the glass substrate, via an optical clear adhesive film (OCA) with a thickness of 50 μm ("8146-2" from 3M Japan Limited, composite elastic modulus of 9.6 MPa). The stacked body for a test was placed on a metal plate with a thickness of 30 mm so that the PET film side surface of the stacked body for a test was in contact with the metal plate. Then, a pen was dropped to the center portion of the test stacked body for a test with its tip down, from a testing height. As the pen, Blen 0.5 BAS88-BK (weight: 12 g, pen tip (p: 0.5 mm) from Zebra Co., Ltd. was used. The maximum testing heights at which the glass substrate was not broken are shown in Tables 1 to 3. Incidentally, the higher value indicates higher impact resistance.

(3) Impaling Test

The impaling test described above was carried out on the stacked body in Example 10 and the glass substrate in Comparative Example 1, and the impaling fracture force was measured. Incidentally, the higher value indicates higher impact resistance.

(4) Dynamic Bending Test

The bending resistance was evaluated by carrying out the dynamic bending test described above on the stacked body in Examples 1 to 30 and Comparative Examples 2 to 6, as well as the glass substrate in Comparative Example 1. In doing so, the distances "d" between the two opposing short side portions of the stacked body or glass substrate were 3 mm, 4 mm, 6 mm, 8 mm or 10 mm. The stacked body was bent for 200,000 times so that the glass substrate side surface was on the outer side and the hard coating film side surface was on the inner side. The results of the dynamic bending test were evaluated based on the following criteria.

4A: No crack, fracture or peel occurred in the stacked body or glass substrate even when the distance "d" was 3 mm.

3A: No crack, fracture or peel occurred in the stacked body or glass substrate even when the distance "d" was 4 mm.

2A: No crack, fracture or peel occurred in the stacked body or glass substrate even when the distance "d" was 6 mm.

A: No crack, fracture or peel occurred in the stacked body or glass substrate even when the distance "d" was 8 mm.

B: No crack, fracture or peel occurred in the stacked body or glass substrate when the distance "d" was 10 mm.

C: Crack, fracture or peel occurred in the stacked body or glass substrate when the distance "d" was 10 mm.

(5) Composite Elastic Modulus

For the stacked body in Examples 1 to 30 and Comparative Examples 2 to 6, the composite elastic modulus of the substrate layer and joining layer were measured by the method for measuring a composite elastic modulus described above.

(6) Glass Transition Temperature (Tg)

For the stacked body in Examples 1 to 30 and Comparative Examples 2 to 6, the glass transition temperature of the joining layer was measured by the method for measuring a glass transition temperature described above.

TABLE 1

| | Comp. Ex. 1 | Comp. Ex. 2 | Ex. 1 | Ex. 2 | Ex. 3 | Ex. 4 | Comp. Ex. 3 | Ex. 5 | Ex. 6 | Ex. 7 | Comp. Ex. 4 | Ex. 8 | Ex. 9 |
|---|---|---|---|---|---|---|---|---|---|---|---|---|---|
| Hard coating layer thickness A (μm) | — | 10 | 10 | 10 | 10 | 10 | 10 | 10 | 10 | 10 | 10 | 10 | 10 |
| Substrate layer thickness B (μm) | — | 80 | 80 | 80 | 80 | 80 | 50 | 50 | 50 | 50 | 30 | 30 | 30 |
| Joining layer thickness C (μm) | — | 50 | 25 | 15 | 10 | 5 | 25 | 15 | 10 | 5 | 15 | 10 | 5 |
| Glass substrate thickness D (μm) | 70 | 70 | 70 | 70 | 70 | 70 | 70 | 70 | 70 | 70 | 70 | 70 | 70 |
| Stacked body total thk (A + B + C + D) (μm) | — | 210 | 185 | 175 | 170 | 165 | 155 | 145 | 140 | 135 | 125 | 120 | 115 |
| Thickness ratio (A + B)/C | — | 1.8 | 3.6 | 6.0 | 9.0 | 18.0 | 2.4 | 4.0 | 6.0 | 12.0 | 2.7 | 4.0 | 8.0 |
| Pencil hardness | 2A | D | B | A | A | A | C | B | B | B | C | B | A |
| Pen dropping test height (cm) | 5 | >100 | >100 | >100 | >100 | 85 | 40 | 40 | 35 | 25 | 30 | 30 | 25 |
| Dynamic bending prop. | A | A | A | A | A | A | A | A | A | A | A | A | A |

TABLE 2

| | Comp. Ex. 1 | Ex. 7 | Ex. 10 | Ex. 11 | Ex. 12 | Ex. 13 | Ex. 14 | Comp. Ex. 5 | Ex. 15 |
|---|---|---|---|---|---|---|---|---|---|
| Hard coating layer thickness A (μm) | — | 10 | 10 | 10 | 10 | 10 | 10 | 10 | 10 |
| Substrate layer thickness B (μm) | — | 50 | 50 | 50 | 50 | 50 | 50 | 50 | 50 |
| Joining layer thickness C (μm) | — | 5 | 5 | 2 | 1 | 0.5 | 0.12 | 0.1 | 5 |
| Glass substrate thickness D (μm) | 70 | 70 | 70 | 70 | 70 | 70 | 70 | 70 | 70 |
| Stacked body total thk (A + B + C + D) (μm) | — | 135 | 135 | 132 | 131 | 130.5 | 130.12 | 130.1 | 135 |
| Thk ratio (A + B)/C | — | 12 | 12 | 30 | 60 | 120 | 500 | 600 | 12 |
| Joining layer Type | — | OCA | Heat seal | Heat seal | Heat seal | Heat seal | Heat seal | Heat seal | Press. sen. adh. |
| Tg (° C.) | — | −7 | 26 | 26 | 26 | 26 | 26 | 26 | −40 |
| Comp. elast. mod. (MPa) | — | 14 | 26 | 26 | 26 | 26 | 26 | 26 | 420 |
| Pencil hardness | 2A | B | 2A | 2A | 2A | 2A | 2A | 2A | B |
| Pen dropping test height (cm) | 5 | 25 | 50 | 50 | 50 | 45 | 45 | 40 | 20 |
| Dynamic bending prop. | A | A | A | A | B | B | B | C | A |
| | Ex. 16 | Ex. 17 | Ex. 18 | Ex. 19 | Ex. 20 | Ex. 21 | Ex. 22 | Ex. 23 | Ex. 24 |
| Hard coating layer thickness A (μm) | 10 | 10 | 10 | 10 | 10 | 10 | 10 | 10 | 10 |
| Substrate layer thickness B (μm) | 50 | 50 | 50 | 50 | 50 | 50 | 50 | 50 | 50 |
| Joining layer thickness C (μm) | 5 | 5 | 5 | 5 | 5 | 5 | 5 | 5 | 5 |
| Glass substrate thickness D (μm) | 70 | 70 | 70 | 70 | 70 | 70 | 70 | 70 | 70 |
| Stacked body total thk (A + B + C + D) (μm) | 135 | 135 | 135 | 135 | 135 | 135 | 135 | 135 | 135 |
| Thk ratio (A + B)/C | 12 | 12 | 12 | 12 | 12 | 12 | 12 | 12 | 12 |
| Joining layer Type | OCA | Heat seal | Heat seal | Heat seal | Heat seal | Heat seal | UV cure | Thermal cure | Thermal cure |
| Tg (° C.) | −25 | 2 | 34 | 44 | 68 | 53 | 69 | 127 | 154 |

TABLE 2-continued

| | | | | | | | | | |
|---|---|---|---|---|---|---|---|---|---|
| Comp. elast. mod. (MPa) | 19 | 80 | 2400 | 3400 | 5100 | 5970 | 1500 | 4700 | 6300 |
| Pencil hardness | B | 2A | 2A | 2A | 2A | A | 2A | 2A | B |
| Pen dropping test height (cm) | 25 | 45 | 50 | 50 | 50 | 50 | 50 | 50 | 50 |
| Dynamic bending prop. | A | A | A | A | B | B | A | B | B |

TABLE 3

| | | Comp. Ex. 1 | Ex. 10 | Ex. 25 | Ex. 26 | Ex. 27 | Ex. 28 | Ex. 29 | Ex. 30 | Comp. Ex. 6 |
|---|---|---|---|---|---|---|---|---|---|---|
| Hard coating layer thk A (μm) | | — | 10 | 15 | 20 | 20 | 10 | 10 | 10 | 10 |
| Substrate layer thickness B (μm) | | — | 50 | 60 | 50 | 50 | 50 | 50 | 50 | 50 |
| Joining layer thickness C (μm) | | — | 5 | 5 | 5 | 5 | 5 | 5 | 5 | 5 |
| Glass substrate thk D (μm) | | 70 | 70 | 70 | 70 | 70 | 50 | 30 | 100 | 300 |
| Stacked body tot thk (A + B + C + D)(μm) | | — | 135 | 150 | 145 | 145 | 135 | 135 | 135 | 135 |
| Thickness ratio (A + B)/C | | — | 12 | 15 | 14 | 14 | 12 | 12 | 12 | 12 |
| Subst. | Type | — | PI | TAC | PET | PEN | PI | PI | PI | PI |
| layer | Comp. elastic modulus (GPa) | — | 8.3 | 6.7 | 6.9 | 7.5 | 8.3 | 8.3 | 8.3 | 8.3 |
| Joining | Type | — | Heat seal | Heat seal | Heat seal | Heat seal | Heat seal | Heat seal | Heat seal | Heat seal |
| layer | Tg(° C.) | — | 26 | 26 | 26 | 26 | 26 | 26 | 26 | 26 |
| | Comp. elastic modulus (MPa) | — | 26 | 26 | 26 | 26 | 26 | 26 | 26 | 26 |
| Pencil hardness | | 2A | 2A | B | B | 2A | 2A | A | 2A | 2A |
| Pen dropping test height (cm) | | 5 | 50 | 50 | 50 | 50 | 25 | 20 | 80 | >100 |
| Impaling fracture force (N) | | 13.8 | 28.0 | — | — | — | — | — | — | — |
| Dynamic bending prop. | | A | A | A | A | A | 3A | 4A | B | C |

From Tables 1 to 3, it was confirmed that, when the thickness ratio (A+B)/C was in the predetermined range, impact resistance and bending resistance were good, and further, the surface hardness was high and scratch resistance was good.

Example 31

A stacked body was obtained by adhering a second joining layer (optical clear adhesive film (OCA), storage elastic modulus of 0.10 MPa) with a thickness of 100 μm, to the glass substrate side surface of the stacked body in Example 10, using a hand roller.

Example 32

A stacked body was produced in the same manner as in Example 31 except that, as the second joining layer, an optical clear adhesive film (OCA) ("8146-4" from 3M Japan Limited, storage elastic modulus of 0.23 MPa) having a thickness of 100 μm was used.

Example 33

A stacked body was produced in the same manner as in Example 31 except that, as the second joining layer, an optical clear adhesive film (OCA) ("8146-2" from 3M Japan Limited, storage elastic modulus of 0.23 MPa) having a thickness of 50 μm was used.

Example 34

A stacked body was produced in the same manner as in Example 31 except that, as the second joining layer, an optical clear adhesive film (OCA) (storage elastic modulus of 0.10 MPa) having a thickness of 50 μm was used.

Example 35

A stacked body was produced in the same manner as in Example 31 except that, as the second joining layer, an optical clear adhesive film (OCA) (storage elastic modulus of 0.12 MPa) having a thickness of 55 μm was used.

Example 36

A stacked body was produced in the same manner as in Example 31 except that, as the second joining layer, an optical clear adhesive film (OCA) (storage elastic modulus of 0.12 MPa) having a thickness of 30 μm was used.

Example 37

A stacked body was produced in the same manner as in Example 31 except that, as the second joining layer, an optical clear adhesive film (OCA) (storage elastic modulus of 0.32 MPa) having a thickness of 25 μm was used.

Example 38

A stacked body was produced in the same manner as in Example 31 except that, as the second joining layer, an optical clear adhesive film (OCA) (storage elastic modulus of 0.15 MPa) having a thickness of 25 μm was used.

Example 39

A stacked body was produced in the same manner as in Example 31 except that, as the second joining layer, an optical clear adhesive film (OCA) ("F619" from LINTEC Corporation, storage elastic modulus of 0.19 MPa) having a thickness of 25 μm was used.

Example 40

A stacked body was produced in the same manner as in Example 31 except that, as the second joining layer, an optical clear adhesive film (OCA) ("N632" from LINTEC Corporation, storage elastic modulus of 0.20 MPa) having a thickness of 25 μm was used.

Example 41

A stacked body was produced in the same manner as in Example 31 except that, as the second joining layer, an optical clear adhesive film (OCA) (storage elastic modulus of 0.57 MPa) having a thickness of 25 μm was used.

Example 42

A stacked body was produced in the same manner as in Example 31 except that, as the second joining layer, an optical clear adhesive film (OCA) (storage elastic modulus of 1.17 MPa) having a thickness of 25 μm was used.

Example 43

A stacked body was produced in the same manner as in Example 31 except that, as the second joining layer, an optical clear adhesive film (OCA) ("D692" from LINTEC Corporation, storage elastic modulus of 2.33 MPa) having a thickness of 25 μm was used.

Example 44

A stacked body was produced in the same manner as in Example 31 except that, as the second joining layer, an optical clear adhesive film (OCA) (storage elastic modulus of 2.22 MPa) having a thickness of 25 μm was used.

Example 45

A stacked body was produced in the same manner as in Example 31 except that, as the second joining layer, an optical clear adhesive film (OCA) ("D692" from LINTEC Corporation, storage elastic modulus of 2.14 MPa) having a thickness of 15 μm was used.

Example 46

A stacked body was produced in the same manner as in Example 31 except that, as the second joining layer, an optical clear adhesive film (OCA) (storage elastic modulus of 0.12 MPa) having a thickness of 15 μm was used.

Example 47

A stacked body was produced in the same manner as in Example 31 except that, as the second joining layer, an optical clear adhesive film (OCA) (storage elastic modulus of 0.91 MPa) having a thickness of 5 μm was used.

Example 48

A stacked body was produced in the same manner as in Example 31 except that, as the second joining layer, an optical clear adhesive film (OCA) (storage elastic modulus of 2.22 MPa) having a thickness of 10 μm was used.

Example 49

A stacked body was produced in the same manner as in Example 31 except that, as the second joining layer, an optical clear adhesive film (OCA) (storage elastic modulus of 1.95 MPa) having a thickness of 5 μm was used.

Comparative Example 7

A stacked body was produced in the same manner as in Example 31 except that, as the second joining layer, an optical clear adhesive film (OCA) (storage elastic modulus of 2.22 MPa) having a thickness of 5 μm was used.

Comparative Example 8

A stacked body was produced in the same manner as in Example 31 except that, as the second joining layer, an optical clear adhesive film (OCA) (storage elastic modulus of 12.74 MPa) having a thickness of 15 μm was used.

Example 50

A stacked body was obtained by adhering an optical clear adhesive film (OCA) ("8146-2" from 3M Japan Limited, storage elastic modulus of 0.23 MPa) with a thickness of 50 μm, to the glass substrate side surface of the stacked body in Example 18, using a hand roller.

Example 51

A stacked body was obtained by adhering an optical clear adhesive film (OCA) ("8146-2" from 3M Japan Limited, storage elastic modulus of 0.23 MPa) with a thickness of 50 μm, to the glass substrate side surface of the stacked body in Example 19, using a hand roller.

Example 52

A stacked body was obtained by adhering an optical clear adhesive film (OCA) ("8146-2" from 3M Japan Limited, storage elastic modulus of 0.23 MPa) with a thickness of 50 μm, to the glass substrate side surface of the stacked body in Example 20, using a hand roller.

Example 53

A stacked body was obtained by adhering an optical clear adhesive film (OCA) ("8146-2" from 3M Japan Limited, storage elastic modulus of 0.23 MPa) with a thickness of 50 μm, to the glass substrate side surface of the stacked body in Example 21, using a hand roller.

Example 54

A stacked body was obtained by adhering an optical clear adhesive film (OCA) ("8146-2" from 3M Japan Limited, storage elastic modulus of 0.23 MPa) with a thickness of 50 μm, to the glass substrate side surface of the stacked body in Example 22, using a hand roller.

Example 55

A stacked body was obtained by adhering an optical clear adhesive film (OCA) ("8146-2" from 3M Japan Limited, storage elastic modulus of 0.23 MPa) with a thickness of 50 μm, to the glass substrate side surface of the stacked body in Example 23, using a hand roller.

Example 56

A stacked body was obtained by adhering an optical clear adhesive film (OCA) ("8146-2" from 3M Japan Limited, storage elastic modulus of 0.23 MPa) with a thickness of 50 μm, to the glass substrate side surface of the stacked body in Example 28, using a hand roller.

Example 57

A stacked body was produced in the same manner as in Example 26 except that, the thickness of the hard coating layer was 10 μm. A stacked body was obtained by adhering an optical clear adhesive film (OCA) ("8146-2" from 3M Japan Limited, storage elastic modulus of 0.23 MPa) with a thickness of 50 μm, to the glass substrate side surface of this stacked body, using a hand roller.

Example 58

A stacked body was obtained by adhering an optical clear adhesive film (OCA) ("8146-2" from 3M Japan Limited, storage elastic modulus of 0.23 MPa) with a thickness of 50 μm, to the glass substrate side surface of the stacked body in Example 26, using a hand roller.

Example 59

A stacked body was produced in the same manner as in Example 57 except that, the thickness of the glass substrate was 50 μm.

Example 60

A stacked body was produced in the same manner as in Example 33 except that, as the joining layer, an optical clear adhesive film (OCA) (composite elastic modulus of 0.0096 GPa) with a thickness of 25 μm was used.

Example 61

A stacked body was produced in the same manner as in Example 59 except that, as the joining layer, an optical clear adhesive film (OCA) (composite elastic modulus of 0.0096 GPa) with a thickness of 50 μm was used.

Example 62

A stacked body was produced in the same manner as in Example 33 except that, the thickness of the glass substrate was 50 μm, and, as the second joining layer, an optical clear adhesive film (OCA) ("8146-4" from 3M Japan Limited, storage elastic modulus of 0.23 MPa) with a thickness of 100 μm was used.

Example 63

A stacked body was produced in the same manner as in Example 62 except that, as the substrate layer, a PEN film (from Teijin Limited) with a thickness of 50 μm was used.

Example 64

A stacked body was produced in the same manner as in Example 62 except that, as the substrate layer, a PET film ("A4360" from Toyobo Co., Ltd.) with a thickness of 50 μm was used.

Example 65

A stacked body was produced in the same manner as in Example 33 except that, the thickness of the glass substrate was 30 μm, and, as the second joining layer, an optical clear adhesive film (OCA) ("8146-4" from 3M Japan Limited, storage elastic modulus of 0.23 MPa) with a thickness of 100 μm was used.

Example 66

A stacked body was produced in the same manner as in Example 65 except that, as the substrate layer, a PEN film (from Teijin Limited) having a thickness of 50 μm) was used.

Example 67

A stacked body was produced in the same manner as in Example 65 except that, as the substrate layer, a PET film ("A4360" from Toyobo Co., Ltd.) with a thickness of 50 μm was used.

Example 68

A stacked body was produced in the same manner as in Example 67 except that, as the joining layer, an optical clear adhesive film (OCA) (composite elastic modulus of 0.0096 GPa) with a thickness of 25 μm was used, and as the second joining layer, an optical clear adhesive film (OCA) (composite elastic modulus of 0.23 MPa) with a thickness of 25 μm was used.

Example 69

A stacked body was produced in the same manner as in Example 33 except that the thickness of the substrate layer was 80 μm, and the thickness of the glass substrate was 50 μm.

Example 70

A stacked body was produced in the same manner as in Example 59 except that, as the substrate layer, a PET film ("U403" from Toray Industries Inc.) with a thickness of 23 μm was used, and the thickness of the glass substrate was 30 μm.

Comparative Example 9

A stacked body was produced in the same manner as in Example 68 except that, as the second joining layer, an optical clear adhesive film (OCA) ("8146-4" from 3M Japan Limited, storage elastic modulus of 0.23 MPa) having a thickness of 100 μm was used.

Comparative Example 10

A stacked body was obtained by adhering an optical clear adhesive film (OCA) ("8146-4" from 3M Japan Limited, storage elastic modulus of 0.23 MPa) with a thickness of 100 μm, to one surface of the chemically strengthened glass substrate with a thickness of 70 μm.

Comparative Example 11

A stacked body was produced in the same manner as in Comparative Example 10 except that, the thickness of the glass substrate was 50 μm.

Comparative Example 12

A stacked body was produced in the same manner as in Comparative Example 10 except that, the thickness of the glass substrate was 30 μm.

Example 71

A substrate layer made from a polyimide based resin film with a thickness of 80 μm was produced in the same manner as in Example 1. A heat-sensitive adhesive layer was formed on one surface of the substrate layer in the same manner as in Example 10, and a substrate layer with a heat-sensitive adhesive layer was obtained. A stacked body was obtained by placing the substrate layer with a heat-sensitive adhesive layer so that the heat-sensitive adhesive layer side surface was in contact with the chemically strengthened glass substrate with a thickness of 70 μm; placing a glass supporting substrate with a thickness of 2 mm on the glass substrate, on the opposite side surface to the substrate layer with a heat-sensitive adhesive layer; and adhering the substrate layer with a heat-sensitive adhesive layer and glass substrate using a roll laminator (product name: Deaktop Roll Laminator B35A3 from ACCO Brands Japan K.K.), while heating. In doing so, the roll temperature was 140° C. to 149° C. and the feeding speed was 0.3 m/min. The stacked body was then aged for two days at 70° C. Then, a stacked body was obtained by adhering an optical clear adhesive film (OCA) (“8146-2” from 3M Japan Limited, storage elastic modulus of 0.23 MPa) with a thickness of 50 μm, to the glass substrate side surface of the stacked body, using a hand roller.

Example 72

A stacked body was produced in the same manner as in Example 71 except that, the thickness of the substrate layer was 50 μm.

Example 73

A stacked body was produced in the same manner as in Example 71 except that the thickness of the substrate layer was 50 μm, and the thickness of the glass substrate was 50 μm.

Example 74

A stacked body was produced in the same manner as in Example 71 except that the thickness of the substrate layer was 50 μm, and the thickness of the glass substrate was 30 μm.

Example 75

A stacked body was produced in the same manner as in Example 71 except that, the thickness of the substrate layer was 30 μm.

Example 76

A stacked body was produced in the same manner as in Example 71 except that, as the substrate layer, a PET film (“A4360” from Toyobo Co., Ltd.) with a thickness of 75 μm was used.

Example 77

A stacked body was produced in the same manner as in Example 71 except that, as the substrate layer, a PET film (“A4360” from Toyobo Co., Ltd.) with a thickness of 50 μm was used.

Example 78

A stacked body was produced in the same manner as in Example 77 except that, the thickness of the glass substrate was 50 μm.

Example 79

A stacked body was produced in the same manner as in Example 77 except that, the thickness of the glass substrate was 30 μm.

Example 80

A stacked body was produced in the same manner as in Example 71 except that, as the substrate layer, a PET film (“U403” from Toray Industries Inc.) with a thickness of 23 μm was used.

Example 81

A stacked body was produced in the same manner as in Example 71 except that, as the substrate layer, a TAC film (“TG60UL” from FUJIFILM Corporation) with a thickness of 60 μm was used.

Example 82

A stacked body was produced in the same manner as in Example 71 except that, as the substrate layer, a PEN film (from Teijin Limited) with a thickness of 50 μm was used.

Example 83

A stacked body was produced in the same manner as in Example 71 except that, the thickness of the glass substrate was 50 μm, and, as the second joining layer, an optical clear adhesive film (OCA) (“8146-4” from 3M Japan Limited, storage elastic modulus of 0.23 MPa) with a thickness of 100 μm was used.

Example 84

A stacked body was produced in the same manner as in Example 83 except that, as the substrate layer, a PEN film (from Teijin Limited) with a thickness of 50 μm was used.

Example 85

A stacked body was produced in the same manner as in Example 83 except that, as the substrate layer, a PET film (“A4360” from Toyobo Co., Ltd.) with a thickness of 50 μm was used.

Example 86

A stacked body was produced in the same manner as in Example 71 except that, the thickness of the glass substrate was 30 μm, and, as the second joining layer, an optical clear adhesive film (OCA) ("8146-4" from 3M Japan Limited, storage elastic modulus of 0.23 MPa) with a thickness of 100 μm was used.

Example 87

A stacked body was produced in the same manner as in Example 86 except that, as the substrate layer, a PEN film (from Teijin Limited) with a thickness of 50 μm was used.

Example 88

A stacked body was produced in the same manner as in Example 86 except that, as the substrate layer, a PET film ("A4360" from Toyobo Co., Ltd.) with a thickness of 50 μm was used.

Example 89

A stacked body was obtained in the same manner as in Example 88 except that, as the joining layer, an optical clear adhesive film (OCA) (composite elastic modulus of 0.0096 GPa) with a thickness of 25 μm was used, and as the second joining layer, an optical clear adhesive film (OCA) ("8146-4" from 3M Japan Limited, storage elastic modulus of 0.23 MPa) with a thickness of 100 μm was used.

Example 90

A stacked body was obtained in the same manner as in Example 72 except that, as the second joining layer, an optical clear adhesive film (OCA) (storage elastic modulus of 2.14 MPa) having a thickness of 15 μm was used.

Example 91

A stacked body was obtained in the same manner as in Example 72 except that, as the second joining layer, an optical clear adhesive film (OCA) (storage elastic modulus of 0.91 MPa) with a thickness of 5 μm was used.

Example 92

A stacked body was obtained in the same manner as in Example 72 except that, as the second joining layer, an optical clear adhesive film (OCA) (storage elastic modulus of 2.22 MPa) with a thickness of 10 μm was used.

Example 93

A stacked body was obtained in the same manner as in Example 72 except that, as the second joining layer, an optical clear adhesive film (OCA) (storage elastic modulus of 1.95 MPa) with a thickness of 5 μm was used.

Example 94

A stacked body was produced in the same manner as in Example 71 except that, as the substrate layer, a PET film ("U403" from Toray Industries Inc.) with a thickness of 23 μm was used, and the thickness of the glass substrate was 30 μm.

Comparative Example 13

A stacked body was obtained in the same manner as in Example 72 except that, as the second joining layer, an optical clear adhesive film (OCA) (storage elastic modulus of 2.22 MPa) with a thickness of 5 μm was used.

Comparative Example 14

A stacked body was obtained in the same manner as in Example 94 except that, as the second joining layer, an optical clear adhesive film (OCA) ("8146-4" from 3M Japan Limited, storage elastic modulus of 0.23 MPa) having a thickness of 100 μm was used.

[Evaluation 2]

(1) Impact Test (Pen Dropping Test)

As an impact test, a pen dropping test was carried out on the stacked body. Firstly, on the second joining layer side surface of the stacked body, a PET film ("A4160" from Toyobo Co., Ltd., composite elastic modulus of 6.9 GPa) with a thickness of 100 μm was adhered to produce a stacked body for a test. The stacked body for a test was placed on a metal plate with a thickness of 30 mm so that the PET film side surface of the stacked body for a test was in contact with the metal plate. Then, a pen was dropped to the center portion of the test stacked body for a test with its tip down, from a testing height. As the pen, Blen 0.5 BAS88-BK (weight: 12 g, pen tip (φ: 0.5 mm) from Zebra Co., Ltd. was used. The maximum testing heights at which the glass substrate was not broken are shown in Tables 4 to 6. Incidentally, the higher value indicates higher impact resistance.

(2) Dynamic Bending Test

Firstly, on the second joining layer side surface of the stacked body, a PET film ("A4360" from Toyobo Co., Ltd.) with a thickness of 38 μm was adhered, using a hand roller, to produce a stacked body for a test. In the same manner as in Evaluation 1 described above, the dynamic bending test was carried out to evaluate the bending resistance. In doing so, the stacked body for a test was bent for 200,000 times so that the second joining layer side surface was on the outer side and the hard coating layer or the substrate layer side surface was on the inner side.

(3) Composite Elastic Modulus of Glass Substrate, Joining Layer, Substrate Layer and Hard Coating Layer The composite elastic modulus of the glass substrate, joining layer, substrate layer, and the hard coat were measured by the method for measuring a composite elastic modulus described above.

(4) Storage Elastic Modulus of Second Joining Layer at 20° C.

The storage elastic modulus of the second joining layer at 20° C. was measured by a method for measuring a storage elastic modulus of the second joining layer described above.

A graph showing the relationship between a middle member value of the formula (1) described above, and a testing height in the pen dropping test is shown in FIG. 10. Also, a graph showing the relationship between a middle member value of the formula (2) described above, and a testing height in the pen dropping test is shown in FIG. 11.

(5) Glass Transition Temperature (Tg) of Joining Layer and Second Joining Layer

The glass transition temperature of the joining layer and second joining layer were measured by the method for measuring a glass transition temperature described above.

TABLE 4

| | | Ex. 31 | Ex. 32 | Ex. 33 | Ex. 34 | Ex. 35 | Ex. 36 | Ex. 37 |
|---|---|---|---|---|---|---|---|---|
| Hard coating | Comp. elast. mod. (GPa) | 7.0 | 7.0 | 7.0 | 7.0 | 7.0 | 7.0 | 7.0 |
| layer | Thk (mm) | 0.01 | 0.01 | 0.01 | 0.01 | 0.01 | 0.01 | 0.01 |
| Substrate | Type | PI | PI | PI | PI | PI | PI | PI |
| layer | Comp. elast. mod. (GPa) | 8.3 | 8.3 | 8.3 | 8.3 | 8.3 | 8.3 | 8.3 |
| | Thk (mm) | 0.05 | 0.05 | 0.05 | 0.05 | 0.05 | 0.05 | 0.05 |
| Joining layer | Type | Heat seal | Heat seal | Heat seal | Heat seal | Heat seal | Heat seal | Heat seal |
| | Comp. elast. mod. (GPa) | 0.0264 | 0.0264 | 0.0264 | 0.0264 | 0.0264 | 0.0264 | 0.0264 |
| | Thk (mm) | 0.005 | 0.005 | 0.005 | 0.005 | 0.005 | 0.005 | 0.005 |
| | Tg(° C.) | 26 | 26 | 26 | 26 | 26 | 26 | 26 |
| Glass substrate | Comp. elast. mod. (GPa) | 72.4 | 72.4 | 72.4 | 72.4 | 72.4 | 72.4 | 72.4 |
| | Thk (mm) | 0.07 | 0.07 | 0.07 | 0.07 | 0.07 | 0.07 | 0.07 |
| Second | Type | OCA | OCA | OCA | OCA | OCA | OCA | OCA |
| joining layer | Stg. elast. mod. (GPa) | 0.0001 | 0.00023 | 0.00023 | 0.0001 | 0.00012 | 0.00012 | 0.00032 |
| | Thk (mm) | 0.1 | 0.1 | 0.05 | 0.05 | 0.055 | 0.03 | 0.025 |
| | Tg(° C.) | −27 | −6 | −6 | −27 | −44 | −44 | −9 |
| | Stg. elast. mod./thk | 0.0010 | 0.0023 | 0.0046 | 0.0020 | 0.0022 | 0.0040 | 0.0128 |
| Mid. Mbr. Val. Form. (1) | | 0.0076 | 0.0175 | 0.0350 | 0.0152 | 0.0166 | 0.0304 | 0.0974 |
| Pen dropping test height (cm) | | 12 | 20 | 50 | 32 | 30 | 45 | 70 |
| Dynamic bending prop. | | A | A | A | A | A | A | A |

| | | Ex. 38 | Ex. 39 | Ex. 40 | Ex. 41 | Ex. 42 | Ex. 43 | Ex. 44 |
|---|---|---|---|---|---|---|---|---|
| Hard coating | Comp. elast. mod. (GPa) | 7.0 | 7.0 | 7.0 | 7.0 | 7.0 | 7.0 | 7.0 |
| layer | Thk (mm) | 0.01 | 0.01 | 0.01 | 0.01 | 0.01 | 0.01 | 0.01 |
| Substrate | Type | PI | PI | PI | PI | PI | PI | PI |
| layer | Comp. elast. mod. (GPa) | 8.3 | 8.3 | 8.3 | 8.3 | 8.3 | 8.3 | 8.3 |
| | Thk (mm) | 0.05 | 0.05 | 0.05 | 0.05 | 0.05 | 0.05 | 0.05 |
| Joining layer | Type | Heat seal | Heat seal | Heat seal | Heat seal | Heat seal | Heat seal | Heat seal |
| | Comp. elast. mod. (GPa) | 0.0264 | 0.0264 | 0.0264 | 0.0264 | 0.0264 | 0.0264 | 0.0264 |
| | Thk (mm) | 0.005 | 0.005 | 0.005 | 0.005 | 0.005 | 0.005 | 0.005 |
| | Tg(° C.) | 26 | 26 | 26 | 26 | 26 | 26 | 26 |
| Glass substrate | Comp. elast. mod. (GPa) | 72.4 | 72.4 | 72.4 | 72.4 | 72.4 | 72.4 | 72.4 |
| | Thk (mm) | 0.07 | 0.07 | 0.07 | 0.07 | 0.07 | 0.07 | 0.07 |
| Second | Type | OCA | OCA | OCA | OCA | OCA | OCA | OCA |
| joining layer | Stg. elast. mod. (GPa) | 0.00015 | 0.00019 | 0.0002 | 0.00057 | 0.00117 | 0.00233 | 0.00222 |
| | Thk (mm) | 0.025 | 0.025 | 0.025 | 0.025 | 0.025 | 0.025 | 0.025 |
| | Tg(° C.) | −29 | −32 | −26 | −21 | −21 | −21 | 25 |
| | Stg. elast. mod./thk | 0.0060 | 0.0076 | 0.0080 | 0.0228 | 0.0468 | 0.0932 | 0.0888 |
| Mid. Mbr. Val. Form. (1) | | 0.0457 | 0.0578 | 0.0609 | 0.1735 | 0.3561 | 0.7092 | 0.6758 |
| Pen dropping test height (cm) | | 55 | 60 | 70 | 75 | 80 | 80 | 80 |
| Dynamic bending prop. | | A | A | A | A | A | A | A |

| | | Ex. 45 | Ex. 46 | Ex. 47 | Ex. 48 | Ex. 49 | Comp. Ex. 7 | Comp. Ex. 8 |
|---|---|---|---|---|---|---|---|---|
| Hard coating | Comp. elast. mod. (GPa) | 7.0 | 7.0 | 7.0 | 7.0 | 7.0 | 7.0 | 7.0 |
| layer | Thk (mm) | 0.01 | 0.01 | 0.01 | 0.01 | 0.01 | 0.01 | 0.01 |
| Substrate | Type | PI | PI | PI | PI | PI | PI | PI |
| layer | Comp. elast. mod. (GPa) | 8.3 | 8.3 | 8.3 | 8.3 | 8.3 | 8.3 | 8.3 |
| | Thk (mm) | 0.05 | 0.05 | 0.05 | 0.05 | 0.05 | 0.05 | 0.05 |
| Joining layer | Type | Heat seal | Heat seal | Heat seal | Heat seal | Heat seal | Heat seal | Heat seal |
| | Comp. elast. mod. (GPa) | 0.0264 | 0.0264 | 0.0264 | 0.0264 | 0.0264 | 0.0264 | 0.0264 |
| | Thk (mm) | 0.005 | 0.005 | 0.005 | 0.005 | 0.005 | 0.005 | 0.005 |
| | Tg(° C.) | 26 | 26 | 26 | 26 | 26 | 26 | 26 |
| Glass substrate | Comp. elast. mod. (GPa) | 72.4 | 72.4 | 72.4 | 72.4 | 72.4 | 72.4 | 72.4 |

TABLE 4-continued

| | | | | | | | | |
|---|---|---|---|---|---|---|---|---|
| | Thk (mm) | 0.07 | 0.07 | 0.07 | 0.07 | 0.07 | 0.07 | 0.07 |
| Second joining layer | Type | OCA | OCA | OCA | OCA | OCA | OCA | OCA |
| | Stg. elast. mod. (GPa) | 0.00214 | 0.00012 | 0.00091 | 0.00222 | 0.00195 | 0.00222 | 0.01274 |
| | Thk (mm) | 0.015 | 0.015 | 0.005 | 0.01 | 0.005 | 0.005 | 0.015 |
| | Tg(° C.) | −24 | −44 | −7 | 25 | −25 | 25 | 31 |
| | Stg. elast. mod./thk | 0.1427 | 0.0080 | 0.1820 | 0.2220 | 0.3900 | 0.4440 | 0.8493 |
| Mid. Mbr. Val. Form. (1) | | 1.0857 | 0.0609 | 1.3850 | 1.6894 | 2.9678 | 3.3788 | 6.4633 |
| Pen dropping test height (cm) | | 85 | 65 | 80 | 80 | 85 | 80 | 80 |
| Dynamic bending prop. | | A | A | A | B | B | C | C |

TABLE 5

| | | Ex. 50 | Ex. 51 | Ex. 52 | Ex. 53 | Ex. 54 | Ex. 55 | Ex. 56 | Ex. 57 | Ex. 58 |
|---|---|---|---|---|---|---|---|---|---|---|
| Hard coating layer | Comp. elast. mod. (GPa) | 7.0 | 7.0 | 7.0 | 7.0 | 7.0 | 7.0 | 7.0 | 7.0 | 7.0 |
| | Thk (mm) | 0.01 | 0.01 | 0.01 | 0.01 | 0.01 | 0.01 | 0.01 | 0.01 | 0.02 |
| Sub-strate layer | Type | PI | PI | PI | PI | PI | PI | PI | PET | PET |
| | Comp. elast. mod. (GPa) | 8.3 | 8.3 | 8.3 | 8.3 | 8.3 | 8.3 | 8.3 | 6.9 | 6.9 |
| | Thk (mm) | 0.05 | 0.05 | 0.05 | 0.05 | 0.05 | 0.05 | 0.05 | 0.05 | 0.05 |
| Joining layer | Type | Heat seal | Heat seal | Heat seal | Heat seal | UV cure | ThermalC | Heat seal | Heat seal | Heat seal |
| | Comp. elast. mod. (GPa) | 2.4 | 3.4 | 5.1 | 6.0 | 1.5 | 4.7 | 0.0264 | 0.0264 | 0.0264 |
| | Thk (mm) | 0.005 | 0.005 | 0.005 | 0.005 | 0.005 | 0.005 | 0.005 | 0.005 | 0.005 |
| | Tg(° C.) | 34 | 44 | 68 | 53 | 69 | 127 | 26 | 26 | 26 |
| Glass sub-strate | Comp. elast. mod. (GPa) | 72.4 | 72.4 | 72.4 | 72.4 | 72.4 | 72.4 | 72.4 | 72.4 | 72.4 |
| | Thk (mm) | 0.07 | 0.07 | 0.07 | 0.07 | 0.07 | 0.07 | 0.05 | 0.07 | 0.07 |
| Second joining layer | Type | OCA | OCA | OCA | OCA | OCA | OCA | OCA | OCA | OCA |
| | Stg. elast. mod. (GPa) | 0.00023 | 0.00023 | 0.00023 | 0.00023 | 0.00023 | 0.00023 | 0.00023 | 0.00023 | 0.00023 |
| | Thk (mm) | 0.05 | 0.05 | 0.05 | 0.05 | 0.05 | 0.05 | 0.05 | 0.05 | 0.05 |
| | Tg(° C.) | −6 | −6 | −6 | −6 | −6 | −6 | −6 | −6 | −6 |
| | Stg. elast. mod./thk | 0.0046 | 0.0046 | 0.0046 | 0.0046 | 0.0046 | 0.0046 | 0.0046 | 0.0046 | 0.0046 |
| Mid. Mbr. Val. Form. (1) | | 0.0351 | 0.0351 | 0.0352 | 0.0352 | 0.0351 | 0.0352 | 0.0179 | 0.0293 | 0.0327 |
| Pen dropping test height (cm) | | 50 | 50 | 50 | 50 | 50 | 50 | 25 | 32 | 40 |
| Dynamic bending prop. | | A | A | B | B | A | B | 3A | A | A |

| | | Ex. 59 | Ex. 60 | Ex. 61 | Ex. 62 | Ex. 63 | Ex. 64 | Ex. 65 | Ex. 66 |
|---|---|---|---|---|---|---|---|---|---|
| Hard coating layer | Comp. elast. mod. (GPa) | 7.0 | 7.0 | 7.0 | 7.0 | 7.0 | 7.0 | 7.0 | 7.0 |
| | Thk (mm) | 0.01 | 0.01 | 0.01 | 0.01 | 0.01 | 0.01 | 0.01 | 0.01 |
| Sub-strate layer | Type | PET | PI | PET | PI | PEN | PET | PI | PEN |
| | Comp. elast. mod. (GPa) | 6.9 | 8.3 | 6.9 | 8.3 | 7.5 | 6.9 | 8.3 | 7.5 |
| | Thk (mm) | 0.05 | 0.05 | 0.05 | 0.05 | 0.05 | 0.05 | 0.05 | 0.05 |
| Joining layer | Type | Heat seal | OCA | OCA | Heat seal | Heat seal | Heat seal | Heat seal | Heat seal |
| | Comp. elast. mod. (GPa) | 0.0264 | 0.0096 | 0.0096 | 0.0264 | 0.0264 | 0.0264 | 0.0264 | 0.0264 |
| | Thk (mm) | 0.005 | 0.025 | 0.05 | 0.005 | 0.005 | 0.005 | 0.005 | 0.005 |
| | Tg(° C.) | 26 | −6 | −9 | 26 | 26 | 26 | 26 | 26 |
| Glass sub-strate | Comp. elast. mod. (GPa) | 72.4 | 72.4 | 72.4 | 72.4 | 72.4 | 72.4 | 72.4 | 72.4 |
| | Thk (mm) | 0.05 | 0.07 | 0.05 | 0.05 | 0.05 | 0.05 | 0.03 | 0.03 |
| Second joining layer | Type | OCA | OCA | OCA | OCA | OCA | OCA | OCA | OCA |
| | Stg. elast. mod. (GPa) | 0.00023 | 0.00023 | 0.00023 | 0.00023 | 0.00023 | 0.00023 | 0.00023 | 0.00023 |
| | Thk (mm) | 0.05 | 0.05 | 0.05 | 0.1 | 0.1 | 0.1 | 0.1 | 0.1 |
| | Tg(° C.) | −6 | −6 | −6 | −6 | −6 | −6 | −6 | −6 |
| | Stg. elast. mod./thk | 0.0046 | 0.0046 | 0.0046 | 0.0023 | 0.0023 | 0.0023 | 0.0023 | 0.0023 |
| Mid. Mbr. Val. Form. (1) | | 0.0149 | 0.0350 | 0.0150 | 0.0089 | 0.0081 | 0.0075 | 0.0032 | 0.0029 |
| Pen dropping test height (cm) | | 23 | 40 | 30 | 17 | 16 | 15 | 10 | 7 |
| Dynamic bending prop. | | 3A | 2A | 3A | 3A | 3A | 3A | 4A | 4A |

TABLE 5-continued

| | | Ex. 67 | Ex. 68 | Ex. 69 | Ex. 70 | Comp. Ex. 9 | Comp. Ex. 10 | Comp. Ex. 11 | Comp. Ex. 12 |
|---|---|---|---|---|---|---|---|---|---|
| Hard coating layer | Comp. elast. mod. (GPa) | 7.0 | 7.0 | 7.0 | 7.0 | 7.0 | — | — | — |
| | Thk (mm) | 0.01 | 0.01 | 0.01 | 0.01 | 0.01 | — | — | — |
| Sub-strate layer | Type | PET | PET | PI | PET | PET | — | — | — |
| | Comp. elast. mod. (GPa) | 6.9 | 6.9 | 8.3 | 6.9 | 6.9 | — | — | — |
| | Thk (mm) | 0.05 | 0.05 | 0.08 | 0.025 | 0.025 | — | — | — |
| Joining layer | Type | Heat seal | OCA | Heat seal | Heat seal | Heat seal | — | — | — |
| | Comp. elast. mod. (GPa) | 0.0264 | 0.0096 | 0.0264 | 0.0264 | 0.0264 | — | — | — |
| | Thk (mm) | 0.005 | 0.025 | 0.005 | 0.005 | 0.005 | — | — | — |
| | Tg(° C.) | 26 | −6 | 26 | 26 | 26 | — | — | — |
| Glass sub-strate | Comp. elast. mod. (GPa) | 72.4 | 72.4 | 72.4 | 72.4 | 72.4 | 72.4 | 72.4 | 72.4 |
| | Thk (mm) | 0.03 | 0.03 | 0.05 | 0.03 | 0.03 | 0.07 | 0.05 | 0.03 |
| Second joining layer | Type | OCA | OCA | OCA | OCA | OCA | OCA | OCA | OCA |
| | Stg. elast. mod. (GPa) | 0.00023 | 0.00023 | 0.00023 | 0.00023 | 0.00023 | 0.00023 | 0.00023 | 0.00023 |
| | Thk (mm) | 0.1 | 0.025 | 0.05 | 0.05 | 0.1 | 0.1 | 0.1 | 0.1 |
| | Tg(° C.) | −6 | −6 | −6 | −6 | −6 | −6 | −6 | −6 |
| | Stg. elast. mod./thk | 0.0023 | 0.0092 | 0.0046 | 0.0046 | 0.0023 | 0.0023 | 0.0023 | 0.0023 |
| Mid. Mbr. Val. Form. (1) | | 0.0027 | 0.0108 | 0.0448 | 0.0015 | 0.0008 | — | — | — |
| Pen dropping test height (cm) | | 7 | 20 | 60 | 6 | 4 | 2 | 1 | 0.5 |
| Dynamic bending prop. | | 4A | 4A | 2A | 4A | 4A | A | 3A | 4A |

TABLE 6

| | | Ex. 71 | Ex. 72 | Ex. 73 | Ex. 74 | Ex. 75 | Ex. 76 | Ex. 77 | Ex. 78 | Ex. 79 |
|---|---|---|---|---|---|---|---|---|---|---|
| Sub-strate layer | Type | PI | PI | PI | PI | PI | PET | PET | PET | PET |
| | Comp. elast. mod. (GPa) | 8.3 | 8.3 | 8.3 | 8.3 | 8.3 | 6.9 | 6.9 | 6.9 | 6.9 |
| | Thk (mm) | 0.08 | 0.05 | 0.05 | 0.05 | 0.03 | 0.075 | 0.05 | 0.05 | 0.05 |
| Joining layer | Type | Heat seal | Heat seal | Heat seal | Heat seal | Heat seal | Heat seal | Heat seal | Heat seal | Heat seal |
| | Comp. elast. mod. (GPa) | 0.0264 | 0.0264 | 0.0264 | 0.0264 | 0.0264 | 0.0264 | 0.0264 | 0.0264 | 0.0264 |
| | Thk (mm) | 0.005 | 0.005 | 0.005 | 0.005 | 0.005 | 0.005 | 0.005 | 0.005 | 0.005 |
| | Tg(° C.) | 26 | 26 | 26 | 26 | 26 | 26 | 26 | 26 | 26 |
| Glass sub-strate | Comp. elast. mod. (GPa) | 72.2 | 72.4 | 72.4 | 72.4 | 72.4 | 72.4 | 72.4 | 72.4 | 72.4 |
| | Thk (mm) | 0.07 | 0.07 | 0.05 | 0.03 | 0.07 | 0.07 | 0.07 | 0.05 | 0.03 |
| Second joining layer | Type | OCA | OCA | OCA | OCA | OCA | OCA | OCA | OCA | OCA |
| | Stg. elast. mod. (GPa) | 0.00023 | 0.00023 | 0.00023 | 0.00023 | 0.00023 | 0.00023 | 0.00023 | 0.00023 | 0.00023 |
| | Thk (mm) | 0.05 | 0.05 | 0.05 | 0.05 | 0.05 | 0.05 | 0.05 | 0.05 | 0.05 |
| | Tg(° C.) | −6 | −6 | −6 | −6 | −6 | −6 | −6 | −6 | −6 |
| | Stg. elast. mod./thk | 0.0046 | 0.0046 | 0.0046 | 0.0046 | 0.0046 | 0.0046 | 0.0046 | 0.0046 | 0.0046 |
| Mid. Mbr. Val. Form. (2) | | 0.0867 | 0.0339 | 0.0173 | 0.0062 | 0.0122 | 0.0633 | 0.0282 | 0.0144 | 0.0052 |
| Pen dropping test height (cm) | | 65 | 40 | 20 | 17 | 24 | 52 | 30 | 20 | 13 |
| Dynamic bending prop. | | A | A | 3A | 4A | 2A | A | A | 3A | 4A |

| | | Ex. 80 | Ex. 81 | Ex. 82 | Ex. 83 | Ex. 84 | Ex. 85 | Ex. 86 | Ex. 87 | Ex. 88 |
|---|---|---|---|---|---|---|---|---|---|---|
| Sub-strate layer | Type | PET | TAC | PEN | PI | PEN | PET | PI | PEN | PET |
| | Comp. elast. mod. (GPa) | 6.9 | 6.7 | 7.5 | 8.3 | 7.5 | 6.9 | 8.3 | 7.5 | 6.9 |
| | Thk (mm) | 0.025 | 0.06 | 0.05 | 0.05 | 0.05 | 0.05 | 0.05 | 0.05 | 0.05 |
| Joining layer | Type | Heat seal | Heat seal | Heat seal | Heat seal | Heat seal | Heat seal | Heat seal | Heat seal | Heat seal |
| | Comp. elast. mod. (GPa) | 0.0264 | 0.0264 | 0.0264 | 0.0264 | 0.0264 | 0.0264 | 0.0264 | 0.0264 | 0.0264 |
| | Thk (mm) | 0.005 | 0.005 | 0.005 | 0.005 | 0.005 | 0.005 | 0.005 | 0.005 | 0.005 |
| | Tg(° C.) | 26 | 26 | 26 | 26 | 26 | 26 | 26 | 26 | 26 |
| Glass sub-strate | Comp. elast. mod. (GPa) | 72.4 | 72.4 | 72.4 | 72.4 | 72.4 | 72.4 | 72.4 | 72.4 | 72.4 |
| | Thk (mm) | 0.07 | 0.07 | 0.07 | 0.05 | 0.05 | 0.05 | 0.03 | 0.03 | 0.03 |

TABLE 6-continued

| | | | | | | | | | | |
|---|---|---|---|---|---|---|---|---|---|---|
| Second joining layer | Type | OCA | OCA | OCA | OCA | OCA | OCA | OCA | OCA | OCA |
| | Stg. elast. mod. (GPa) | 0.00023 | 0.00023 | 0.00023 | 0.00023 | 0.00023 | 0.00023 | 0.00023 | 0.00023 | 0.00023 |
| | Thk (mm) | 0.05 | 0.05 | 0.05 | 0.1 | 0.1 | 0.1 | 0.1 | 0.1 | 0.1 |
| | Tg(° C.) | −6 | −6 | −6 | −6 | −6 | −6 | −6 | −6 | −6 |
| | Stg. elast. mod./thk | 0.0046 | 0.0046 | 0.0046 | 0.0023 | 0.0023 | 0.0023 | 0.0023 | 0.0023 | 0.0023 |
| Mid. Mbr. Val. Form. (2) | | 0.0070 | 0.0394 | 0.0306 | 0.0086 | 0.0078 | 0.0072 | 0.0031 | 0.0028 | 0.0026 |
| Pen dropping test height (cm) | | 15 | 45 | 30 | 16 | 15 | 14 | 10 | 7 | 7 |
| Dynamic bending prop. | | 2A | A | A | 3A | 3A | 3A | 4A | 4A | 4A |

| | | Ex. 89 | Ex. 90 | Ex. 91 | Ex. 92 | Ex. 93 | Ex. 94 | Comp. Ex. 13 | Comp. Ex. 14 |
|---|---|---|---|---|---|---|---|---|---|
| Substrate layer | Type | PET | PI | PI | PI | PI | PET | PI | PET |
| | Comp. elast. mod. (GPa) | 6.9 | 8.3 | 8.3 | 8.3 | 8.3 | 6.9 | 8.3 | 6.9 |
| | Thk (mm) | 0.05 | 0.05 | 0.05 | 0.05 | 0.05 | 0.025 | 0.05 | 0.025 |
| Joining layer | Type | OCA | Heat seal | Heat seal | Heat seal | Heat seal | Heat seal | Heat seal | Heat seal |
| | Comp. elast. mod. (GPa) | 0.0096 | 0.0264 | 0.0264 | 0.0264 | 0.0264 | 0.0264 | 0.0264 | 0.0264 |
| | Thk (mm) | 0.025 | 0.005 | 0.005 | 0.005 | 0.005 | 0.005 | 0.005 | 0.005 |
| | Tg(° C.) | −6 | 26 | 26 | 26 | 26 | 26 | 26 | 26 |
| Glass substrate | Comp. elast. mod. (GPa) | 72.4 | 72.4 | 72.4 | 72.4 | 72.4 | 72.4 | 72.4 | 72.4 |
| | Thk (mm) | 0.03 | 0.07 | 0.07 | 0.07 | 0.07 | 0.03 | 0.07 | 0.03 |
| Second joining layer | Type | OCA | OCA | OCA | OCA | OCA | OCA | OCA | OCA |
| | Stg. elast. mod. (GPa) | 0.00023 | 0.00214 | 0.00091 | 0.00222 | 0.00195 | 0.00023 | 0.00222 | 0.00023 |
| | Thk (mm) | 0.025 | 0.015 | 0.005 | 0.01 | 0.005 | 0.05 | 0.005 | 0.1 |
| | Tg(° C.) | −6 | −24 | −7 | 25 | −25 | −6 | 25 | −6 |
| | Stg. elast. mod./thk | 0.0092 | 0.1427 | 0.1820 | 0.2220 | 0.3900 | 0.0046 | 0.4440 | 0.0023 |
| Mid. Mbr. Val. Form. (2) | | 0.0103 | 1.0502 | 1.3398 | 1.6343 | 2.8710 | 0.0013 | 3.2685 | 0.0006 |
| Pen dropping test height (cm) | | 20 | 80 | 80 | 80 | 80 | 5 | 80 | 3 |
| Dynamic bending prop. | | 4A | A | A | B | B | 4A | C | 4A |

From Tables 4 to 5 and FIG. 10, it was confirmed that, when the formula (1) described above was satisfied, good bending resistance may be obtained without deteriorating the impact resistance. Also, from Table 6 and FIG. 11, it was confirmed that, when the formula (2) described above was satisfied, good bending resistance may be obtained without deteriorating the impact resistance.

Example 95

A PET film ("A4160" from Toyobo Co., Ltd.) with a thickness of 50 μm was prepared, and a coating film was formed by coating the PET film with a curable resin composition for a hard coating layer used in Example 1, by a bar coater. Then, after drying the coating film at 100° C. for 3 minutes, it was cured by ultraviolet ray irradiation at 200 mJ to form a hard coating layer with a thickness of 10 μm. Then, in the same manner as in Example 15, a pressure-sensitive adhesive layer was formed on the PET film, on the opposite side surface to the hard coating layer. Thereby, a stacked film was obtained. Then, a stacked body was obtained by adhering the joining layer side surface of the stacked film to a chemically strengthened glass substrate with a thickness of 30 μm.

Example 96

A stacked body was produced in the same manner as in Example 95 except that, as the joining layer, an optical clear adhesive film (OCA) ("D692" from LINTEC Corporation, composite elastic modulus of 19 MPa) with a thickness of 5 μm was used.

Example 97

A stacked body was produced in the same manner as in Example 95 except that, as the joining layer, an optical clear adhesive film (acrylic based adhesive sheet, OCA) ("Panaclean PD-S1" from Panac Co., Ltd., composite elastic modulus of 13.7 MPa) with a thickness of 5 μm was used.

Example 98

A hard coating layer was formed on the PET film, in the same manner as in Example 95.

Then, the surface of the PET film which is opposite side to the hard coating layer was coated with the heat-sealable resin composition used in Example 17 so that the thickness after drying was 5 μm, dried at 70° C. for 1 minute to form a heat-sensitive adhesive layer, and a stacked film was obtained.

Then, a stacked body was obtained by placing the stacked film so that the heat-sensitive adhesive layer side surface was in contact with the a chemically strengthened glass substrate with a thickness of 30 μm; placing a glass supporting substrate with a thickness of 2 mm on the glass substrate, on the opposite side surface to the stacked film; and adhering the stacked film and glass substrate using a roll laminator (product name: Desktop Roll Laminator B35A3 from ACCO Brands Japan K.K.), while heating. In doing so, the roll temperature was 140° C. to 149° C. and the feeding speed was 0.3 m/min. The stacked body was then aged for two days at 70° C.

Example 99

A stacked body was produced in the same manner as in Example 98 except that the heat-sealable resin composition used in Example 10 was used.

Example 100

A stacked body was produced in the same manner as in Example 98 except that the heat-sealable resin composition used in Example 18 was used.

Example 101

A stacked body was produced in the same manner as in Example 98 except that the heat-sealable resin composition used in Example 19 was used.

Example 102

A stacked body was produced in the same manner as in Example 98 except that the heat-sealable resin composition used in Example 21 was used.

Example 103

A stacked body was produced in the same manner as in Example 98 except that the heat-sealable resin composition used in Example 20 was used.

Example 104

A hard coating layer was formed on the PET film, in the same manner as in Example 95.

Then, the surface of the PET film which is opposite side to the hard coating layer was coated with the ultraviolet ray curable type resin composition used in Example 22 so that the thickness after curing was 5 μm, dried at 70° C. for 1 minute to form an adhesive layer, and a stacked film was obtained.

The adhesive layer side surface of the stacked film was adhered to a chemically strengthened glass substrate with a thickness of 30 μm, using a hand roller. Then, the adhesive layer was cured by irradiating ultraviolet rays from the hard coating layer side at an irradiation amount of 400 $mJ/cm^2$ to obtain a stacked body.

Example 105

A stacked body was produced in the same manner as in Example 98 except that the following heat-sealable resin composition was used.

<Composition of Heat-Sealable Resin Composition>

Amorphous polyester based resin (TP-235S20™, solid content of 20%, from Mitsubishi Chemical Corporation): 100 parts by mass Hexane methylene diisocyanate (Coronate 2203 from Tosoh Corporation (Nippon Polyurethane Industry Co., Ltd.)): 1 parts by mass Silane coupling agent (KBM-403 from Shin-Etsu Chemical Co., Ltd.): 1 parts by mass Fluorine based leveling agent (F568 from DIC Corporation): 0.2 parts by mass (in terms of solid)

Solvent (MEK): 34 parts by mass

Solvent (toluene): 10 parts by mass

Example 106

A hard coating layer was formed on the PET film, in the same manner as in Example 95.

Then, the surface of the PET film which is opposite side to the hard coating layer was coated with the thermosetting type resin composition used in Example 23 so that the thickness after curing was 5 μm, dried at 70° C. for 1 minute to form an adhesive layer, and a hard coating film with an adhesive layer was obtained.

A stacked body was obtained by adhering the adhesive layer side surface of the hard coating film with an adhesive layer to a chemically strengthened glass substrate with a thickness of 30 μm, using a hand roller; and then, heating the resultant at 130° C. for 60 minutes to cure the adhesive layer.

[Evaluation 3]

(1) Pencil Hardness

In the same manner as in Evaluation 1 described above, the pencil hardness on the hard coating layer side surface of the stacked body, was measured. The pencil hardness was evaluated according to the following criteria.

2A: Pencil hardness was 2H or more.

A: Pencil hardness was H.

B: Pencil hardness was F.

C: Pencil hardness was HB or less.

(2) Impact Test (Pen Dropping Test)

In the same manner as in Evaluation 1 described above, as an impact test, a pen dropping test was carried out on the stacked body. The maximum testing heights at which the glass substrate was not broken are shown in Tables 7. Incidentally, the higher value indicates higher impact resistance.

(3) Dynamic Bending Test

In the same manner as in Evaluation 1 described above, the dynamic bending test was carried out to evaluate the bending resistance. In doing so, the dynamic bending test was carried out under the three conditions: (a) temperature of 23° C., (b) temperature of 60° C. and humidity of 90% RH, and (c) temperature of −20° C.

TABLE 7

| | | Ex. 95 | Ex. 96 | Ex. 97 | Ex. 98 | Ex. 99 | Ex. 100 | Ex. 101 | Ex. 102 | Ex. 103 | Ex. 104 | Ex. 105 | Ex. 106 |
|---|---|---|---|---|---|---|---|---|---|---|---|---|---|
| Hard coating layer thickness A (μm) | | 10 | 10 | 10 | 10 | 10 | 10 | 10 | 10 | 10 | 10 | 10 | 10 |
| Substrate layer thickness (B μm) | | 50 | 50 | 50 | 50 | 50 | 50 | 50 | 50 | 50 | 50 | 50 | 50 |
| Joining layer thickness C (μm) | | 5 | 5 | 5 | 5 | 5 | 5 | 5 | 5 | 5 | 5 | 5 | 5 |
| Glass substrate thickness D (μm) | | 30 | 30 | 30 | 30 | 30 | 30 | 30 | 30 | 30 | 30 | 30 | 30 |
| Stacked bdy tot thk (A + B + C + D)(μm) | | 95 | 95 | 95 | 95 | 95 | 95 | 95 | 95 | 95 | 95 | 95 | 95 |
| Thickness ratio (A + B)/C | | 12 | 12 | 12 | 12 | 12 | 12 | 12 | 12 | 12 | 12 | 12 | 12 |
| Joining layer | Type | Press. sen. adh. | OCA | OCA | Heat seal | Heat seal | Heat seal | Heat seal | Heat seal | Heat seal | UV cure | Heat seal | Thermal cure |
| | Tg (° C.) | −40 | −25 | −7 | 2 | 26 | 34 | 44 | 53 | 68 | 69 | 72 | 127 |
| | Comp. elastic mod. (MPa) | 420 | 19 | 14 | 80 | 26 | 2400 | 3400 | 5970 | 5100 | 1500 | 5060 | 4700 |
| Pencil hardness | | A | A | A | A | 2A | 2A | 2A | 2A | 2A | 2A | 2A | 2A |
| Pen dropping test height (cm) | | 6 | 7 | 7 | 7 | 7 | 7 | 7 | 9 | 8 | 7 | 9 | 8 |

TABLE 7-continued

| | | Ex. 95 | Ex. 96 | Ex. 97 | Ex. 98 | Ex. 99 | Ex. 100 | Ex. 101 | Ex. 102 | Ex. 103 | Ex. 104 | Ex. 105 | Ex. 106 |
|---|---|---|---|---|---|---|---|---|---|---|---|---|---|
| Dynamic | 23° C. | 4A | 4A | 4A | 4A | 4A | 4A | 4A | 4A | 4A | 4A | 4A | 4A |
| bending | 60° C. 90% | 4A | 4A | 4A | 4A | 3A | 3A | 3A | 4A | 4A | 4A | 4A | 4A |
| prop. | −20° C. | 4A | 4A | 4A | 4A | 4A | 4A | 4A | 4A | 4A | 4A | 4A | 4A |

Although the preferable range of the glass transition temperature of the joining layer is −40° C. or more and 150° C. or less, it was suggested that the preferable glass transition temperature of the joining layer was −40° C. or more and 25° C. or less and 50° C. or more and 150° C. or less, from the viewpoint of dynamic bending property under high temperature and high humidity environment and under low temperature environment.

REFERENCE SIGNS LIST

1: stacked body
2: glass substrate
3: joining layer
4: hard coating film
5: substrate layer
6: hard coating layer
7: antireflection layer
10: second joining layer
30: display device
31: display panel

The invention claimed is:

1. A stacked body comprising:
a glass substrate;
a joining layer; and
a hard coating film, in this order,
wherein the hard coating film includes a substrate layer and a hard coating layer, from a joining layer side;
the joining layer is a layer configured to join the glass substrate and the substrate layer;
a thickness of the glass substrate is 10 μm or more and 100 μm or less; and
when a thickness of the hard coating layer is regarded as A, a thickness of the substrate layer is regarded as B, and a thickness of the joining layer is regarded as C, a ratio of (A+B) with respect to C is 3.0 or more and 500 or less;
a composite elastic modulus of the joining layer at 25° C. is 1 MPa or more and 6000 MPa or less; and
a glass transition temperature of the joining layer is −40° C. or more and 150° C. or less.

2. The stacked body according to claim 1, wherein a composite elastic modulus of the substrate layer at 25° C. is 5.7 GPa or more.

3. The stacked body according to claim 1, wherein the glass substrate includes a chemically strengthened glass.

4. The stacked body according to claim 1, wherein the joining layer is a pressure-sensitive adhesive layer, or a heat-sensitive adhesive layer, or includes a cured product of a curable type adhesive composition.

5. The stacked body according to claim 1, wherein the joining layer includes at least one kind selected from a group consisting of polyester resin, polyolefin resin, and urethane resin.

6. The stacked body according to claim 1, wherein the stacked body includes an antireflection layer on the hard coating layer, on an opposite surface side to the substrate layer.

7. The stacked body according to claim 1, wherein a crack, a fracture, or a peeling does not occur when the stacked body is folded into 180° repeatedly for 200,000 times so that a glass substrate side surface of the stacked body is on an outer side, a hard coating layer side surface of the stacked body is on an inner side, and a distance between opposing side portions of the stacked body is 10 mm.

8. The stacked body according to claim 1, wherein the stacked body includes a protection film on the hard coating layer, on an opposite surface side to the substrate layer.

9. A display device comprising:
a display panel, and
the stacked body according to claim 1 placed on an observer side of the display panel,
wherein the stacked body is placed so that a glass substrate side surface is adjacent to the display panel.

10. The display device according to claim 9, wherein the display device is a foldable display.

* * * * *